US007553512B2

(12) United States Patent
Kodas et al.

(10) Patent No.: US 7,553,512 B2
(45) Date of Patent: Jun. 30, 2009

(54) METHOD FOR FABRICATING AN INORGANIC RESISTOR

(75) Inventors: Toivo T. Kodas, Albuquerque, NM (US); Mark J. Hampden-Smith, Albuquerque, NM (US); Karel Vanheusden, Placitas, NM (US); Hugh Denham, Albuquerque, NM (US); Aaron D. Stump, Albuquerque, NM (US); Allen B. Schult, Albuquerque, NM (US); Paolina Atanassova, Albuquerque, NM (US); Klaus Kunze, Half Moon Bay, CA (US)

(73) Assignee: Cabot Corporation, Boston, MA (US)

( * ) Notice: Subject to any disclaimer, the term of this patent is extended or adjusted under 35 U.S.C. 154(b) by 1242 days.

(21) Appl. No.: 10/286,363

(22) Filed: Nov. 1, 2002

(65) Prior Publication Data

US 2003/0161959 A1    Aug. 28, 2003

Related U.S. Application Data

(60) Provisional application No. 60/338,797, filed on Nov. 2, 2001.

(51) Int. Cl.
*B05D 5/12* (2006.01)
*B05D 3/12* (2006.01)
(52) U.S. Cl. .................. 427/101; 427/58; 427/180; 427/197; 427/372.2
(58) Field of Classification Search ............... 427/58, 427/101, 180, 197, 372.2
See application file for complete search history.

(56) References Cited

U.S. PATENT DOCUMENTS

| 3,313,632 | A | 4/1967 | Langley et al. ............... 106/1 |
| 3,683,382 | A | 8/1972 | Ballinger ..................... 346/74 |
| 4,122,062 | A | 10/1978 | Monte et al. ............. 260/42.14 |
| 4,130,671 | A | 12/1978 | Nagesh et al. ............... 427/125 |
| 4,186,244 | A | 1/1980 | Deffeyes et al. ............ 428/570 |
| 4,211,668 | A | 7/1980 | Tate .......................... 252/316 |
| 4,255,291 | A | 3/1981 | Needes et al. ............... 252/578 |
| 4,289,534 | A | 9/1981 | Deffeyes et al. ........... 106/1.14 |
| 4,333,966 | A | 6/1982 | Deffeyes et al. ............ 427/96 |
| 4,381,945 | A | 5/1983 | Nair .......................... 106/1.14 |
| 4,407,674 | A | 10/1983 | Ehrreich ..................... 75/251 |
| 4,416,932 | A | 11/1983 | Nair .......................... 428/209 |
| 4,418,099 | A | 11/1983 | Cuevas et al. ............... 427/229 |
| 4,419,383 | A | 12/1983 | Lee ............................ 427/47 |
| 4,463,030 | A | 7/1984 | Deffeyes et al. ............ 427/216 |
| 4,485,387 | A | 11/1984 | Drumheller ................. 346/140 |
| 4,487,811 | A | 12/1984 | Eichelberger et al. ....... 428/546 |
| 4,517,252 | A | 5/1985 | Hugh ......................... 428/553 |
| 4,539,041 | A | 9/1985 | Figlarz et al. ............... 75/0.5 |
| 4,548,879 | A | 10/1985 | St. John et al. ............... 427/96 |
| 4,599,277 | A | 7/1986 | Brownlow et al. ........... 428/552 |
| 4,650,108 | A | 3/1987 | Gallagher ................... 228/124 |
| 4,668,533 | A | 5/1987 | Miller ........................ 427/98 |
| 4,775,439 | A | 10/1988 | Seeger, Jr. et al. ........... 156/231 |
| 4,808,274 | A | 2/1989 | Nguyen ...................... 204/15 |
| 4,826,554 | A | 5/1989 | McIntyre et al. ............ 156/280 |
| 4,859,241 | A | 8/1989 | Grundy ...................... 106/1.14 |
| 4,891,242 | A | 1/1990 | Ito et al. ..................... 437/53.1 |
| 4,931,323 | A | 6/1990 | Manitt et al. ............... 427/53.1 |
| 4,948,623 | A | 8/1990 | Beach et al. ................. 427/35 |
| 4,959,430 | A | 9/1990 | Jonas et al. ................. 526/257 |
| 5,039,552 | A | 8/1991 | Riemer ........................ 427/96 |
| 5,045,141 | A | 9/1991 | Salensky et al. ............. 156/240 |
| 5,049,434 | A | 9/1991 | Wasulko ..................... 428/202 |
| 5,057,363 | A | 10/1991 | Nakanishi ................ 428/321.5 |
| 5,059,242 | A | 10/1991 | Firmstone et al. ........... 106/1.23 |
| 5,075,262 | A | 12/1991 | Nguyen et al. ................ 501/19 |
| 5,121,127 | A | 6/1992 | Toriyama .................... 343/700 |
| 5,132,248 | A | 7/1992 | Drummond et al. ........ 437/173 |
| 5,139,818 | A | 8/1992 | Mance ....................... 427/54.1 |
| 5,153,023 | A | 10/1992 | Orlowski et al. ............. 427/555 |
| 5,173,330 | A | 12/1992 | Asano et al. ................. 427/558 |
| 5,176,744 | A | 1/1993 | Muller ....................... 106/1.26 |
| 5,183,784 | A | 2/1993 | Nguyen et al. ................ 501/19 |
| 5,216,207 | A | 6/1993 | Prabhu et al. ............... 174/256 |
| 5,244,538 | A | 9/1993 | Kumar ....................... 156/643 |
| 5,250,229 | A | 10/1993 | Hara et al. ................... 252/518 |
| 5,270,368 | A | 12/1993 | Lent et al. ................... 524/236 |
| 5,312,480 | A | 5/1994 | Lotze et al. ................. 106/1.13 |
| 5,312,674 | A | 5/1994 | Haertling et al. ............. 428/210 |

(Continued)

FOREIGN PATENT DOCUMENTS

| EP | 0 696 515 | 2/1996 |
| EP | 1 323 793 | 7/2003 |
| JP | 63278983 | 5/1987 |
| JP | 2000-011875 | 1/2000 |
| JP | 2000-182889 | 6/2000 |
| WO | WO 98/37133 | 8/1998 |
| WO | WO 99/16601 | 4/1999 |
| WO | WO 00/29208 | 5/2000 |
| WO | WO 00/69235 | 11/2000 |
| WO | WO 00/72224 | 11/2000 |

(Continued)

OTHER PUBLICATIONS

ITT Cuts Costs of PC Board Manufacturing, Kenneth Dreyfack, Electronics, vol. 52, No. 17, (Aug. 16, 1979).

(Continued)

*Primary Examiner*—Brian K Talbot
(74) *Attorney, Agent, or Firm*—Marsh Fischmann & Breyfogle LLP

(57) ABSTRACT

Precursor compositions for the fabrication of electronic features such as resistors and capacitors. The precursor compositions are formulated to have a low conversion temperature, such as not greater than about 350° C., thereby enabling the fabrication of such electronic features on a variety of substrates, including organic substrates such as polymer substrates.

20 Claims, No Drawings

U.S. PATENT DOCUMENTS

| | | | |
|---|---|---|---|
| 5,332,646 A | 7/1994 | Wright et al. | 430/137 |
| 5,366,760 A | 11/1994 | Fujii et al. | 427/96 |
| 5,378,408 A | 1/1995 | Carroll et al. | 252/514 |
| 5,378,508 A | 1/1995 | Castro et al. | 427/556 |
| 5,395,452 A | 3/1995 | Kobayashi et al. | 118/715 |
| 5,421,926 A | 6/1995 | Yukinobu et al. | 156/83 |
| 5,433,893 A | 7/1995 | Jost et al. | 252/514 |
| 5,444,453 A | 8/1995 | Lalezari | 343/700 |
| 5,463,057 A | 10/1995 | Graetzel et al. | 546/4 |
| 5,494,550 A | 2/1996 | Benge | 156/268 |
| 5,599,046 A | 2/1997 | Behm et al. | 283/83 |
| 5,601,638 A | 2/1997 | Fukuda et al. | 106/19 |
| 5,604,027 A | 2/1997 | Sheridon | 428/323 |
| 5,604,673 A | 2/1997 | Washburn et al. | 363/147 |
| 5,665,472 A | 9/1997 | Tanaka et al. | 428/402 |
| 5,716,663 A | 2/1998 | Capote et al. | 427/96 |
| 5,767,810 A | 6/1998 | Hagiwara et al. | 343/700 |
| 5,781,158 A | 7/1998 | Ko et al. | 343/700 |
| 5,801,108 A | 9/1998 | Huang et al. | 501/32 |
| 5,826,329 A | 10/1998 | Roth | 29/846 |
| 5,828,271 A | 10/1998 | Stitzer | 333/24.1 |
| 5,846,615 A | 12/1998 | Sharma et al. | 427/597 |
| 5,846,670 A | 12/1998 | Watanabe et al. | 429/42 |
| 5,853,470 A | 12/1998 | Martin et al. | 106/31.86 |
| 5,882,722 A | 3/1999 | Kydd | 427/123 |
| 5,889,365 A * | 3/1999 | Tanabe | 313/582 |
| 5,892,661 A * | 4/1999 | Stafford et al. | 361/737 |
| 5,894,038 A | 4/1999 | Sharma et al. | 427/554 |
| 5,909,083 A | 6/1999 | Asano et al. | 313/584 |
| 5,930,026 A | 7/1999 | Jacobson et al. | 359/296 |
| 5,932,280 A | 8/1999 | Roth | 427/102 |
| 5,953,037 A | 9/1999 | Hayashi et al. | 347/172 |
| 5,972,156 A | 10/1999 | Brady et al. | 156/280 |
| 5,992,320 A | 11/1999 | Kosaka et al. | 101/401.1 |
| 5,995,006 A | 11/1999 | Walsh | 340/572.7 |
| 5,997,044 A | 12/1999 | Behm et al. | 283/83 |
| 5,998,085 A | 12/1999 | Isberg et al. | 430/200 |
| 6,019,926 A | 2/2000 | Southward et al. | 264/216 |
| 6,025,026 A | 2/2000 | Smith et al. | 427/316 |
| 6,027,762 A | 2/2000 | Tomita et al. | 427/96 |
| 6,036,889 A | 3/2000 | Kydd | 252/512 |
| 6,074,725 A | 6/2000 | Kennedy | 428/188 |
| 6,103,393 A | 8/2000 | Kodas et al. | 428/570 |
| 6,124,851 A | 9/2000 | Jacobson | 345/206 |
| 6,133,147 A | 10/2000 | Rhee et al. | 438/677 |
| 6,143,356 A | 11/2000 | Jablonski | 427/96 |
| 6,153,348 A | 11/2000 | Kydd et al. | 430/119 |
| 6,154,176 A | 11/2000 | Fathy et al. | 343/700 |
| 6,177,151 B1 | 1/2001 | Chrisey et al. | 427/596 |
| 6,197,147 B1 | 3/2001 | Bonsel et al. | 156/269 |
| 6,197,366 B1 | 3/2001 | Takamatsu | 427/125 |
| 6,200,405 B1 | 3/2001 | Nakazawa et al. | 156/248 |
| 6,207,268 B1 | 3/2001 | Kosaka et al. | 428/325 |
| 6,214,520 B1 | 4/2001 | Wolk et al. | 430/273.1 |
| 6,238,734 B1 | 5/2001 | Senzaki et al. | 427/226 |
| 6,274,412 B1 | 8/2001 | Kydd et al. | 438/149 |
| 6,284,982 B1 | 9/2001 | Kusner et al. | 174/255 |
| 6,294,401 B1 | 9/2001 | Jacobson et al. | 438/99 |
| 6,317,023 B1 | 11/2001 | Felten | 338/254 |
| 6,323,096 B1 * | 11/2001 | Saia et al. | 438/384 |
| 6,329,899 B1 | 12/2001 | Hunt et al. | 338/308 |
| 6,338,809 B1 | 1/2002 | Hampden-Smith et al. | 264/7 |
| 6,372,158 B1 | 4/2002 | Hashimoto et al. | 252/514 |
| 6,379,742 B1 | 4/2002 | Behm et al. | 427/7 |
| 6,379,745 B1 * | 4/2002 | Kydd et al. | 427/98.4 |
| 6,395,053 B1 | 5/2002 | Fau et al. | 75/362 |
| 6,399,230 B1 * | 6/2002 | Tormey et al. | 428/702 |
| 6,402,579 B1 | 6/2002 | Pichler et al. | 445/24 |
| 6,410,201 B2 | 6/2002 | Wolk et al. | 430/200 |
| 6,433,358 B1 | 8/2002 | Beierlein | 257/40 |
| 6,503,831 B2 * | 1/2003 | Speakman | 438/674 |
| 6,636,676 B1 | 10/2003 | Renn | 385/125 |
| 6,821,821 B2 * | 11/2004 | Fjelstad | 438/124 |
| 6,823,124 B1 | 11/2004 | Renn et al. | 385/125 |
| 7,045,015 B2 * | 5/2006 | Renn et al. | 118/686 |
| 2002/0058143 A1 | 5/2002 | Hunt et al. | 428/412 |
| 2002/0148640 A1 * | 10/2002 | Holl et al. | 174/256 |
| 2002/0150678 A1 | 10/2002 | Cramer et al. | 427/212 |
| 2002/0151161 A1 | 10/2002 | Furusawa | 438/597 |
| 2003/0020768 A1 | 1/2003 | Renn | 347/2 |
| 2003/0048314 A1 | 3/2003 | Renn | 347/6 |
| 2003/0070569 A1 | 4/2003 | Bulthaup et al. | 101/127 |
| 2003/0073042 A1 | 4/2003 | Cernigliaro et al. | 430/321 |
| 2003/0082485 A1 | 5/2003 | Bulthaup et al. | 430/312 |
| 2003/0096056 A1 | 5/2003 | Kawamura et al. | 427/66 |
| 2003/0108664 A1 | 6/2003 | Kodas et al. | 427/125 |
| 2003/0124259 A1 | 7/2003 | Kodas et al. | 427/376.6 |
| 2003/0148024 A1 | 8/2003 | Kodas et al. | 427/125 |
| 2003/0175411 A1 | 9/2003 | Kodas et al. | 427/58 |
| 2003/0180451 A1 | 9/2003 | Kodas et al. | 427/123 |

FOREIGN PATENT DOCUMENTS

| | | |
|---|---|---|
| WO | WO 01/54203 | 7/2001 |
| WO | WO 01/56736 A2 | 8/2001 |
| WO | WO 01/82315 | 11/2001 |
| WO | WO 01/87503 | 11/2001 |
| WO | WO 02/04698 | 1/2002 |
| WO | WO 02/05294 | 1/2002 |
| WO | WO 03/018645 | 3/2003 |
| WO | WO 03/038002 | 5/2003 |

OTHER PUBLICATIONS

Ink Jet Printing of Hybrid Circuits, R.W. Vest, Tweedell and B.C. Buchanan, "Hybrid Microelectronics" 6, 261 ,267 (1983).

Materials, Silver Ink for Jet Printing, NASA Tech Briefs, Aug. 1989.

Preparation of Colloidal Silver Dispersions By The Polyol Process Part 2—Mechanism Of Particle Formation, Silvert et al. (J. Mater. Chem, 1997, 7(2), pp. 293-299).

"Advanced Materials Systems For Ultra-Low-Temperature, Digital, Direct-Write Technologies, Digital, Direct Write Technologies", Vanheusden et al.; in Direct-Write Technologies for Rapid Prototyping Applications, pp. 123-173 (Oct. 2001).

Liquid Ink Jet Printing With MOD Inks For Hybrid Microcircuits K.F. Teng, and Robert W. Vest, IEEE Transactions on Components, Hybrids and Manufacturing Technology, vol. CHMT-12(4), 545-549 (1987).

"Physical Mechanisms Governing Pattern Fidelity In Microscale Offset Printing"; Darhuber et al.; Journal of Applied Physics; vol. 90, No. 7; pp. 3602-3609; Oct. 2001.

"Late-News Paper: Inkjet-Printed Bus and Address Electrodes For Plasma Display"; Furusawa et al.; SID 02 Digest; pp. 753-755.

"Site Selective Copper and Silver Electroless Metallization Facilitated by A Photolithographically Patterned Hydrogen Silsesquioxane Mediated Seed Layer"; Harness et al.; American Chemical Society.

U.S. Appl. No. 10/274,495; "Tape Compositions For The Deposition of Electronic Features"; Filed Oct. 18, 2002; Kodas et al.

* cited by examiner

METHOD FOR FABRICATING AN INORGANIC RESISTOR

CROSS-REFERENCE TO RELATED APPLICATIONS

This application claims the benefit of U.S. Provisional Application No. 60/338,797 filed Nov. 2, 2001, the disclosure of which is incorporated herein by reference in its entirety. This application is also related to U.S. patent application Ser. No. 10/265,296 entitled "PRECURSOR COMPOSITIONS FOR THE DEPOSITION OF ELECTRICALLY CONDUCTIVE FEATURES" and filed on Oct. 4, 2002, the disclosure of which is incorporated herein by reference in its entirety.

BACKGROUND OF THE INVENTION

1. Field of the Invention

The present invention relates to precursor compositions that are useful for the deposition of electronic features such as resistors and capacitors. The precursor compositions can have a low conversion temperature to enable low-temperature treatment of the compositions to form passive electronic features on a variety of substrates.

2. Description of Related Art

A variety of materials are used to create electronic circuitry on a substrate. Examples include metals and other conductive materials for electrical conductors, dielectric materials for insulation and capacitive elements, resistive materials for resistors and ferroelectric materials for capacitive elements.

For example, dielectric materials have a wide variety of applications in electronic circuits. They are used to provide electrical insulation as well as to facilitate the temporary storage of electrical charge. The dielectric constant, dielectric loss factor, and dielectric strength determine the suitability for a specific application. Variations in dielectric properties with frequency, temperature and a range of environmental conditions, such as humidity, also play a big role in determining the usefulness of any particular material composition.

Traditionally, a thick film paste is deposited by screen-printing and subsequently fired (heated) to form a dielectric material. The pastes typically consist of ceramic particles and a small amount of particulate glass as a sintering aid. Annealing above 850° C. for extended times is needed to induce crystallization and densification of the material.

Historically, glasses have been widely used in the inorganic thick film industry to lower densification temperatures. Mixing glasses and ceramics has many technological advantages. In "low-k" dielectric applications where the dielectric constant (k) is about 10 or lower, a significant amount of glass is mixed with one or more refractory oxides. During firing of these materials the glass melts, resulting in a hermetic structure. The melting temperature of these glass additives is typically greater than 600° C. In some cases, low temperature sealing glasses or overglazes are used with melting temperatures in the range of 300° C. to 400° C. When such low-melting point glasses are used, entrapment of organic vehicle inside the thick film becomes a real concern. Glass additives are also used in small amounts in "high-k" dielectric applications, those having a dielectric constant of 10 or higher. During firing, the glass component melts and the liquid glass phase provides capillary pressure and a diffusion path for the ceramic phase. The amount of glass that is used in these compositions must be balanced between maximizing the effect of the glass as a sintering aid and minimizing low-k glass contamination in the processed film to achieve a high dielectric constant.

Polymer thick film technology is also used extensively and allows the formation of resistors and dielectric layers on organic and other low temperature substrates. Polymer thick-film (PTF) technology has been traditionally used in lower performance, lower cost hybrid circuits on organic substrates. This technology is based on manufacturing by screen-printing pastes consisting of polymers with conductor, resistor and/or dielectric materials and solvents on the substrate. Polymer thick films offer great versatility in the sense that materials with very different electrical characteristics and excellent adhesion to organic substrates can be obtained through simple modifications of the composition. As a result, they can be tailored to suit many applications, such as low temperature processing and flexible substrates.

Typical dielectric constants for polymers range from about 2.5 to 6, and the polymers have a high loss compared to inorganic materials. For example, polymide has a dielectric constant of 3.5 and a loss tangent of 0.01. Higher-k polymer thick films can be obtained by adding a high-k ceramic filler to the polymer. However, mixing rules for multi-component dielectric layers dictate the intrinsic limitations of this approach. Hence, there is very limited use of PTF for capacitors, particularly for stable, high performance components.

Traditional hybrid technologies also have serious limitations for today's demanding resistor applications. Screen-printed thick-film resistors for example have wide-ranging values, but their short current paths and the inherent limitations of the screen-printing resolution severely compromise their performance characteristics. Laser trimming is often required to fine-tune the values within the desired range. Thin-film resistors, while capable of high precision, are expensive to design and manufacture and have their own limitations in terms of obtainable resistance values.

Most resistors for integrated electronic applications are required to be ohmic, to have small deviations from their predetermined resistive value (tolerance), and to have small temperature coefficients of resistance (TCR). TCR is an expression of change in resistance due to change in temperature and it is expressed in parts per million per degree Celsius (ppm/° C.). The TCR of given conductive and semiconductive materials can be either positive (increasing resistance with increase in temperature) or negative (decreasing resistance with increasing temperature).

The major demand for resistors in electronic applications lies in the resistance range from $10^3$ to $10^8 \Omega$. This is a serious challenge, as pure materials with suitable and reliable electrical behavior typically have resistivities below about $10^{-6}$ $\Omega m$. Unfortunately, there are no pure single-phase materials that provide optimum properties for ohmic resistors. The key to producing a resistor with a specific resistivity and low TCR lies in tailoring composition and microstructure of the final product and two general strategies have been successful. First, the conductivity can be lowered by diluting a conductive material with an insulative phase. Also, very thin and/or elongated conductive paths can be formed and packaged for stability and reproducibility. Thin-film resistor technology is often based on the latter approach, while thick-film materials are often mixtures of a conductive and an insulative phase.

Materials systems have been developed in the prior art for thin and thick film technologies. Thick film technology has seen the development of both polymeric type resistors as well as cermets, while thin films rely mainly on vapor deposition and lithography of metal alloys. Polymeric resistors generally consist of a polymer matrix with a conductive particulate phase such as particulates of carbon or a silver alloy. Cermet type resistors have gained popularity as they offer better performance and tolerance than polymeric resistors while offering a wide range of resistivities. A typical cermet resistor paste consists of a conductive phase and insulative matrix phase, along with other additives such as an organic carrier, binder, wetting agents and dispersants.

A major goal of the electronics industry is to produce resistors of the same quality as cermet resistors with regard to range of resistance, TCR, and stability while simplifying the process steps by lowering process temperature and time, and decreasing the process sensitivity of the material. An ideal material would retain the high quality electrical characteristics of cermets while being processable on organic substrates, including polymide substrates (e.g., KAPTON, available from E.I. duPont deNemours, and Company, Wilmington, Del.) and glass/epoxy laminates such as FR-4.

In accordance with the foregoing, the electronics industry relies on the deposition of patterns of various materials onto substrates to form circuits and passive circuit elements. The primary methods for printing of these patterns are screen-printing for features larger than 100 μm and thin film approaches for features less than 100 μm. Other subtractive processes are available for feature sizes less than 100 μm. These include photo-patternable pastes, laser trimming, and others.

U.S. Pat. No. 5,801,108 by Huang et al. discloses dielectric pastes formulated from starting materials including a dielectric powder composition, a glass composition such as a borosilicate glass that will melt at about 500° C. to 600° C. and react with the dielectric powder upon firing and partially form a crystallized phase, and a binding material such as an organic binder. The resulting dielectric paste is a multiphase dielectric paste wherein at least one phase is an alkaline earth, transition metal silicate. It is also disclosed that when the dielectric powder to crystallizable glass weight ratio is approximately 60:40, the resulting mixture will densify at approximately 850° C.

Precursor derived printable electronic compositions are described by R. W. Vest (Metallo-organic materials for improved thick film reliability, Nov. 1, 1980, Final Report, Contract #N00163-79-C-0352, National Avionic Center). Vest described only compositions that contained precursors and a solvent.

U.S. Pat. Nos. 6,036,889 and 5,882,722 by Kydd disclose conductor precursor compositions that contain particles, a metal organic decomposition (MOD) precursor and a vehicle and provide pure conductors at low temperatures on organic substrates. However, materials to form dielectrics and resistors are not disclosed. Also, formulations for fine mesh screen printing are not disclosed. Specific formulation and processing details about how to lower the decomposition temperature to below 300° C. are not disclosed.

U.S. Pat. No. 6,197,366 by Takamatsu discloses methods using inorganometallic compounds to obtain formulations that convert to dense sold metals at low temperatures.

Polymer thick film materials containing particles in a polymerizable organic vehicle have also been disclosed in the prior art. These compositions are processable at low temperatures, such as less than 200° C., allowing deposition onto organic substrates. However, these compositions are not designed for fine feature sizes such as those have a resolution of less than 200 μm. Polymer thick film also has limited performance and suffers from poor stability in changing environments. Attempts have been made to produce metal-containing compositions at low temperatures by using a composition including a polymer and a precursor to a metal. See, for example, U.S. Pat. No. 6,019,926, by Southward et al.

U.S. Pat. Nos. 5,846,615 and 5,894,038, both by Sharma et al., disclose precursors to Au and Pd that have low reaction temperatures thereby conceptually enabling processing at low temperatures to form metals.

U.S. Pat. No. 5,332,646 by Wright et al. discloses a method of making colloidal palladium and/or platinum metal dispersions by reducing a palladium and/or platinum metal of a metallo-organic palladium and/or platinum metal salt which lacks halide functionality.

There exists a need for precursor compositions, particularly high viscosity pastes, for use in electronics, displays, and other applications. Further, there is a need for precursor compositions that provide low processing temperatures to allow deposition onto organic substrates while still providing features with good electrical characteristics. Furthermore, there exists a need for a precursor composition for passive electronic features that offers enhanced resolution control.

SUMMARY OF THE INVENTION

The present invention is directed to flowable precursor compositions having a relatively high viscosity (e.g., pastes) that are adapted to form resistive and dielectric features such as resistors and capacitors at relatively low temperatures, thereby enabling the use of low temperature substrates such as polymer substrates.

According to one embodiment, a method for fabricating an inorganic resistor on an organic substrate is provided, including the step of applying a flowable precursor composition to an organic substrate wherein the precursor composition includes a molecular precursor to a conductive phase and a powder of an insulating material. The substrate and/or the precursor composition is then heated to a temperature of not greater than about 350° C. to convert the molecular precursor to the conductive phase and form a resistor, wherein the resistor has a resistivity of at least about 100 μΩ-cm.

According to this embodiment, the heating step can include heating to a temperature of not greater than about 300° C., such as not greater than about 250° C., even not greater than about 200° C. and even not greater than about 150° C. The molecular precursor can include a highly conductive metal, such as one selected from the group consisting of silver, copper and nickel. The insulating material can be selected from the group consisting of silica, alumina, titania and a glass and the insulator particles can have an average particle size of not greater than about 100 nanometers. The step of applying a flowable precursor composition includes depositing a flowable precursor composition using a syringe. The substrate can be, for example, a polyimide substrate. The resistor can have a resistivity of at least about 1000 μΩ-cm, such as at least about 10,000 μΩ-cm and even at least about 100,000 μΩ-cm.

According to another embodiment of the present invention, a method for fabricating an inorganic resistor on an organic substrate is provided, including the step of applying a flowable precursor composition to an organic substrate wherein the precursor composition includes a molecular precursor to a conductive phase and a powder of a resistive material. The substrate and/or precursor composition is heated to a temperature of not greater than about 350° C. to convert the molecular precursor to the conductive phase and form a resistor wherein the resistor has a resistivity of at least about 100 μΩ-cm.

According to this embodiment, the heating step can include heating to a temperature of not greater than about 300° C., such as not greater than about 250° C., for example not greater than about 200° C., or even not greater than about 150° C. The molecular precursor can include a highly conductive metal, such as a metal selected from the group consisting of silver, copper and nickel. The resistive material can be selected from the group consisting of semiconducting oxides, ruthenium oxide, metal ruthenates including rutile, pyrochlore and perovskite phases of ruthenium, indium tin oxide, tin oxide, indium oxide, antimony oxide and zinc oxide. The resistive particles can have an average particle size of not greater than about 100 nanometers. The substrate can be, for example, a polyimide substrate. The resistor can have a resistivity of at least about 1000 µΩ-cm, such as at least about 10,000 µΩ-cm and even at least about 100,000 µΩ-cm.

According to another embodiment, a method for fabricating an inorganic resistor on an organic substrate is provided including the step of applying a flowable precursor composition to an organic substrate wherein the precursor composition includes a molecular precursor to a resistive phase and a powder of a conductive material. The substrate and/or precursor composition is heated to a temperature of not greater than about 350° C. to convert the molecular precursor to the resistive phase and form a resistor wherein the resistor has a resistivity of at least about 1000 µΩ-cm.

According to this embodiment, the heating step can include heating to a temperature of not greater than about 300° C., such as not greater than about 250° C. and even not greater than about 200° C. The conductive powder can include a high conductivity metal such as a metal selected from the group consisting of silver, copper and nickel. The resistive phase material can be selected from the group consisting of semiconducting oxides, ruthenium oxide, metal ruthenates including rutile, pyrochlore and perovskite phases of ruthenium, indium tin oxide, tin oxide, indium oxide, antimony oxide and zinc oxide. The conductive particles can have an average particle size of not greater than about 100 nanometers. The substrate can be a polyimide substrate and the resistor can have a resistivity of at least about 10,000 µΩ-cm, such as at least about 100,000 µΩ-cm.

According to another embodiment, a method for fabricating an inorganic resistor on an organic substrate is provided including the step of applying a flowable precursor composition to an organic substrate wherein the precursor composition includes a molecular precursor to a resistive phase and a powder of a resistive material. The substrate and/ore precursor composition can then be heated to a temperature of not greater than about 350° C. to convert the molecular precursor to the resistive phase and form a resistor wherein the resistor has a resistivity of at least about 100,000 µΩ-cm.

According to this embodiment, the heating step can include heating to a temperature of not greater than about 300° C., such as not greater than about 250° C. and even not greater than about 200° C. The molecular precursor can include a precursor to a material selected from the group consisting of semiconducting oxide, ruthenium oxide, metal ruthenates including rutile, pyrochlore and perovskite phases of ruthenium, indium tin oxide, tin oxide, indium oxide, antimony oxide and zinc oxide. The resistive material can be selected from the group consisting of semiconducting oxides, ruthenium oxide, metal ruthenates including rutile, pyrochlore and perovskite phases of ruthenium, indium tin oxide, tin oxide, indium oxide, antimony oxide and zinc oxide and can have an average particle size of not greater than about 100 nanometers.

According to another embodiment of the present invention, a method for fabricating an inorganic resistor on an organic substrate is provided, including the step of applying a flowable precursor composition to an organic substrate wherein the precursor composition includes a molecular precursor to a resistive phase and a powder of an insulative material. The substrate and/or precursor composition can be heated to a temperature of not greater than about 350° C. to convert the molecular precursor to the resistive phase and form a resistor wherein the resistor has a resistivity of at least about 10,000 µΩ-cm.

According to this embodiment, the heating step can include heating to a temperature of not greater than about 300° C., such as not greater than about 250° C. and even not greater than about 200° C. The insulative powder can include a material selected from the group consisting of silica, alumina and titania. The resistive phase material can be selected from the group consisting of semiconducting oxides, ruthenium oxide, metal ruthenates including rutile, pyrochlore and perovskite phases of ruthenium, indium tin oxide, tin oxide, indium oxide, antimony oxide and zinc oxide.

According to another embodiment of the present invention, a method for fabricating an inorganic resistor on an organic substrate is provided including the steps of applying a flowable precursor composition to an organic substrate wherein the precursor composition includes a molecular precursor to an insulative phase and a powder of a conductive material. The substrate and/or precursor composition is then heated to a temperature of not greater than about 350° C. to convert the molecular precursor to the insulative phase and form a resistor wherein the resistor has a resistivity of at least about 10,000 µΩ-cm.

According to this embodiment, the heating step can include heating to a temperature of not greater than about 300° C., such as not greater than about 250° C. and even not greater than about 200° C. The conductive powder can include a metal selected from the group consisting of silver, copper and nickel and the insulative phase material can be selected from the group consisting of silica, alumina, titania and a glass.

According to another embodiment of the present invention, a method for fabricating an inorganic resistor on an organic substrate is provided including the steps of applying a flowable precursor composition to an organic substrate wherein the precursor composition includes a molecular precursor to an insulative phase and a powder of a resistive material. The substrate and/or precursor composition can then be heated to a temperature of not greater than about 350° C. to convert the molecular precursor to the insulative phase and form a resistor wherein the resistor has a resistivity of at least about 100,000 µΩ-cm.

According to this embodiment, the heating step can include heating to a temperature of not greater than about 300° C., such as not greater than about 250° C. and even not greater than about 200° C. The molecular precursor can include a precursor to a material selected from the group consisting of silica, alumina, titania and glass and the resistive material can be selected from the group consisting of semiconducting oxides, ruthenium oxide, metal ruthenates including rutile, pyrochlore and perovskite phases of ruthenium, indium tin oxide, tin oxide, indium oxide, antimony oxide and zinc oxide. The resistor can have a resistivity of at least about 1,000,000 µΩ-cm.

According to another embodiment, a precursor composition having a viscosity of at least about 5000 centipoise is provided, including a precursor solution comprising a molecular precursor compound at least partially dissolved in a solvent and an inorganic powder dispersed throughout the precursor solution, wherein the precursor composition can be converted to an inorganic resistor having a resistivity of from about 100 µΩ-cm to about 50,000 µΩ-cm at a temperature of not greater than about 350° C.

According to this embodiment, the molecular precursor compound can be a precursor to a metal selected from the group consisting of silver, copper and nickel. Further, the molecular precursor compound can be a metal carboxylate compound, such as a halogenated carboxylate compound. A preferred molecular precursor compound is silver trifluoroacetate. The inorganic powder can include a metal oxide, such as silica, titania or alumin and the inorganic powder can include a glass.

The foregoing methods and compositions can be used to fabricate a variety of components. Preferred components include those disposed on a circuit comprising organic transistors, a display backplane, a circuit board, an RF tag and a smart card.

These and other embodiments of the present invention will become apparent from the following detailed description.

DESCRIPTION OF THE INVENTION

The present invention is directed to precursor compositions having a high viscosity that can be deposited onto a surface using methods such as screen printing. The precursor compositions preferably have a low decomposition temperature, thereby enabling the formation of electronic features on a variety of substrates, including organic substrates. The precursor compositions can include various combinations of molecular metal precursors, solvents, micron-size particles, nanoparticles, vehicles, reducing agents and other additives. The precursor compositions can be deposited onto a substrate and reacted to form conductive traces and other passive electronic features formed from dielectrics and resistors.

The precursor compositions according to the present invention can be formulated to have a wide range of properties and a wide range of relative cost. For example, in high volume applications that do not require well-controlled properties, inexpensive precursor compositions can be deposited on cellulose-based materials, such as paper, to form simple disposable circuits. On the other hand, the precursor compositions of the present invention can be utilized to form complex and high precision circuitry having good electrical properties.

The method for forming the electronic features according to the present invention can also make use of relatively low processing temperatures. Depending upon the materials included in the precursor composition, the conversion temperature can be not greater than about 900° C., such as not greater than about 600° C. In one embodiment, the conversion temperature is not greater than about 400° C., such as not greater than about 350° C. and preferably not greater than about 250° C. According to a particularly preferred embodiment, the conversion temperature can be not greater than about 200° C., such as not greater than about 150° C. The heating time can also be very short, such as not greater than about 5 minutes, more preferably not greater than about 1 minute and even more preferably not greater than about 10 seconds.

Definitions

As used herein, the terms precursor composition or high viscosity precursor composition refer to a flowable composition that has a viscosity of at least about 1000 centipoise, such as at least 5000 centipoise. According to one embodiment, the precursor composition has a viscosity of greater than about 10,000 centipoise. As used herein, the viscosity is measured at a shear rate of about 132 Hz and under the relevant deposition conditions, particularly temperature. For example, some precursor compositions may be heated prior to and/or during deposition to reduce the viscosity.

As used herein, the term molecular precursor refers to a molecular compound that includes a metal atom. Examples include organometallics (molecules with carbon-metal bonds), metal organics (molecules containing organic ligands with metal bonds to other types of elements such as oxygen, nitrogen or sulfur) and inorganic compounds such as metal oxides, metal nitrates, metal halides and other metal salts.

As used herein, the term precursor solution refers to a precursor or a mixture of precursors dissolved in a solvent. A solvent is a flowable chemical that is capable of dissolving at least a portion of the molecular precursor. The precursor solution can also include other additives such as crystallization inhibitors, reducing agents, and agents that reduce the conversion (e.g. decomposition) temperature of the molecular precursors.

In addition to the precursor solution, the precursor composition can include particulates of one or several materials. The particulates can fall in two size ranges referred to herein as nanoparticles and micron-size particles. Nanoparticles have an average size of not greater than about 100 nanometers and micron-size particles have an average particle size of at least about 0.1 µm. Nanoparticles and micron-size particles are collectively referred to herein as particles or powders.

The precursor compositions can also include a vehicle. As used herein, a vehicle is a flowable medium that facilitates deposition of the precursor composition, such as by imparting sufficient flow properties to the precursor compositions. As will be appreciated from the following discussion, the same chemical can have multiple functions, such as one that is both a solvent and a vehicle.

Other materials, referred to simply as additives, can also be included in the precursor compositions of the present invention. As is discussed below, such additives can include, but are not limited to, crystallization inhibitors, polymers, polymer precursors (oligomers or monomers), reducing agents, binders, dispersants, surfactants, thickening agents and the like.

Precursor Compositions

As is discussed above, the precursor compositions according to the present invention can optionally include particulates in the form of nanoparticles and/or micron-size particles.

Nanoparticles have an average size of not greater than about 100 nanometers, such as from about 10 to 80 nanometers. Particularly preferred are nanoparticles having an average size in the range of from about 25 to 75 nanometers.

Nanoparticles that are particularly preferred for use in the present invention are not substantially agglomerated. Preferred nanoparticle compositions include $Al_2O_3$, $CuO_x$, $SiO_2$ and $TiO_2$, conductive metal oxides such as $In_2O_3$, indium-tin oxide (ITO) and antimony-tin oxide (ATO), silver, palladium, copper, gold, platinum and nickel. Other useful nanoparticles of metal oxides include pyrogenous silica such as HS-5 or M5 or others (Cabot Corp., Boston, Mass.) and AEROSIL 200 or others (Degussa AG, Dusseldorf, Germany) or surface modified silica such as TS530 or TS720 (Cabot Corp., Boston, Mass.) and AEROSIL 380 (Degussa A G, Dusseldorf, Germany). In one embodiment of the present invention, the nanoparticles are composed of the same metal that is contained in the molecular precursor compound, discussed below. Nanoparticles can be fabricated using a number of methods and one preferred method, referred to as the Polyol process, is disclosed in U.S. Pat. No. 4,539,041 by Figlarz et al., which is incorporated herein by reference in its entirety.

The precursor compositions according to the present invention can also include micron-size particles, having an average size of at least about 0.1 µm. Preferred compositions of micron-size particles are similar to the compositions described above with respect to nanoparticles. The shape of the particles can be varied from completely spherical such as those produced by spray pyrolysis to flakes that are leaf-like in shape with very large aspect ratios. Particles can also be any oblong shape in between spheres and flakes. When substantially spherical particles are described, the particle size refers to the particle diameter, when flakes are described, the particle size refers to the largest dimension measure across such a particle. Flake content, flake particle size, flake agglomeration, and surface morphology are all well controlled in the present invention. In one embodiment, precursor compositions according to the present invention do not include any flakes.

Generally, the volume median particle size of the micron-size particles is at least about 0.1 µm, such as at least about 0.3 µm. Further, the median particle size is preferably not greater than about 20 µm. For most applications, the volume median particle size is more preferably not greater than about 10 µm and even more preferably not greater than about 5 µm. A particularly preferred median particle size is from about 0.3 µm to about 3 µm. According to one embodiment of the present invention, it is preferred that the volume median particle size of the micron-size particles is at least 10 times smaller than the orifice diameter in the tool depositing the precursor composition, such as not greater than about 5 µm for syringe-dispense device having a 50 µm orifice. As used herein, the term "average" particle size refers to the volume median particle size.

According to a preferred embodiment of the present invention, the particles (nanoparticles and micron-size particles) also have a narrow particle size distribution, such that the majority of particles are about the same size and so that there are a minimal number of large particles that can clog mesh openings of a screen-printing tool or the channel of a syringe dispense tool. A narrow particle size distribution is particularly advantageous for direct-write applications due to reduced clogging of tools by large particles and due to the ability to form surface features having a fine line width, high resolution and high packing density. Preferably, at least about 70 volume percent and more preferably at least about 80 volume percent of the particles within the same size classification (nanoparticles or micron-size particles) are not larger than twice the average particle size. For example, when the average particle size of micron-size particles is about 2 µm, it is preferred that at least about 70 volume percent of the micron-size particles are not larger than 4 µm and it is more preferred that at least about 80 volume percent of the micron-size particles are not larger than 4 µm. Further, it is preferred that at least about 70 volume percent and more preferably at least about 80 volume percent of the particles are not larger than about 1.5 times the average particle size. Thus, when the average particle size of the micron-size particles is about 2 µm, it is preferred that at least about 70 volume percent of the micron-size particles are not larger than 3 µm and it is more preferred that at least about 80 volume percent of the micron-size particles are not larger than 3 µm.

It is known that micron-size particles and nanoparticles often form soft agglomerates as a result of their relatively high surface energy, as compared to larger particles. It is also known that such soft agglomerates may be dispersed easily by treatments such as exposure to ultrasound in a liquid medium, sieving, high shear mixing and 3-roll milling. The average particle size and particle size distributions described herein are measured by mixing samples of the powders in a liquid medium, such as water and a surfactant, and exposing the suspension to ultrasound through either an ultrasonic bath or horn. The ultrasonic treatment supplies sufficient energy to disperse the soft agglomerates into primary particles. The primary particle size and size distribution are then measured by light scattering in a MICROTRAC instrument. Thus, the references to particle size herein refer to the primary particle size, such as after lightly dispersing soft agglomerates of the particles.

It is also possible according to the present invention to provide micron-size particles or nanoparticles having a bimodal or trimodal particle size distribution. That is, the particles can have two distinct and different average particle sizes. Preferably, each of the distinct particle size distributions will meet the foregoing size distribution limitations. A bimodal or trimodal particle size distribution can advantageously enhance the packing efficiency of the particles when deposited according to the present invention. The two modes can include particles of different compositions. In one embodiment, the two modes have average particle sizes at about 1 µm and 5 µm, and in another embodiment the average particle size of the two modes is at about 0.5 µm and 2.5 µm. The bimodal particle size distribution can also be achieved using nanoparticles and in one embodiment, the larger mode has an average particle size of from about 1 µm to 10 µm and the smaller mode has an average particle size of from about 10 to 100 nanometers. A bimodal particle size distribution can be particularly advantageous with respect to density of the final feature when the smaller size particles constitute about 10 wt. % of the total mass of particles.

The particles that are useful in the precursor compositions according to the present invention also preferably have a high degree of purity and it is preferred that the particles include not greater than about 1.0 atomic percent impurities and more preferably not greater than about 0.1 atomic percent impurities and even more preferably not greater than about 0.01 atomic percent impurities. Impurities are those materials that are not intended in the final product and that negatively affect the properties of the final product. For many electronic applications, the most critical impurities to avoid are Na, K, and Cl, S and F. As is discussed below, it will be appreciated that the particles can include composite particles having one or more second phases. Such second phases are not considered impurities.

The particles for use in the precursor compositions according to the present invention can also be coated particles wherein the particle includes a surface coating surrounding the particle core. Coatings can be generated on the particle surface by a number of different mechanisms. One preferred mechanism is spray pyrolysis. One or more coating precursors can vaporize and fuse to the hot particle surface and thermally react resulting in the formation of a thin film coating by chemical vapor deposition (CVD). Preferred coatings deposited by CVD include metal oxides and elemental metals. Further, the coating can be formed by physical vapor deposition (PVD) wherein a coating material physically deposits on the surface of the particles. Preferred coatings deposited by PVD include organic materials and elemental metals. Alternatively, a gaseous precursor can react in the gas phase forming small particles, for example, less than about 5 nanometers in size, which then diffuse to the larger particle surface and sinter onto the surface, thus forming a coating. This method is referred to as gas-to-particle conversion (GPC). Whether such coating reactions occur by CVD, PVD or GPC is dependent on the reactor conditions, such as temperature, precursor partial pressure, water partial pressure and the concentration of particles in the gas stream. Another possible surface coating method is surface conversion of the particles by reaction with a vapor phase reactant to convert the surface of the particles to a different material than that originally contained in the particles.

In addition, a volatile coating material such as lead oxide, molybdenum oxide or vanadium oxide can be introduced into the reactor such that the coating deposits on the particles by condensation. Further, the particles can be coated using other techniques. For example, soluble precursors to both the particle and the coating can be used in the precursor solution. In another embodiment, a colloidal precursor and a soluble precursor can be used to form a particulate colloidal coating on the composite particle. It will be appreciated that multiple coatings can be deposited on the surface of the particles if such multiple coatings are desirable.

The coatings are preferably as thin as possible while maintaining conformity about the particles such that the core of the particle is not substantially exposed. For example, the coatings on a micron-size particle can have an average thickness of not greater than about 200 nanometers, preferably not greater than about 100 nanometers and more preferably not more than about 50 nanometers. For most applications, the coating has an average thickness of at least about 5 nanometers. A specific example of useful coated particles is silica coated silver particles.

For example, copper particles can be coated with another metal such as silver to stabilize the surface against oxidation during heat treatment of the precursor composition. Alternatively, silver particles can be coated with one or more metals such as copper, silver/palladium or silver/platinum to increase the solder leach resistance while maintaining high conductivity. Another preferred example of a coated particle is Ag coated with a silica coating. This will prevent particle agglomeration during production and formulation into a precursor composition. The coating can act as a sintering delay barrier in certain applications. When formulated into a silver precursor composition, the silica coating can have a positive impact on precursor composition flowability and the minimum feature size of the conductive traces formed using this precursor composition.

Nanoparticles can also be coated by utilizing the coating strategies described above. In addition, it may be advantageous to coat nanoparticles with materials such as a polymer to prevent agglomeration of the nanoparticles due to high surface energy. This is described by P.Y. Silvert et al. (Preparation of colloidal silver dispersions by the polyol process, Journal of Material Chemistry, 1997, volume 7(2), pp. 293-299). In another embodiment, the particles can be coated with an intrinsically conductive polymer, preventing agglomeration in the precursor composition and providing a conductive patch after solidification of the precursor composition. In yet another embodiment, the polymer can decompose during heating enabling the nanoparticles to sinter together. In one embodiment, the nanoparticles are generated in-situ and are coated with a polymer. Preferred coatings for nanoparticles according to the present invention include sulfonated perfluorohydrocarbon polymer (e.g., NAFION, available from E.I. duPont deNemours, Wilmington, Del.) polystyrene, polystyrene/methacrylate, polyvinyl pyrolidone, sodium bis(2-ethylhexyl) sulfosuccinate, tetra-n-octyl-ammonium bromide and alkane thiolates.

The particles that are useful with the present invention can also be "capped" with other compounds. The term capped refers to having compounds bonded to the outer surface of the particles without necessarily creating a coating over the outer surface. The particles used with the present invention can be capped with any functional group including organic compounds such as polymers, organometallic compounds, and metal organic compounds. These capping agents can serve a variety of functions including the prevention of agglomeration of the particles, prevention of oxidation, enhancement of bonding of the particles to a surface, and enhancement of the flowability of the particles in a precursor composition. Preferred capping agents that are useful with the particles of the present invention include amine compounds, organometallic compounds, and metal organic compounds.

The particulates in accordance with the present invention can also be composite particles wherein the particles include a first phase and a second phase associated with the first phase. Preferred composite particulates include carbon-metal, carbon-polymer, carbon-ceramic, carbon1-carbon2, ceramic-ceramic, ceramic-metal, metal1-metal2, metal-polymer, ceramic-polymer, and polymer1-polymer2. Also preferred are certain 3-phase combinations such as metal-carbon-polymer. In one embodiment, the second phase is uniformly dispersed throughout the first phase. The second phase can be an electronic compound or it can be a non-electronic compound. For example, sintering inhibitors such as metal oxides can be included as a second phase in a first phase of a metallic material, such as silver metal to inhibit sintering of the metal without substantially affecting the conductivity.

The particulates according to a preferred embodiment of the present invention are also substantially spherical in shape. That is, the particulates are not jagged or irregular in shape. Spherical particles are particularly advantageous because they are able to disperse more readily in a precursor composition and impart advantageous flow characteristics to the precursor composition. For a given level of solids-loading, a precursor composition having spherical particles will have a lower viscosity than a composition having non-spherical particles, such as flakes. Spherical particles are also less abrasive than jagged particles.

Micron-size particles in accordance with the foregoing can be produced, for example, by spray pyrolysis. Spray pyrolysis for production of micron-size particles is described in U.S. Pat. No. 6,338,809 by Hampden-Smith, et al., which is incorporated herein by reference in its entirety.

The application of passive electronic components on flexible and/or low temperature substrates such as polyimide requires new approaches and concepts for the development of suitable precursor chemistries and formulations. For example, low temperature substrate materials require low precursor conversion temperatures.

One method according to the present invention for formulating compositions for fabrication of resistor and dielectric circuit components utilizes suitable molecular precursors that can be converted to functional materials at relatively low temperatures. Some progress has been made in the development of metal organic precursors for printing conductors, dielectrics and resistors. See, for example, "Chemical aspects of solution routes to perovskite-phase mixed-metal oxides from metal-organic precursors", C. D. Chandler, C Roger, and M. J. Hampden-Smith, Chem. Rev 0.93, 1205-1241 (1993). The molecular precursor should convert to the desired material (e.g., a conductive, resistive or insulative phase) at a low temperature. The molecular precursors should be easy to synthesize, be environmentally benign, provide clean elimination of inorganic or organic ligands and be compatible with other precursor composition constituents. Other factors are solubility in various solvents, stability during the deposition process, homogeneous phase formation, good adhesion to the substrate, high yield, and long shelf life. If a laser is used for precursor conversion, the precursor should be highly absorptive at the laser wavelength being used to promote efficient laser energy coupling allowing for decomposition at low laser power. This will prevent substrate damage during laser processing.

The metal-ligand bond is a key factor in selecting metal organic molecular precursors. For the formation of conductive phases in low-ohm resistors, this bond should be reactive enough to permit complete elimination of the ligand during formation of metallic features for conductors like silver, gold, nickel, copper, palladium, platinum or alloys of these elements. Preferred precursor families include metal carboxylates, alkoxides, and diketonates including at least one metal oxygen bond. Depending on the metal, thiolates and amines can be specifically tailored to the required characteristics.

Deposition of electro-ceramic materials for dielectric and resistor applications requires precursors that are able to undergo clean and low temperature transformation to single oxides or mixed oxides. This is required to mimic the high-fire compositions currently being used in the electronic industry. Typical reaction mechanisms involved for these metal oxide based formulations are condensation, polymerization, or elimination reactions of alkoxides typically used in sol-gel processes. Other reaction routes involve ether, carboxylic anhydride, or ester elimination.

The present invention is also directed to combinations of precursors, additives and solvents for the conversion to the final material at low temperatures. Even if a conversion at low temperature with complete elimination of byproducts can be achieved, metal oxide materials may still need some higher temperature treatment for proper crystallization and consolidation. In contrast, important metals like silver, gold, palladium and copper can be deposited and converted according to the present invention using carefully designed precursor compositions at temperatures below 200° C., in some cases even below 150° C. with good adhesion to polymeric substrates such as polyimide substrates.

Particularly preferred precursor compositions for dielectric and resistive features are described more fully below.

The precursor compositions according to the present invention can include molecular precursors to a metallic phase, either alone or in combination with particles. For example, low-ohm resistors often include a conductive metallic phase. Preferred examples include precursors to silver (Ag), nickel (Ni), platinum (Pt), gold (Au), palladium (Pd), copper (Cu), indium (In) and tin (Sn). Other molecular metal precursors can include precursors to aluminum (Al), zinc (Zn), iron (Fe), tungsten (W), molybdenum (Mo), ruthenium (Ru), lead (Pb), bismuth (Bi) and similar metals. The molecular metal precursors can be either soluble or insoluble in the precursor composition.

In general, metal precursor compounds that eliminate ligands by a radical mechanism upon conversion to metal are preferred, especially if the species formed are stable radicals and therefore lower the decomposition temperature of that precursor.

Furthermore, molecular metal precursors containing ligands that upon precursor conversion eliminate cleanly and escape completely from the substrate (or the formed functional structure) are preferred because this does not form carbon contamination or contamination by anionic species such as nitrates. Therefore, preferred precursors for metals as used for example in conductors or resistors are carboxylates, alkoxides or combinations thereof that convert to metals, metal oxides or mixed metal oxides by eliminating small molecules such as carboxylic acid anhydrides, ethers or esters. Carboxylates, particularly halogenocarboxylates such as fluorocarboxylates, are also advantageous due to their high solubility.

Silver is a particularly preferred conductive phase material according to the present invention. Examples of silver metal precursors that can be used in the precursor compositions according to the present invention are illustrated in Table 1.

TABLE 1

Silver Precursor Molecular Compounds

| General Class | Examples | Chemical Formula |
|---|---|---|
| Nitrates | Silver nitrate | $AgNO_3$ |
| Nitrites | Silver nitrite | $AgNO_2$ |
| Oxides | Silver oxide | $Ag_2O$, $AgO$ |
| Carbonates | Silver carbonate | $Ag_2CO_3$ |
| Oxalates | Silver oxalate | $Ag_2C_2O_4$ |
| (Pyrazolyl) borates | Silver trispyrazolylborate | $Ag[(N_2C_3H_3)_3]BH$ |
| | Silver tris(dimethylpyrazolyl)borate | $Ag[((CH_3)_2N_2C_3H_3)_3]BH$ |
| Azides | Silver azide | $AgN_3$ |
| Fluoro-borates | Silver tetrafluoroborate | $AgBF_4$ |
| Carboxylates | Silver acetate | $AgO_2CCH_3$ |
| | Silver propionate | $AgO_2CC_2H_5$ |
| | Silver butanoate | $AgO_2CC_3H_7$ |
| | Silver ethylbutyrate | $AgO_2CCH(C_2H_5)C_2H_5$ |
| | Silver pivalate | $AgO_2CC(CH_3)_3$ |
| | Silver cyclohexanebutyrate | $AgO_2C(CH_2)_3C_6H_{11}$ |
| | Silver ethylhexanoate | $AgO_2CCH(C_2H_5)C_4H_9$ |
| | Silver neodecanoate | $AgO_2CC_9H_{19}$ |
| Halogeno-carboxylates | Silver trifluoroacetate | $AgO_2CCF_3$ |
| | Silver pentafluoropropionate | $AgO_2CC_2F_5$ |
| | Silver heptafluorobutyrate | $AgO_2CC_3F_7$ |
| | Silver trichloroacetate | $AgO_2CCCl_3$ |
| | Silver 6,6,7,7,8,8,8-heptafluoro-2,2-dimethyl-3,5-octanedionate | AgFOD |
| Amino-carboxylates | Silver glyconate | |
| Hydroxy-carboxylates | Silver lactate | $AgO_2CH(OH)CH_3$ |
| | Silver citrate | $Ag_3C_6H_5O_7$ |
| | Silver glycolate | $AgOOCCH(OH)CH_3$ |
| Aromatic and nitro and/or fluoro substituted aromatic Carboxylates | Silver benzoate | $AgO_2CCH_2C_6H_5$ |
| | Silver phenylacetate | $AgOOCCH_2C_6H_5$ |
| | Silver nitrophenylacetates | $AgOOCCH_2C_6H_4NO_2$ |
| | Silver dinitrophenylacetate | $AgOOCCH_2C_6H_3(NO_2)_2$ |
| | Silver difluorophenylacetate | $AgOOCCH_2C_6H_3F_2$ |
| | Silver 2-fluoro-5-nitrobenzoate | $AgOOCC_6H_3(NO_2)F$ |
| Beta diketonates | Silver acetylacetonate | $Ag[CH_3COCH=C(O-)CH_3]$ |
| | Silver hexafluoroacetylacetonate | $Ag[CF_3COCH=C(O-)CF_3]$ |
| | Silver trifluoroacetylacetonate | $Ag[CH_3COCH=C(O-)CF_3]$ |
| Silver sulfonates | Silver tosylate | $AgO_3SC_6H_4CH_3$ |
| | Silver triflate | $AgO_3SCF_3$ |

In addition to the foregoing, complex silver salts containing neutral inorganic or organic ligands can also be used as molecular metal precursors. These salts are usually in the form of nitrates, halides, perchlorates, hydroxides or tetrafluoroborates. Examples are listed in Table 2.

TABLE 2

Complex Silver Salt Precursors

| Class | Examples (Cation) |
|---|---|
| Amines | $[Ag(RNH_2)_2]^+$, $Ag(R_2NH)_2]^+$, $[Ag(R_3N)_2]^+$, R = aliphatic or aromatic |
| N-Heterocycles | $[Ag(L)_x]^+$, (L = aziridine, pyrrol, indol, piperidine, pyridine, aliphatic substituted and amino substituted pyridines, imidazole, pyrimidine, piperazine, triazoles, etc.) |

TABLE 2-continued

Complex Silver Salt Precursors

| Class | Examples (Cation) |
|---|---|
| Amino alcohols | $[Ag(L)_x]^+$, L = Ethanolamine |
| Amino acids | $[Ag(L)_x]^+$, L = Glycine |
| Acid amides | $[Ag(L)_x]^+$, L = Formamides, acetamides |
| Nitriles | $[Ag(L)_x]^+$, L = Acetonitriles |

The molecular metal precursors can be utilized in an aqueous-based solvent or an organic solvent. Preferred molecular metal precursors for silver in an organic solvent include Ag-nitrate, Ag-neodecanoate, Ag-trifluoroacetate, Ag-acetate, Ag-lactate, Ag-cyclohexanebutyrate, Ag-carbonate, Ag-oxide, Ag-ethylhexanoate, Ag-acetylacetonate, Ag-ethylbutyrate, Ag-pentafluoropropionate, Ag-benzoate, Ag-citrate, Ag-heptafluorobutyrate, Ag-salicylate, Ag-decanoate and Ag-glycolate. Among the foregoing, particularly preferred molecular metal precursors for silver include Ag-acetate, Ag-nitrate, Ag-trifluoroacetate and Ag-neodecanoate. Most preferred among the foregoing silver precursors are Ag-trifluoroacetate and Ag-neodecanoate. The preferred precursors generally have a high solubility and high metal yield. For example, Ag-trifluoroacetate has a solubility in dimethylacetamide of about 78 wt. % and Ag-trifluoroacetate is a particularly preferred silver precursor according to the present invention.

Preferred molecular silver precursors for aqueous-based solvents include Ag-nitrates, Ag-fluorides such as silver fluoride or silver hydrogen fluoride ($AgHF_2$), Ag-thiosulfate, Ag-trifluoroacetate and soluble diamine complexes of silver salts.

Silver precursors in solid form that decompose at a low temperature, such as not greater than about 200° C., can also be used. Examples include Ag-oxide, Ag-nitrite, Ag-carbonate, Ag-lactate, Ag-sulfite and Ag-citrate.

When a more volatile molecular metal silver precursor is desired, the precursor can be selected from alkene silver betadiketonates, $R_2(CH)_2Ag([R'COCH=C(O-)CR'']$ where R=methyl or ethyl and R', R''=$CF_3$, $C_2F_5$, $C_3F_7$, $CH_3$, $C_mH_{2m+1}$ (m=2 to 4), or trialkylphosphine and triarylphosphine derivatives of silver carboxylates, silver beta diketonates or silver cyclopentadienides.

Nickel is also a useful metal according to the present invention. Molecular metal precursors for nickel that are preferred are illustrated in Table 3. A particularly preferred nickel precursor for use with an aqueous-based solvent is Ni-acetylacetonate.

TABLE 3

Molecular Metal Precursors for Nickel

| General Class | Example | Chemical Formula |
|---|---|---|
| Inorganic Salts | Ni-nitrate | $Ni(NO_3)_2$ |
| | Ni-sulfate | $NiSO_4$ |
| | Nickel amine complexes | $[Ni(NH_3)_6]^{n+}$ (n = 2, 3) |
| | Ni-tetrafluoroborate | $Ni(BF_4)_2$ |
| Metal Organics Alkoxides, Beta-diketonates, Carboxylates, Fluoro-carboxylates | Ni-oxalate | $NiC_2O_4$ |
| | Ni-isopropoxide | $Ni(OC_3H_7)_2$ |
| | Ni-methoxyethoxide | $Ni(OCH_2CH_2OCH_3)_2$ |
| | Ni-acetylacetonate | $[Ni(acac)_2]_3$ or $Ni(acac)_2(H_2O)_2$ |
| | Ni-hexafluoroacetylacetonate | $Ni[CF_3COCH=C(O-)CF_3]_2$ |
| | Ni-formate | $Ni(O_2CH)_2$ |
| | Ni-acetate | $Ni(O_2CCH_3)_2$ |
| | Ni-octanoate | $Ni(O_2CC_7H_{15})_2$ |

TABLE 3-continued

Molecular Metal Precursors for Nickel

| General Class | Example | Chemical Formula |
|---|---|---|
| | Ni-ethylhexanoate | $Ni(O_2CCH(C_2H_5)C_4H_9)_2$ |
| | Ni-trifluoroacetate | $Ni(OOCCF_3)_2$ |

Platinum is also a useful metal and various molecular metal precursors can be used for platinum metal. Preferred molecular metal precursors include ammonium salts of platinum such as ammonium hexachloro platinate $(NH_4)_2PtCl_6$, and ammonium tetrachloro platinate $(NH_4)_2PtCl_4$; sodium and potassium salts of halogeno, pseudohalogeno or nitrito platinates such as potassium hexachloro platinate $K_2PtCl_6$, sodium tetrachloro platinate $Na_2PtCl_4$, potassium hexabromo platinate $K_2PtBr_6$, potassium tetranitrito platinate $K_2Pt(NO_2)_4$; dihydrogen salts of hydroxo or halogeno platinates such as hexachloro platinic acid $H_2PtCl_6$, hexabromo platinic acid $H_2PtBr_6$, dihydrogen hexahydroxo platinate $H_2Pt(OH)_6$; diamine and tetraamine platinum compounds such as diamine platinum chloride $Pt(NH_3)_2Cl_2$, tetraamine platinum chloride $[Pt(NH_3)_4]Cl_2$, tetraamine platinum hydroxide $[Pt(NH_3)_4](OH)_2$, tetraamine platinum nitrite $[Pt(NH_3)_4](NO_2)_2$, tetramine platinum nitrate $Pt(NH_3)_4(NO_2)_2$, tetramine platinum bicarbonate $[Pt(NH_3)_4](HCO_3)_2$, tetraamine platinum tetrachloroplatinate $[Pt(NH_3)_4]PtCl_4$; platinum diketonates such as platinum (II) 2,4-pentanedionate $Pt(C_5H_7O_2)_2$; platinum nitrates such as dihydrogen hexahydroxo platinate $H_2Pt(OH)_6$ acidified with nitric acid; other platinum salts such as Pt-sulfite and Pt-oxalate; and platinum salts comprising other N-donor ligands such as $[Pt(CN)_6]^{4+}$.

Platinum precursors useful in organic-based precursor compositions include Pt-carboxylates or mixed carboxylates. Examples of carboxylates include Pt-formate, Pt-acetate, Pt-propionate, Pt-benzoate, Pt-stearate, and Pt-neodecanoate. Other precursors useful in organic precursor compositions include aminoorgano platinum compounds including Pt(diaminopropane)(ethylhexanoate).

Preferred combinations of platinum precursors and solvents include: $PtCl_4$ in $H_2O$; Pt-nitrate solution from $H_2Pt(OH)_6$; $H_2Pt(OH)_6$ in $H_2O$; $H_2PtCl_6$ in $H_2O$; and $[Pt(NH_3)_4](NO_3)_2$ in $H_2O$.

Gold is another useful metal and gold precursors that are particularly useful for aqueous based systems include Au-chloride ($AuCl_3$) and tetrachloric auric acid ($HAuCl_4$).

Gold precursors useful for organic based formulations include: Au-thiolates, Au-carboxylates such as Au-acetate $Au(O_2CCH_3)_3$; aminoorgano gold carboxylates such as imidazole gold ethylhexanoate; mixed gold carboxylates such as gold hydroxide acetate isobutyrate; Au-thiocarboxylates and Au-dithiocarboxylates.

In general, preferred gold molecular metal precursors for low temperature conversion are compounds comprising a set of different ligands such as mixed carboxylates or mixed alkoxo metal carboxylates. As one example, gold acetate isobutyrate hydroxide decomposes at 155° C., a lower temperature than gold acetate. As another example, gold acetate neodecanoate hydroxide decomposes to gold metal at even lower temperature, 125° C. Still other examples can be selected from gold acetate trifluoroacetate hydroxide, gold bis(trifluoroacetate) hydroxide and gold acetate pivalate hydroxide.

Other useful gold precursors include Au-azide and Au-isocyanide. When a more volatile molecular gold precursor is desired the precursor can be selected from:

dialkyl and monoalkyl gold carboxylates, $R_{3-n}Au(O_2CR')_n$ (n=1,2) R=methyl, ethyl; R'=$CF_3$, $C_2F_5$, $C_3F_7$, $CH_3$, $C_mH_{2m+1}$(m=2-9)

dialkyl and monoalkyl gold beta diketonates, $R_{3-n}Au[R'COCH=C(O—)CR'']_n$ (n=1,2), R=methyl, ethyl; R', R''=$CF_3$, $C_2F_5$, $C_3F_7$, $CH_3$, $C_mH_{2m+1}$(m=2-4)

dialkyl and monoalkyl gold alkoxides, $R_{3-n}Au(OR')_n$ (n=1,2) R=methyl, ethyl; R'=$CF_3$, $C_2F_5$, $C_3F_7$, $CH_3$, $C_mH_{2m+1}$(m=2-4), $SiR_3''$(R''=methyl, ethyl, propyl, isopropyl, n-butyl, isobutyl, tert. Butyl)

phosphine gold complexes:
RAu(PR'$_3$) R, R'=methyl, ethyl, propyl, isopropyl, n-butyl, isobutyl, tert. Butyl,
$R_3Au(PR'_3)$ R, R'=methyl, ethyl, propyl, isopropyl, n-butyl, isobutyl, tert. butyl.

Palladium is another useful metal and particularly useful molecular precursors to palladium for organic based precursor compositions according to the present invention include Pd-carboxylates, including Pd-fluorocarboxylates such as Pd-acetate, Pd-propionate, Pd-ethylhexanoate, Pd-neodecanoate and Pd-trifluoroacetate as well as mixed carboxylates such as Pd(OOCH)(OAc), Pd(OAc)(ethylhexanoate), Pd(ethylhexanoate)$_2$, Pd(OOCH)$_{1.5}$(ethylhexanoate)$_{0.5}$, Pd(OOCH)(ethylhexanoate), Pd(OOCCH(OH)CH(OH)COOH)$_m$ (ethylhexanoate), Pd(OPr)$_2$, Pd(OAc)(OPr), Pd-oxalate, Pd(OOCCHO)$_m$(OOCCH$_2$OH)$_n$=(Glyoxilic palladium glycolate and Pd-alkoxides). A particularly preferred palladium precursor is Pd-trifluoroacetate.

Molecular palladium precursors useful for aqueous based precursor compositions include: tetraamine palladium hydroxide [Pd(NH$_3$)$_4$](OH)$_2$; Pd-nitrate Pd(NO$_3$)$_2$; Pd-oxalate Pd(O$_2$CCO$_2$)$_2$; Pd-chloride PdCl$_2$; Di- and tetraamine palladium chlorides, hydroxides or nitrates such as tetraamine palladium chloride [Pd(NH$_3$)$_4$]Cl$_2$, tetraamine palladium hydroxide [Pd(NH$_3$)$_4$](OH)$_2$, tetraamine palladium nitrate [Pd(NH$_3$)$_4$](NO$_3$)$_2$, diamine palladium nitrate [Pd(NH$_3$)$_2$](NO$_3$)$_2$ and tetraamine palladium tetrachloropalladate [Pd(NH$_3$)$_4$][PdCl$_4$].

Copper is also a particularlyl preferred metal according to the present invention. When selecting a molecular copper precursor compound, it is desired that the compound react during processing to metallic copper without the formation of copper oxide or other species that are detrimental to the conductivity of the conductive copper feature. Some copper molecular precursors form copper by thermal decomposition at elevated temperatures. Other molecular copper precursors require a reducing agent to convert to copper metal. Reducing agents are materials that are oxidized, thereby causing the reduction of another substance. The reducing agent loses one or more electrons and is referred to as having been oxidized. The introduction of the reducing agent can occur in the form of a chemical agent (e.g., formic acid) that is soluble in the precursor composition to afford a reduction to copper either during transport to the substrate or on the substrate. In some cases, the ligand of the molecular copper precursor has reducing characteristics, such as in Cu-formate or Cu-hypophosphite, leading to reduction to copper metal. However, formation of metallic copper or other undesired side reactions that occur prematurely in the ink or precursor composition should be avoided.

Accordingly, the ligand can be an important factor in the selection of suitable copper molecular precursors. During thermal decomposition or reduction of the precursor, the ligand needs to leave the system cleanly, preferably without the formation of carbon or other residues that could be incorporated into the copper feature. Copper precursors containing inorganic ligands are preferred in cases where carbon contamination is detrimental. Other desired characteristics for molecular copper precursors are low decomposition temperature or processing temperature for reduction to copper metal, high solubility in the selected solvent/vehicle to increase metallic yield and achieve dense features and the compound should be environmentally benign.

Preferred copper metal precursors according to the present invention include Cu-formate and Cu-neodecanoate. Molecular copper precursors that are useful for aqueous-based precursor compositions include: Cu-nitrate and amine complexes thereof; Cu-carboxylates including Cu-formate and Cu-acetate; and Cu beta-diketonates such as Cu-hexafluoroacetylacetonate and copper salts such as Cu-chloride.

Molecular copper precursors generally useful for organic based precursor compositions include: Cu-carboxylates and Cu-fluorocarboxylates such as Cu-ethylhexanoate; Cu-neodecanoate; Cu-methacrylate; Cu-trifluoroacetate; Cu-hexanoate; and copper beta-diketonates such as cyclooctadiene Cu-hexafluoroacetylacetonate. Among the foregoing, Cu-formate is particularly preferred as it is highly soluble in water and results in the in-situ formation of formic acid, which is an effective reducing agent.

Copper precursors useful in this invention can also be categorized as copper I and copper II compounds. They can be categorized as inorganic, metal organic, and organometallic. They can also be categorized as copper hydrides, copper amides, copper alkenes, copper allyls, copper carbonyls, copper metallocenes, copper cyclopentadienyls, copper arenes, copper carbonates, copper hydroxides, copper carboxylates, copper oxides, organo copper, copper beta-diketonates, copper alkoxides, copper beta-ketoiminates, copper halides, copper alkyls. The copper compounds can have neutral donor ligands or not have neutral ligands. Copper I compounds are particularly useful for disproportionation reactions. The disproportionation products are copper metal and a copper II compound. In some cases a neutral ligand is also a product.

In a novel approach, the copper II product can be rapidly converted back to a copper I compound using a reducing agent. Appropriate reducing agents for reducing copper II to copper I are known in the art. Useful reducing agents for copper precursors include ethylene diamine, tetramethylethylenediamine, 3 aminopropanol, mono, di and triethanolamine. Useful reducing agents are described in U.S. Pat. No. 5,378,508 by Castro et al. which is incorporated herein by reference in its entirety. The resulting copper I compound reacts further via disproportionation to form more copper and copper II compound. Through this approach with excess reducing agent, copper I compounds can be used to form pure copper metal without any copper II compounds.

The copper compounds can also be used as capping agents to cap copper particles. The copper particles can be nanoparticles. U.S. Pat. No. 6,294,401 by Jacobsen describes capping procedures and is incorporated herein in its entirety by reference.

As is discussed above, two or more molecular precursors can be combined to form metal alloys and/or metal compounds. Preferred combinations of precursors to produce alloys based on silver include: Ag-nitrate and Pd-nitrate; Ag-acetate and [Pd(NH$_3$)$_4$](OH)$_2$; Ag-trifluoroacetate and [Pd(NH$_3$)$_4$](OH)$_2$; and Ag-neodecanoate and Pd-neodecanoate. One particularly preferred combination of molecular precursors is Ag-trifluoroacetate and Pd-trifluoroacetate. Other preferred alloys include Ag/Pt and Ag/Cu.

To form alloys, the two (or more) molecular metal precursors should have similar decomposition temperatures to avoid the formation of one of the metal species before formation of the other species. Preferably, the decomposition temperatures of the different molecular metal precursors are within 50° C., more preferably within 25° C.

Some applications require the utilization of a transparent or semi-transparent conductive feature. For example, indium tin oxide (ITO) is useful for the formation of transparent conductive features, such as for use in display applications. Antimony tin oxide (ATO) is useful as a color tunable oxide layer that is useful in electrochromic applications.

Such transparent conductive features can also be fabricated according to the present invention. For ITO, useful molecular metal precursors for indium include: In-nitrate; In-chloride; In-carboxylates such as In-acetate; In-propionates including fluoro, chloro or bromo derivatives thereof; beta diketonates such as In-acetylacetonate, In-hexafluoroacetylacetonate and In-trifluoroacetylacetonate; pyrazolyl borohydrides such as $In(pz)_3BH$; In-alkoxides and In-fluoroalkoxides; and In-amides. Mixed alkoxo In-carboxylates such as indium isopropoxide ethylhexanoate are also useful.

Useful molecular metal precursors for tin in ITO or ATO include: Sn-halides such as Sn-tetrachloride; Sn-dichloride; Sn-carboxylates such as Sn-acetate or Sn-ethylhexanoate; Sn-alkoxides such as $Sn(O^tBu)_4$; Sn-hydroxycarboxylates such as Sn-glycolate; and beta diketonates such as Sn-hexafluoroacetylacetonate.

Useful molecular metal precursors for antimony include: Sb-trichloride; antimony carboxylates such as Sb-acetate or Sb-neodecanoate; antimony alkoxides such as Sb-methoxide, Sb-ethoxide, Sb-butoxide.

In one embodiment, the present invention relates to precursor compositions for low-ohm, mid-ohm, and high-ohm resistors. As used herein, a low-ohm resistor has a resistance of not greater than about 10 Ω/square, such as from about 0.2 to about 10 Ω/square. A mid-ohm resistor has a resistance of from about to about 10 Ω/square to about 10,000 Ω/square and a high-ohm resistor has a resistivity of at least about 10,000 Ω/square. Table 4 illustrates the conversion of material resistivity to resistance for different feature thickness.

TABLE 4

Conversion of Sheet Resistance

| Sheet Resistance | Resistivity (μΩ) | | |
|---|---|---|---|
| | 2 μm thickness | 4 μm thickness | 6 μm thickness |
| 1 Ω/square | 200 | 400 | 600 |
| 100 Ω/square | 20,000 | 40,000 | 60,000 |
| 10,0000 Ω/square | $2 \times 10^6$ | $4 \times 10^6$ | $6 \times 10^6$ |

These resistors can include various combinations of conductive phases, resistive phases and insulative phases. As used herein, a conductive phase or conductor is a metal or metallic phase that has a very low electrical resistivity, such as less than about 25 μΩ-cm. A resistive phase is a material that has a resistivity of from about 25 μΩ-cm to about 100,000,000 μΩ-cm (i.e., 100 Ω-cm). Such materials are sometimes referred to as semiconductors, and typically have a resistivity in the range of 30 μΩ-cm to 30,000 μΩ-cm. As used herein, an insulating phase or insulator is a material that has a resistivity of greater than 100 Ω-cm, and typically has a resistivity of at least about $10^6$ Ω-cm or higher. The major classes of resistive phase materials for mid-ohm to high-ohm resistors include metal rutile, pyrochlore, and perovskite phase compounds, many of which contain ruthenium. Examples include $RuO_2$, $Pb_2Ru_2O_{7-x}$ (where x is 0 to 1), $SrRuO_3$. Other metallic oxides which behave similarly to these ruthenates may be used. Substitutions for Ru can include Ir, Rh or Os. La and Ta compounds can also be used. Other resistive phases include materials such as carbon, zinc oxide, indium oxide, ITO and conductive glasses. The resistivity of certain of these materials is listed in Table 5.

TABLE 5

Resistivity of Various Resistive Materials

| Structure | Oxide | Resistivity at 300 K. (μΩ-cm) |
|---|---|---|
| Rutile | $RuO_2$ | 35 |
| | $IrO_2$ | 49 |
| | $Rh_2O_3$ | <100 |
| Pyrochlore | $BiRu_2O_7$ | 23,000 |
| | $Bi_2Rh_2O_{6.8}$ | 3200 |
| | $Bi_2Ir_2O_7$ | 1500 |
| | $PbRu_2O_6$ | 20,000 |
| | $Pb_2Ru_2O_{6.5}$ | 500 |
| | $PbRh_2O_7$ | 600,000 |
| | $Pb_2IrO_{6.5}$ | 150 |
| | $Pb_2Os_2O_7$ | 400 |
| | $Ti_2Ru_2O_7$ | 15,000 |
| | $TiIr_2O_7$ | 1500 |
| | $Ti_2Rh_2O_7$ | 600 |
| | $Ti_2Os_2O_7$ | 180 |
| Perovskite | $LaRuO_3$ | 4500 |
| | $La_{0.5}Sr_{0.5}RuO_3$ | 5600 |
| | $CaRuO_3$ | 3700 |
| | $SrRuO_3$ | 2000 |
| | $BaRuO_3$ | 1800 |

Insulative phases of the resistor may be formed from many types of glass materials including, but not limited to, lead borosilicate glass compositions.

The present invention is also directed to novel combinations of molecular precursors that can be converted to a useful resistor at lower reaction temperatures than by using individual precursors. In one embodiment, a mixture of metal oxide precursors is dissolved in an aqueous solution to form an amorphous lead zinc aluminum borosilicate glass with a ruthenate constituent at 300° C. This composition includes ruthenium nitrosyl nitrate precursor plus lead acetate precursor to form a lead ruthenate conductive phase, with lead acetate, aluminum nitrate, boric acid, zinc acetate and fumed silica nanoparticles forming the glass phase. A preferred combination for an organic based precursor composition includes ruthenium ethylhexanoate with other metal ethylhexanoates for lead, aluminum, zinc, boron and some silica nanoparticles or silane precursor in a solvent such as N,N-dimethylacetamide (DMAc) or tetrahydrofuran (THF), discussed in more detail below. Precursors for insulative matrix phases include organosilanes and sol-gel type materials as precursors to silica. An insulative matrix can also be derived from polymer precursors such as polyamic acid. Other polymer matrix phases include a wide variety of polymer resins.

The resistor precursor compositions can include various molecular precursors. The precursors can include molecules that can be converted to metals, metal oxides, glasses, polymers and combinations thereof. Low-ohm resistors typically include a conductive phase such as silver metal with controlled amounts of an insulative phase such as a glass or metal oxide. Typically, the low-ohm resistors include at least 50 volume percent of an insulative phase. High-ohm resistors typically include a resistive oxide phase (e.g., a ruthenate compound) with controlled amounts of an insulative phase. The resistor precursor compositions of the present invention can therefore include molecular metal precursors to metallic conductive phases (discussed above) and molecular precursors to insulative phases.

Depending on their nature, the molecular metal precursors to the metal oxide resistive and/or insulative phases can react in the following ways:

Hydrolysis/Condensation:

$$M(OR)_n + H_2O \rightarrow [MO_x(OR)_{n-x}] + MO_y$$

Anhydride Elimination:

$$M(OAc)_n \rightarrow [MO_{x/2}(OAc)_{n-x}] + x/2 Ac_2O \rightarrow MO_y + n\text{-}x\ Ac_2O$$

Ether Elimination:

$$M(OR)_n \rightarrow [MO_x(OR)_{n-x}] + R_2O \rightarrow MO_y + n\text{-}xR_2O$$

Ketone Elimination:

$$M(OOCR)(R') \rightarrow MO_y + R'RCO$$

Ester Elimination:

$$M(OR)_n + M'(OAc)_n \rightarrow [MM'O_x(OAc)_{n-x}(OR)_{n-x}] + ROAc$$

$$[MM'O_x(OAc)_{n-x}(OR)_{n-x}] \rightarrow MM'O_y + n\text{-}x\ ROAc$$

Alochol-induced Ester Elimination:

$$M(OAc)_n + HOR \rightarrow [MO_x(OAc)_{n-x}] \rightarrow Mo_y$$

Small Molecule-induced Oxidation:

$$M(OOCR) + Me_3NO \rightarrow Mo_y + Me_3N + CO_2$$

Alocohol-induced ester elimination:

$$MO_2CR + HOR \rightarrow MOH + RCO_2R(\text{ester})$$

$$MOH \rightarrow MO_2$$

Ester elimination:

$$MO_2CR + MOR \rightarrow MOM + RCO_2R(\text{ester})$$

Condensation Polymeration $$MOR + H_2O \rightarrow (M_aO_b)OH + HOR$$

$$(M_aO_b)OH + (M_aO_b)OH \rightarrow [(M_aO_b)O\ (M_aO_b)O]$$

A particularly preferred approach is ester elimination.

Preferred precursors to metallic conductive phases in resistor precursor compositions are discussed above and include metal alkoxides, carboxylates and acetylacetonates and others.

Ruthenates are typically used as a resistive phase in resistors for their temperature stability over a useful range of temperatures. Particularly preferred ruthenate precursors are ruthenium compounds such as Ru-nitrosylnitrate, Ru-ethylhexanoate and other ruthenium resinate materials. Other preferred combinations of precursors are any of the ruthenium precursors compounds with: lead precursors such as Pb-acetate, Pb-nitrate or Pb-ethylhexanoate; bismuth precursors such as Bi-nitrate, Bi-carboxylates or Bi-beta-diketonates; and strontium precursors such as Sr-nitrate or Sr-carboxylates.

Other precursors to resistive non-ruthenate materials can be used such as precursors to $IrO_2$, $SnO_2$, $In_2O_3$, $LaB_6$, $TiSi_2$ or TaN.

Precursors to insulative phases include precursors to PbO, $B_2O_3$, $SiO_2$ and $Al_2O_3$. Such insulative phase precursors can include boric acid, Si-alkoxides such as silicon methoxide and silicon ethoxide, Al-nitrate, Al-ethylhexanoate or other Al-carboxylates. Other insulative phase molecular precursors include organic titanates such as titanium bis(ammonium lactato) dihydroxide; mixed alkoxo titanium carboxylates such as dimethoxy titanium bis(neodecanoate) or dibutoxy titanium bis(neodecanoate). The ratio of the insulative phase to the conductive phase can be adjusted to obtain a resistor having the desired properties.

For dielectric materials, the formation of carbon during the conversion of a metal-organic precursor compound should be avoided because it will lead to a high degree of dielectric loss. Further, many high-k dielectric compositions contain barium. When processed in air, barium precursors are susceptible to formation of barium carbonate and once barium carbonate is formed, it cannot be converted to an oxide below 1000° C. Therefore, barium carbonate formation should be avoided. It is also known that hydroxyl groups are an important source of loss in dielectric metal oxides and the condensation reactions to convert metal hydroxides to metal oxides are not complete until 800° C. (for isolated surface hydroxyl groups). The present invention includes the use of molecular precursors for dielectric precursor compositions that avoid hydrolytic-based chemistry such as sol-gel-based hydrolysis and condensation routes.

For dielectric features with low dielectric loss and high dielectric constant, the incorporation or porosity is detrimental to the performance of these features as a result of the high internal surface area and the contribution of the dielectric properties of the material trapped inside the pores, especially if the material is air. Therefore, porosity should be reduced to a minimum.

The metal oxide phases that lead to the desired dielectric properties require that the material be highly crystalline. These metal oxides do not crystallize until a high temperature and so a strategy that relies on a low precursor composition that only contains precursor to the final phase will have both a low ceramic yield and a poor crystallinity. Conversely, a strategy relying on only particulate material will likely provide high porosity if processed below 300° C.

The present invention includes dielectric precursor compositions that address these issues and are processable at low temperatures to form high performance dielectric features. The compositions can include a large volume and mass fraction of a highly crystalline, high performance dielectric powder such as $BaTiO_3$ or $BaNd_2Ti_5O_{14}$ that has the desired dielectric constant, has a low temperature coefficient and has a low dielectric loss. The precursor composition can include a smaller fraction of a molecular precursor to the same or another material, preferably having the following characteristics:

Avoid the intermediate formation of hydroxyl groups;
Have ligands that are designed to react preferentially in a way to give a single-phase complex stoichiometry product rather than a mixture of a number of different crystalline phases;
Can be processed to form a crystalline phase at low temperatures;
Have high ceramic yield;
Which result in a good dielectric constant, low loss and small temperature coefficient contribution.

An example of such a target phase is $TiO_2$ or $Zr_{0.40}Sn_{0.66}Ti_{0.94}O_2$.

One embodiment of the present invention utilizes novel combinations of molecular precursors that provide lower reaction temperatures than can be obtained through individual precursors. The precursor compositions can include molecular precursors that can be converted to metals, metal oxides, glasses, polymers and combinations thereof. The dielectric precursor compositions of the present invention can include novel combinations of precursors that provide lower reaction temperatures to form dielectric features than can be obtained through the use of individual precursors. An example of one such combination is Sn, Zr, and Ti oxide precursors.

Depending on their nature, the molecular precursors to a dielectric phase can react in the following ways:

Hydrolysis/Condensation:

$$M(OR)_n + H_2O \rightarrow [MO_x(OR)_{n-x}] + MO_y$$

Anhydride Elimination:

$$M(OAc)_n \rightarrow [MO_{x/2}(OAc)_{n-x}] + x/2 Ac_2O \rightarrow MO_y + n-x Ac_2O$$

Ether Elimination:

$$M(OR)_n \rightarrow [MO_x(OR)_{n-x}] + R_2O \rightarrow MO_y + n-x R_2O$$

Ketone Elimination:

$$M(OOCR)(R') \rightarrow MO_y \rightarrow R'RCO$$

Ester Elimination:

$$M(OR)_n + M'(OAc)_n \rightarrow [MM'O_x(OAc)_{n-x}(OR)_{n-x}] + ROAc$$

$$[MM'O_x(OAc)_{n-x}(OR)_{n-x}] \rightarrow MM'O_y + n-x\, ROAc$$

Alochol-induced Ester Elimination:

$$M(OAc)_n + HOR \rightarrow [MO_x(OAc)_{n-x}] \rightarrow Mo_y$$

Small Molecule-induced Oxidation:

$$M(OOCR) + Me_3NO \rightarrow Mo_y + Me_3N + CO_2$$

Alocohol-induced ester elimination:

$$MO_2CR + HOR \rightarrow MOH + RCO_2R(\text{ester})$$

$$MOH \rightarrow MO_2$$

Ester elimination:

$$MO_2CR + MOR \rightarrow MOM + RCO_2R(\text{ester})$$

Condensation Polymerization:

$$MOR + H_2O \rightarrow (M_aO_b)OH + HOR$$

$$(M_aO_b)OH + (M_aO_b)OH \rightarrow [(M_aO_b)O(M_aO_b)O]$$

A particularly preferred approach is ester elimination, including a sol-gel process utilizing alcohol ester elimination. One preferred combination of precursors to a high-k dielectric phase is Sn-ethylhexanoate, Zr-ethylhexanoate and dimethoxy titanium neodecanoate. These precursors and other ethylhexanoate precursors can be advantageously used in an organic based precursor formulation. In this case, the presence of metal alkoxides precludes the use of water. The nature and the ratio of the ligands used in these precursors are critical to achieve a low conversion temperature. Generally, small ligands that can escape cleanly without leaving carbon residue during conversion are preferred. For example, this can be achieved by formation of ethers from alkoxide ligands or by formation of anhydrides from carboxylates. Another preferred combination is the use of a mixed ligand system such as a carboxylate and an alkoxide that can be bound to either the same or different metal centers. Upon conversion, the metal oxygen bonds are broken and small molecules are eliminated. A carboxylate to alkoxide ratio of about 1:1 is particularly preferred because of the formation of organic esters at lower temperatures.

In accordance with the foregoing, useful molecular precursors for dielectric precursor compositions (where metal=Sn, Zr, Ti, Ba, Ca, Nd, Sr, Pb, Mg) include:

1) Metal alkoxides such as Sn-ethoxide, Zr-propoxide, Pb-butoxide, Pb-isopropoxide and Sn-neodecanoate;

2) Metal carboxylates, such as metal fluorocarboxylates, metal chlorocarboxylates, metal hydroxocarboxylates. Specific examples include Ba-acetate, Sn-ethylhexanoate, and Pb-carboxylates such as Pb-acetate, Pb-trifluoroacetate and Pb-ethylhexanoate.

3) Metal betadiketonates. Examples include Pb-betadiketonates such as Pb-acetylacetonate and Pb-hexafluoroacetylacetonate.

4) Mixed alkoxo metal carboxylates (where metal Sn, Zr, Ti, Ba, Ca, Nd, Sr, Pb, Mg) are also useful. An example is dimethoxy titanium neodecanoate. Dialkoxo titanium dicarboxylate precursors in the dielectric precursor compositions can also serve as an adhesion promoter.

Preferred insulative phase molecular precursors include organic titanates such as titanium bis(ammonium lactato) dihydroxide; mixed alkoxo titanium carboxylates such as dimethoxy titanium bis(neodecanoate) or dibutoxy titanium bis(neodecanoate); silicon alkoxides such as silicon methoxide and silicon ethoxide. Preferred dielectric phase precursors include metal alkoxides, carboxylates and beta-diketonates to form the mixed metal oxide as listed above.

The precursor compositions according to the present invention preferably also include a solvent capable of solubilizing the molecular precursor discussed above. The solvent can be water, thereby forming an aqueous-based precursor composition. Water is more environmentally acceptable than organic solvents. However, water cannot typically be used for deposition of the precursor composition onto hydrophobic substrates, such as tetrafluoroethylene fluorocarbon substrates (e.g. TEFLON, E.I. duPont deNemours, Wilimingon, Del.) without modification of the substrate or the composition.

The solvent can also be an organic solvent, by itself or in addition to water. The selected solvent should be capable of solubilizing the selected molecular precursor to a high level. A low solubility of the molecular precursor in the solvent can lead to low yields of the solid material, thin deposits and porous layers. The precursor compositions of the present invention can exploit combinations of solvents and precursors that advantageously provide high solubility of the molecular precursor while still allowing low temperature conversion of the precursor to the desired phase.

According to one embodiment of the present invention, the solubility of the molecular precursor in the solvent is preferably at least about 20 weight percent molecular precursor, more preferably at least about 40 weight percent molecular precursor, even more preferably at least about 50 weight percent molecular precursor and most preferably at least about 60 weight percent molecular precursor. Such high levels of molecular precursor lead to increased yield of the desired phase and the ability to deposit features having adequate thickness.

The solvents can be polar or non-polar. Solvents that are useful according to the present invention include amines, amides, alcohols, water, ketones, unsaturated hydrocarbons, saturated hydrocarbons, mineral acids organic acids and bases, Preferred solvents include alcohols, amines, amides, water, ketone, ether, aldehydes and alkenes. Particularly preferred organic solvents according to the present invention include N,N,-dimethylacetamide (DMAc), diethyleneglycol butylether (DEGBE), ethanolamine and N-methylpyrrolidone.

In some cases, the solvent can be a high melting point solvent, such as one having a melting point of at least about 30° C. and not greater than about 100° C. In this embodiment, the precursor composition can be heated during deposition to create a flowable state, whereby the solvent solidifies upon contacting the substrate. Subsequent processing can then remove the solvent by other means and then convert the material to the final product, thereby retaining resolution. Preferred solvents according to this embodiment are waxes, high molecular weight fatty acids, alcohols acetone, N-methyl-2-pyrrolidone, toluene, tetrahydrofuran (THF) and the like. Alternatively, the precursor composition may be a liquid at room temperature, wherein the substrate is kept at a lower temperature below the freezing point of the composition.

The solvent can also be a low melting point solvent. A low melting point is required when the precursor composition must remain viscous on the substrate until dried. A preferred low melting point solvent according to this embodiment is DMAc, which has a melting point of about −20° C.

In addition, the solvent can also be a low vapor pressure solvent. A lower vapor pressure advantageously prolongs the work life of the precursor composition in cases where evaporation leads to problems such as clogging. A preferred solvent according to this embodiment is terpineol. Other low vapor pressure solvents include diethylene glycol, ethylene glycol, hexylene glycol, N-methyl-2-pyrrolidone, and tri(ethylene glycol) dimethyl ether.

The solvent can also be a high vapor pressure solvent, such as one having a vapor pressure of at least about 1 kPa. A high vapor pressure allows rapid removal of the solvent by drying. High vapor pressure solvents include acetone, tetrahydrofuran, toluene, xylene, ethanol, methanol, 2-butanone and water.

The solvent can also be a monomer that converts to a polymer when exposed to ultraviolet radiation, such as immediately after deposition onto the substrate.

The precursor compositions according to the present invention can also include a vehicle. As is discussed above, a vehicle is a flowable medium that facilitates the deposition of the precursor composition. In cases where the liquid serves only to carry particles and not to dissolve molecular species, the terminology of vehicle is often used for the liquid. However, in many precursor compositions, the solvent can also be considered the vehicle. A metal, such as silver, can be bound to the vehicle, for example, by synthesizing a silver derivative of terpineol that simultaneously acts as both a precursor to silver and as a vehicle. This improves the metallic yield and reduces the porosity of the electronic feature.

Examples of preferred vehicles are listed in Table 6. Particularly preferred vehicles according to the present invention include alpha terpineol, toluene and ethylene glycol.

TABLE 6

Organic Vehicles Useful in Precursor Compositions

| Formula/Class | Name |
| --- | --- |
| Alcohols | 2-Octanol |
|  | Benzyl alcohol |
|  | 4-hydroxy-3methoxy benzaldehyde |
|  | Isodeconol |
|  | Butylcarbitol |
| Terpene alcohol | Alpha terpineol |
|  | Beta-terpineol |
|  | Cineol |
| Esters | 2,2,4 trimethylpentanediol-1,3 monoisobutyrate |
|  | Butyl carbitol acetate |
|  | Butyl oxalate |
|  | Dibutyl phthalate |
|  | Dibutyl benzoate |
|  | Butyl cellosolve acetate |
|  | Ethylene glycol diacetate |
|  | N-methyl-2-pyrolidone |

TABLE 6-continued

Organic Vehicles Useful in Precursor Compositions

| Formula/Class | Name |
| --- | --- |
| Amides | N,N-dimethyl formamide |
|  | N,N-dimethyl acetamide |
| Aromatics | Xylenes |
|  | Aromasol |
| Substituted aromatics | Nitrobenzene |
|  | o-nitrotoluene |
| Terpenes | Alpha-pinene, beta-pinene, dipentene, dipentene oxide |
| Essential Oils | Rosemary, lavender, fennel, sassafras, wintergreen, anise oils, camphor, turpentine |

The precursor compositions in accordance with the present invention can also include one or more polymers. The polymers can be thermoplastic polymers or thermoset polymers. Thermoplastic polymers are characterized by being fully polymerized. They do not take part in any reactions to further polymerize or cross-link to form a final product. Typically, such thermoplastic polymers are melt-cast, injection molded or dissolved in a solvent. Examples include polyimide films, ABS plastics (acronitrile butadiene styrene), vinyl, acrylic, styrene polymers of medium or high molecular weight, and the like. When polymers are included in the precursor compositions, the polymer preferably constitutes not greater than about 35 volume percent, more preferably not greater than about 20 volume percent, of the volume of the final feature after drying and processing of the precursor composition into a feature. It will be appreciated that this type of formulation is substantially different from what is known in the art as polymer thick film. The formulations of the present invention typically contain molecular precursors and particles, or at least one thereof. In contrast, polymer thick film formulations do not contain any molecular precursors to a metal or metal oxide, nor do polymer thick film formulations typically contain particles of a metal, metal oxide or precursor thereof.

The polymers can also be thermoset polymers, which are characterized by not being fully polymerized or cured. The components that make up thermoset polymers must undergo further reactions to form fully polymerized, cross-linked or dense final products. Thermoset polymers tend to be resistant to solvents, heat, moisture and light.

A typical thermoset polymer mixture initially includes a monomer, resin or low molecular weight polymer. These components require heat, hardeners, light or a combination of the three to fully polymerize. Hardeners can be used to speed the polymerization reactions. Some thermoset polymer systems are two-part epoxies that are mixed at consumption or are mixed, stored and used as needed.

Specific examples of thermoset polymers include amine or amide-based epoxies such as diethylenetriamine, polyglycoldianine and triethylenetetramine. Other examples include imidazole, aromatic epoxies, brominated epoxies, thermoset PET, phenolic resins such as bisphenol-A, polymide, acrylics, urethanes, and silicones. Hardeners can include isophoronediamine and meta-phenylenediamene.

The polymer can also be an ultraviolet or other light-curable polymer. The polymers in this category are typically UV and light-curable materials that require photoinitiators to initiate the cure. Light energy is absorbed by the photoinitiators in the formulation causing them to fragment into reactive species, which can polymerize or cross-link with other components in the formulation. In acrylate-based adhesives, the reactive species formed in the initiation step are known as free radicals. Another type of photoinitiator, a cationic salt, is used to polymerize epoxy functional resins generating an acid which reacts to create the cure. Examples of these polymers include cyanoacrylates such as z-cyanoacrylic acid methyl ester with an initiator as well as typical epoxy resin with a cationic salt.

The polymers can also be conductive polymers such as intrinsically conductive polymers. Conductive polymers are disclosed, for example, in U.S. Pat. No. 4,959,430 by Jonas et al., which is incorporated herein by reference in its entirety. Other examples of intrinsically conductive polymers are listed in Table 7 below.

TABLE 7

Intrinsically Conductive Polymers

| Examples | Class/Monomers | Catalyst/Dopant |
|---|---|---|
| Polyacetylene | | |
| Poly[bis(benzylthio) acetylene] | Phyenyl vinyl sulfoxide | Ti alkylidene |
| Poly[bis(ethylthio)acetylene] | 1,3,5,7- | |
| Poly[bis(methylthio)acetylene] | Cyclooctatetraene | |
| Polyaniline | | |
| Fully reduced | | organic sulfonic acids such as: |
| Half oxidized | | Dinonyl-naphthalene-disulfonic acid |
| | | Dinonylnaphtha-leneusulfonic acid |
| | | Dodecylbenzene-sulfonic acid |
| Poly(anilinesulfonic acid) | | |
| Self-doped state | | |
| Polypyrrole | | |
| | | Organic sulfonic acid |
| Polythiophene | | |
| Poly(thiophine-2.5-diyl) | 2,5-Dibromo-3-alkyl/ arylthiophene | |
| Poly(3-alkylthiophene-2.5-diyl) | | |
| alkyl = butyl, hexyl, octyl, decyl, dodecyl | alkyl = butyl, hexyl, octyl, decyl, dodecyl | |
| Poly(styrenesulfonate)/poly-(2,3-dihydrothieno-[3,4-b]-1,4-dioxin) | aryl = phenyl Dibromobi-thiophene Terthiophene Other substituted thiophenes | |
| Poly(1,4-phenylenevinylene) (PPV) | | |
| | p-Xylylenebis (tetrahydrothio-phenium-chloride)) | |
| Poly(1,4-phenylene sulfide) | | |
| Poly(fluroenyleneethynylene) | | |

Other additives can be included in the precursor compositions in accordance with the present invention. Among these are reducing agents to prevent the undesirable oxidation of metal species. Reducing agents are materials that are oxidized, thereby causing the reduction of another substance. The reducing agent loses one or more electrons and is referred to as having been oxidized. For example, copper and nickel metal have a strong tendency to oxidize. Precursor compositions adapted to form base metals, including nickel or copper, according to the present invention can include reducing agents as additives to provide reaction conditions for the formation of the metal at the desired temperature rather than the metal oxide. Reducing agents are particularly applicable when using molecular precursor compounds where the ligand is not reducing by itself. Examples of reducing agents include amino alcohols and formic acid. Alternatively, the precursor conversion process can take place under a reducing atmosphere, such as hydrogen or forming gas.

In some cases, the addition of reducing agents results in the formation of the metal even under ambient conditions. The reducing agent can be part of the precursor itself, for example in the case of certain ligands. An example is Cu-formate where the precursor forms copper metal even in ambient air at low temperatures. In addition, the Cu-formate precursor is highly soluble in water, results in a relatively high metallic yield and forms only gaseous byproducts, which are reducing in nature and protect the in-situ formed copper from oxidation. Cu-formate is therefore a preferred precursor for aqueous based precursor compositions that include copper. Other examples of molecular precursors containing a ligand that is a reducing agent are Ni-acetylacetonate and Ni-formate.

The precursor compositions can also include an adhesion promoter adapted to improve the adhesion of the electronic feature to the underlying substrate. For example, polyamic acid can improve the adhesion of the precursor composition to a polymer substrate, such as a polyimide substrate.

The precursor compositions can also include complexing agents. Complexing agents are a molecule or species that binds to a metal atom and isolates the metal atom from solution. Complexing agents are adapted to increase the solubility of the molecular precursors in the solvent, resulting in a higher yield of metal. One preferred complexing agent, particularly for use with Cu-formate and Ni-formate, is 3-amino-1-proponal. For example, a preferred precursor solution for the formation of copper includes Cu-formate dissolved in water and 3-amino-1-propanol.

The precursor compositions according to the present invention can also include a binder to maintain the feature shape after deposition and to increase the viscosity of the precursor composition. The binder can be, for example, a polymer or in some cases can be a precursor. When the precursor composition is deposited onto a flexible substrate, the binder should impart some flexibility to the precursor composition or final product in addition to adherence. In some instances, the binder can melt or soften to permit deposition of the precursor composition. According to one embodiment, the binder is a solid at room temperature and when heated to greater than about 50° C., the binder melts and flows allowing for ease of transfer and good wetting of the substrate. Upon cooling to room temperature, the binder becomes solid again maintaining the shape of the feature.

The binder may need to vaporize during final processing. The binder may also dissolve during deposition. The binder is preferably stable at room temperature and does not degrade substantially over time.

Preferred binders for use in the precursor compositions according to the present invention include waxes, styrenic polymers, polyalkylene carbonates, polyvinyl acetals, cellulose-based materials, tetradecanol, trimethylolpropane and tetramethylbenzene. The preferred binders have good solubility in the solvent used to formulate the precursor composition and should be processable in the melt form. For example, styrene allyl alcohol is soluble in dimethyleacetimide, solid at room temperature and becomes fluid-like upon heating to 80° C.

Examples of preferred binders are listed in Table 8.

TABLE 8

Useful Binders for High Viscosity Precursor Compositions

| Class | Examples |
| --- | --- |
| Styrenic | styrene allyl alcohol |
| | polystyrene (PS) |
| | poly alpha methyl styrene (PAMS) |
| | polystyrene-co-maleic anhydride (SMA) |
| Polycarbonates | Polycarbonate |
| | poly propylene carbonate |
| | poly ethylene carbonate |
| Carbohydrates | polysaccharides |
| | sucrose octahydrate |
| | sucrose diacetate |
| Cellulose | methyl cellulose |
| | ethyl cellulose |
| | nitro cellulose |
| Sulfides | phenylsulfone |
| Benzenes | benzophenone |

In many cases, the binders should decompose cleanly leaving little or no residuals after processing. Decomposition of the binder can occur by vaporization, sublimation or combustion.

The present invention also provides compositions and methods to increase adhesion of the deposited electronic material to the substrate. Various substrates have different surface characteristics that result in varying degrees of adhesion. The surface can be modified by hydroxylating or functionalizing the surface to provide reaction sites from the precursor compositions. In one embodiment, the surface of a polyfluorinated material is modified by a sodium naphthalenide solution that provides reactive sites for bonding during reaction with the precursor. In another embodiment, a thin layer of metal is sputtered onto the surface to provide better adhesion of precursor or converted precursor to the substrate. In another embodiment, polyamic acid is added to the precursor composition that then bonds with both the deposited material and surface to provide adhesion. Preferred amounts of polyamic acid or similar compounds are from about 5 to 10 weight percent of the precursor composition.

The precursor composition of the present invention typically also includes surfactants or dispersants. Dispersants are added to improve particle dispersion in the vehicle or solvent and reduce inter-particulate attraction within that dispersion. Dispersants are typically two-component structures, namely a polymeric chain and an anchoring group. The anchoring group will lock itself to the particle surface while the polymeric chain prevents agglomeration. It is the particular combination of these which leads to their effectiveness. The molecular weight of the dispersant is sufficient to provide polymer chains of optimum length to overcome Van der Waals forces of attraction between particles. If the chains are too short, then they will not provide a sufficiently thick barrier to prevent flocculation, which in turn leads to an increase in viscosity. There is generally an optimum chain length over and above which the effectiveness of the stabilizing material ceases to increase. Ideally, the chains should be free to move in the dispersing medium. To achieve this, chains with anchor groups at one end only have been the most effective in providing steric stabilization. An example of a dispersant is SOLSPERSE 21000 (Avecia Limited).

For the precursor compositions of the present invention, surfactants should be selected to be compatible with the other components of the precursor composition, particularly the molecular precursors. In one embodiment of the present invention, surfactants can serve multiple functions such as a dispersant and a molecular precursor to a conductive phase. Another example of a surfactant that is used with silver flakes is a coupling agent such as Kenrich Titanate, for example as is disclosed in U.S. Pat. No. 4,122,062 by Monte et al., which is incorporated herein by reference in its entirety.

The precursor compositions of the present invention can also include rheology modifiers such as additives that have a thickening effect on the liquid vehicle. The advantageous effects of these additives include improved particle dispersion, reduced settling of particles, and reduction or elimination of filter pressing during syringe dispensing or screen-printing. Rheology modifiers can include SOLTHIX 250 (Avecia Limited), styrene allyl alcohol, ethyl cellulose, carboxy methylcellulose, nitrocellulose, polyalkylene carbonates, ethyl nitrocellulose, and the like.

One difficulty that can arise with respect to the precursor compositions of the present invention is that during drying, the molecular precursors can crystallize and form large crystallites, which can be detrimental to performance of the converted material. This problem can be reduced or eliminated by adding small amounts of a crystallization-inhibiting agent to the precursor composition. It has been found, for example, that in some silver precursor solutions small additions of lactic acid completely prevent crystallization. In other cases, such as aqueous Cu-formate compositions, small amounts of glycerol can inhibit crystallization. Other compounds useful for inhibiting crystallization are lactic acid, other polyalcohols such as malto dextrin, sodium carboxymethylcellulose and polyoxyethylenephenylether such as TRITON (Mallinckadt Baker, Phillipsburg, N.J.) or IGEPAL (Rhone-Poulenc, Cranbury, N.J.). In general, solvents with a higher melting point and lower vapor pressure inhibit crystallization of a compound more than a lower melting point solvent with a higher vapor pressure. Preferably, not greater than about 10 wt. % crystallization inhibitor (as a percentage of the total precursor solution) is added to a precursor solution, more preferably not greater than 5 wt. % and even more preferably not greater than 2 wt. %.

According to certain embodiments of the present invention, the precursor composition can be selected to reduce the conversion temperature required to convert the molecular precursor compound to the desired phase in the electronic feature. The precursor compound converts at a low temperature by itself or in combination with other precursors and provides for a high yield of the desired material. As used herein, the conversion temperature is the temperature at which the metal species contained in the precursor composition, including the molecular precursor, is at least 95 percent converted to the final pure metal or metal oxide. The conversion temperature is measured using a thermogravimetric analysis (TGA) technique wherein a 50-milligram sample is heated at a rate of 10° C./minute in air and the weight loss is measured.

A preferred approach for reducing the conversion temperature according to the present invention is to bring the molecular metal precursor compound into contact with a conversion reaction inducing agent. As used herein, a conversion reaction inducing agent is a chemical compound that effectively reduces the temperature at which the molecular precursor compound decomposes to the metal or metal oxide. The conversion reaction inducing agent can either be added into the original precursor composition or added in a separate step during conversion on the substrate. The former method is preferred. Preferably, the conversion temperature of the precursor compound can be lowered by at least about 25° C., more preferably at least about 50° C., even more preferably about 100° C., as compared to the conversion of the dry precursor compound.

The reaction inducing agent can be the solvent or vehicle that is used for the precursor composition. For example, the addition of certain alcohols, can reduce the conversion temperature of the precursor composition.

Preferred alcohols for use as conversion reaction inducing agents according to certain embodiments of the present invention include terpineol and diethyleneglycol butylether (DEGBE). It will be appreciated that the alcohol can also be the vehicle, such as in the case of terpineol.

More generally, organic alcohols such as primary and secondary alcohols that can be oxidized to aldehydes or ketones, respectively, can advantageously be used as the conversion reaction inducing agent. Examples are 1-butanol, diethyleneglycol, DEGBE, octanol, and the like. The choice of the alcohol is determined by its inducing capability as well as its boiling point, viscosity and precursor solubilizing capability. It has been discovered that some tertiary alcohols can also lower the conversion temperature of some molecular precursors. For example, alpha-terpineol, which also serves as a vehicle, significantly lowers the conversion temperature of some precursor compounds. The boiling point of the conversion reaction inducing agents is preferably high enough to provide the preferred ratio of metal ions to inducing agent during conversion. It should also be low enough for the inducing agent to escape the deposit cleanly without unwanted side reactions such as decomposition that could lead to carbon residues in the final feature. The preferred ratio of precursor to inducing agent is stoichiometric for complete reduction. However, in some cases catalytic amounts of the inducing agent are sufficient.

Some solvents, such as DMAc, can serve as both a vehicle and a conversion reaction inducing agent. It can also be regarded as a complexing agent for silver. This means that precursors such as Ag-nitrate that are otherwise not very soluble in organic solvents can be brought into solution by complexing the metal ion with a complexing agent such as DMAc. In this specific case, Ag-nitrate can form a 1:1 adduct with DMAc which is soluble in organic solvents such as N-methylpyrrolidinone (NMP) or DMAc.

Another approach for reducing the conversion temperature of certain molecular precursors is utilizing a palladium compound as a conversion reaction inducing agent. According to this embodiment, a palladium molecular precursor is added to the precursor composition, which includes another precursor such as a silver precursor. With addition of various Pd compounds, the conversion temperature of the silver precursor can be advantageously reduced by at least 25° C. and more preferably by at least 50° C. Preferred palladium precursors according to this embodiment of the present invention include Pd-acetate, Pd-trifluoroacetate, Pd-neodecanoate and tetraamine palladium hydroxide.

Pd-acetate and Pd-trifluoroacetate are particularly preferred as conversion reaction inducing agents to reduce the conversion temperature of a silver metal carboxylate compound. Small additions of Pd-acetate to a precursor composition that includes Ag-trifluoroacetate in DMAc can reduce the conversion temperature by 80° C. or more. Preferred precursor solutions include Pd-acetate in an amount of at least about 1 weight percent, more preferably at least about 2 weight percent of the precursor solution. The upper range for this Pd conversion reaction inducing agent is limited by its solubility in the solvent and in one embodiment does not exceed about 10 weight percent. Most preferred is the use of Pd-trifluoroacetate because of its high solubility in organic solvents. For example, a preferred precursor composition for a silver/palladium alloy according to the present invention is Ag-trifluoroacetate and Pd-trifluoroacetate dissolved in DMAc and lactic acid.

A complete range of Ag/Pd alloys can be formed from Ag-trifluoroacetate/Pd-trifluoroacetate combinations in a solvent such as DMAc. The molecular mixing of the molecular metal precursors provides preferred conditions for the formation of virtually any Ag/Pd alloy at a low temperature. The conversion temperature of the silver precursor when dissolved in DMAc is preferably reduced by at least 80° C. when combined with Pd-trifluoroacetate. Pure Pd-trifluoroacetate dissolved in DMAc can be converted to pure Pd at a similar temperature. As is discussed above, similar conversion temperatures for the Ag and Pd precursor is advantageous since it provides the conditions for good molecular mixing and the formation of Ag/Pd alloys with a homogeneous distribution of Ag and Pd.

DMAc can advantageously serve as both a vehicle and a conversion reaction inducing agent. It can also be regarded as a complexing agent for silver. That is, precursors such as Ag-nitrate that are otherwise not very soluble in organic solvents can be brought into solution by complexing the metal ion with a complexing agent such as DMAc. In this specific case, Ag-nitrate can form a 1:1 adduct with DMAc which is soluble in organic solvents such as NMP or DMAc Other conversion reaction inducing agents that can also lower the conversion temperature for nickel and copper molecular precursors can be used such as amines (ammonia, ethylamine, propylamine), amides (DMAc, dimethylformamide, methylformamide, imidazole, pyridine), alcohols such as aminoalcohols (ethanol amine, diethanolamine and triethanolamine), aldehydes (formaldehyde, benzaldehyde, acetaldehyde); formic acid; thiols such as ethyl thioalcohol, phosphines such as trimethylphosphine or triethylphosphine and phosphides. Still other conversion reaction inducing agents can be selected from boranes and borohydrides such as borane-dimethylamine or borane-trimethylamine. Preferred conversion reaction inducing agents are alcohols and amides. Advantageously, DMAc can also serve as the solvent for the molecular precursor. Compared to precursor compositions that contain other solvents such as water, the precursor conversion temperature can be reduced by as much as 60° C. to 70° C. Also preferred is DEGBE, which can reduce the decomposition temperature of a silver precursor dissolved in a solvent such as water by as much as 125° C.

Another factor that has been found to influence the conversion temperature is the ratio of conductor precursor to conversion reaction inducing agent. It has been found that the addition of various amounts of DEGBE to a molecular silver precursor such as Ag-trifluoroacetate in DMAc reduces the precursor conversion temperature by up to about 70° C. Even more preferred is the addition of stoichiometric amounts of the inducing agent such as DEGBE. Excess amounts of the conversion reaction inducing agent are not preferred because it does not lower the conversion temperature any further. In addition, higher amounts of solvent or inducing agents lower the overall concentration of precursor in solution and can negate other precursor composition characteristics. The ratio of inducing agent to metal ion that is reduced to metal during conversion can be expressed as molar ratio of functional group (inducing part in the reducing agent) to metal ion. The ratio is preferably about 1, such as in the range from 1.5 to 0.5 and more preferably in range of about 1.25 to about 0.75 for univalent metal ion such as Ag. For divalent metal ions the ratio is preferably 2, such as in the range from 3 to 1, and for trivalent metals the ratio is preferably 3, such as in the range from 4.5 to 1.5.

The molecular precursor preferably provides as high a yield of metal or metal oxide as possible. A preferred ratio of molecular precursor to solvent is that corresponding to greater than 10% mass fraction of metal relative to the total weight of the liquid (i.e., all precursor components excluding particles). As an example, at least 10 grams of the metal is preferably contained in 100 grams of the precursor composition. More preferably, greater than 20 wt. % of the precursor composition is metal, even more preferably greater than 30 wt. %, even more preferably greater than 40 wt. % and most preferably greater than 50 wt. %.

Yet another preferred approach for reducing the conversion temperature is to catalyze the reactions using particles, particularly nanoparticles. Preferred particles that catalyze the reaction include pure Pd, Ag/Pd alloy particles and other alloys of Pd. Another approach for reducing the conversion temperature is to use gaseous reducing agents such as hydrogen or forming gas.

Yet another preferred approach for reducing the conversion temperature is ester elimination, either solvent assisted or without solvent assist. Solvent assist refers to a process wherein the alkoxide is converted to an oxide by eliminating an ester. In one embodiment, a metal carboxylate and metal alkoxide are mixed into the composition. At the processing temperature, the two precursors react and eliminate an organic ester to form a metal oxide that decomposes to the corresponding metal at a lower temperature than the precursors themselves. This is also useful for Ag and Au, where for Au the metal oxide formation is skipped.

Another preferred approach for reducing the conversion temperature is by photochemical reduction. For example, photochemical reduction of Ag can be achieved by using precursors containing silver bonds that can be broken photochemically. Another method is to induce photochemical reduction of silver on prepared surfaces where the surface catalyzes the photochemical reaction.

Another preferred approach for reducing the conversion temperature is by in-situ generation of a precursor by reaction of ligands with particles. For example, silver oxide can be used as a starting material and can be incorporated into high viscosity precursor compositions in the form of nanoparticles. The silver oxide can react with deprotonateable organic compounds to form the corresponding silver salts. For example, silver oxide can be mixed with a carboxylic acid to form silver carboxylate. Preferred carboxylic acids include acetic acid, neodecanoic acid and trifluoroacetic acid. Other carboxylic acids can work as well. For example, DARVAN C(R. T. Vanderbilt Company, Norwalk, Conn.) can be included in the precursor composition as a rheology modifier and the carboxylic function of this additive can react with the metal oxide. Small silver particles that are coated with a thin layer of silver oxide can also be reacted with these compounds. Another potential benefit is simultaneously gained with regard to rheology in that such a surface modification can lead to improved particle loadings in the precursor compositions. Another example is the reaction of copper oxide coated silver powder with carboxylic acids. This concept can be generally applied to other materials such as copper oxide, palladium oxide and nickel oxide particles as well. Other deprotonateable compounds are halogeno-, hydroxy- and other alkyl and aryl derivatives of carboxylic acids, beta diketones, and acidic alcohols such as phenol and hydrogen tetrafluoroborates.

As is discussed above, the precursor compositions according to the present invention can also include particles. Preferred physical characteristics of such particles are discussed above. The particles can be single phase particles or composite particles.

For resistor precursor compositions, the particles can be resistive, insulative or conductive particles, depending upon the desired properties of the resistor and the other constituents of the precursor composition. The particles can include, for example, metal particles, metal oxide particles, carbon particles and glass particles, as well as particles of a molecular precursor (e.g., silver oxide).

Conductive or resistive particles can include a metal or a metal compound such as a metal oxide, metal nitride, metal carbide, metal boride, metal oxycarbide, metal oxynitride, metal sulfide, metal oxysulfide, metal silicide or metal germamide. The conductive particles can also include carbon, such as graphitic carbon. Preferred conductive metal particles include silver, copper and nickel. Preferred resistive particles include ruthenium-based metal oxides, such as ruthenium oxide ($RuO_2$), strontium ruthenate (e.g., $SrRuO_3$), bismuth ruthenate (e.g., $Bi_xRu_yO_z$), lead ruthenate and other Ru-based mixed metal oxides. It is preferred that the conductive and/or resistive particles have a small particle size and the preferred average particle size is not greater than 5 µm, more preferably not greater than 2 µm, even more preferably not greater than 1 µm.

The resistor precursor composition can include conductive particles of a metal or metal alloy which exhibit good TCR characteristics with or without an insulative or resistive phase (e.g., $SiO_2$, $ZrO_2$, $Al_2O_3$, $TiO_2$, ZnO or $SnO_2$) that limits the connectivity and current carrying area of the resistor. For example, Ag/Pd alloys can be produced having a temperature coefficient of resistance (TCR) of less than 100 ppm/° C. It is also possible to produce alloys such as Ni/Cr and other common resistive alloys under the correct processing conditions, such as by using a forming gas during conversion of the precursor composition.

The resistor precursor compositions can also include particles of an insulative phase. The insulative phase can be, for example, an insulative metal compound such as a metal oxide, including a glass or a glass-ceramic.

According to one embodiment, the precursor compositions include glass particles. Glasses can be categorized as being either vitreous or devitrifying. A vitreous glass can be melted and solidified repeatedly without a significant change in the properties of the glass, similar to the way a thermoplastic polymer behaves. A devitrifying glass actually forms a crystalline glass-ceramic upon thermal treatment and in this fashion behaves like a thermoset polymer. After thermal processing, a devitrifying glass generally has higher mechanical strength than a vitreous glass as well as higher temperature stability. Devitrifying glasses require longer and often more controlled thermal processing to achieve their structure.

Preferred average particle sizes for the low melting glass particles are not greater than 1 µm, such as not greater than 0.5 µm. A bimodal or trimodal particle size distribution can advantageously be used to increase the packing density of the particles and increase the final density and uniformity of the structure. The preferred morphology for all particles is spherical in order to improve rheology and optimize particle loading in the precursor composition and the density of the processed resistor.

The glass particles can be insulative or resistive. The insulative glass can be, for example, silica or a lead-based glass, such as lead borosilicate or lead aluminum borosilicate. Preferred insulative glasses include borosilicate glasses, such as lead borosilicate or bismuth borosilicate. Preferred resistive glasses include silver-containing glasses such as silver iodide (AgI) doped silver phosphate ($AgPO_3$) glass. The glass particles are preferably low melting glasses, such as glasses having a melting point of not greater than about 500° C., more preferably not greater than about 400° C. and even more preferably not greater than about 300° C.

The dielectric precursor compositions according to the present invention can include a dielectric powder and/or an insulative powder. Preferred dielectric powders include $BaTiO_3$, lead magnesium niobate (PMN), lead zirconium titanate (PZT), doped barium titanate (BTO), barium neodymium titanate (BNT), lead tantalate ($Pb_2Ta_2O_7$), and other pyrochlore compounds. Preferred insulator powders include $TiO_2$, $SiO_2$, and insulating glasses.

One consideration when using precursor compositions containing dielectric particles that are formulated to be converted at a low temperature is that the dielectric particles must possess properties close to the final desired physical properties of the fully processed material. Optimization of the intrinsic properties of the particles is crucial because recrystallization and annealing of crystal defects during thermal processing is often not possible at processing temperatures of less than 500° C. Maximization of dielectric constant in the final material requires maximization of the dielectric constant of the powders because the composition is subjected to low temperatures for short times, which are insufficient to increase the crystallinity of the high-k powder during processing.

In one embodiment, the dielectric precursor composition includes dielectric powders with a dielectric constant (k) preferably greater than 500 and more preferably greater than 1000. The dielectric constant of the powder can be measured as follows: A pellet is pressed from the dry powder and calcined at 400° C. for one hour to drive off water. The pellet is then placed between metal electrodes and the capacitance is measured as a parallel plate capacitor, over the frequency range of 1 kHz to 1 MHz. Based on the geometry and packing density, the logarithmic rule of mixtures is applied, assuming the two phases present are the powder and air, and the dielectric constant of the powder alone is calculated.

In another embodiment, a precursor composition utilizes dielectric powders with dielectric constants greater than 2000. Such high dielectric constant can be obtained on a powder level in various ways. One way can be the use of spray pyrolysis, discussed above, which allows for the addition of dopant in each individual particle. Another way is the use of annealing of particle beds at elevated temperatures such as 900° C. to 1000° C. to improve particle composition and particle crystallinity followed by milling to break up any soft agglomerates formed during firing. A rotary calcine can be used to anneal and limit particle agglomeration.

In another embodiment, a precursor composition includes low loss dielectric particles having a dielectric loss of not greater than 1%, more preferably not greater than 0.1%, and most preferably not greater than 0.01%, over the frequency range of 1 kHz to 1 MHz. The dielectric loss can be measured as follows: A pellet is pressed from the dry powder and calcined at 400° C. to drive off surface water. Once the pellet has been dried, it is kept in a dry environment. The pellet is then placed between electrodes and the loss measured as a parallel plate capacitor over the frequency range of 1 kHz to 1 MHz.

Particularly preferred compositions for high dielectric constant powders are those having the perovskite structure. Examples include metal titanates, metal zirconates, metal niobates, and other mixed metal oxides. Particularly useful is the barium titanate system which can reach a broad range of dielectric performance characteristics by adding small levels of dopant ions. Preferred particles for high-k materials are lead magnesium niobate (PMN, $PbMg_{1/3}Nb_{2/3}O_3$), $PbTiO_3$ (PT), PMN-PT, $PbZrO_3$, $PbZr_xTi_{1-x}O$ (PZT), and doped $BaTiO_3$. Preferred particles for low loss applications are barium neodymium titanate (BNT, $BaNd_2Ti_5O_{14}$), zirconium tin titanate (ZST, $Ti_{0.94}Zr_{0.4}Sn_{0.66}O_4$), lead tantalate ($Pb_2Ta_2O_7$).

Particularly preferred compositions for low loss dielectric constant powders are $Zr_{0.7}Sn_{0.3}TiO_4$, $Zr_{0.4}Sn_{0.66}Ti_{0.94}O_4$, $CaZr_{0.98}Ti_{0.02}O_3$, $SrZr_{0.94}Ti_{0.06}O_3$, $BaNd_2Ti_5O_{14}$, $Pb_2Ta_2O_7$, and various other pyrochlores.

Preferred particles are either high dielectric constant or low loss, for example $BaTiO_3$, PZT, or PMN for high dielectric constants, or $BaNd_2Ti_5O_{14}$ or pyrochlores for low loss. A high degree of crystallinity within the particles is generally desired to maximize the dielectric performance.

The dielectric particles can also be exposed to a liquid surface modification agent, such as a silanating agent. The purpose of this treatment is to reduce or eliminate surface defects such as hydroxyl groups that induce dielectric loss and/or sensitivity to humidity in the final low-fired dielectric layer. The silanating agent can include an organosilane. For example, a surface-modifying agent can be exposed to the powder bed as a gas in a confined enclosure and be allowed to contact the powder bed at an elevated temperature, such as about 120° C., for about 10 to 15 minutes, completing the surface modification.

Useful organosilanes for this surface modification include: $R_nSiX_{(4-n)}$, where X is a hydrolysable leaving group such as an amine (e.g., hexamethyldisilazane), halide (e.g., dichlorodimethylsilane), alkoxide (e.g., trimethoxysilane, Methacryloxypropyltrimethoxysilane, N-methyl-3-aminopropyltrimethoxysilane), or acyloxy (e.g., acryloxytrimethylsilane).

Hydrolysis and condensation occur between organosilane and surface hydroxy groups on the dielectric layer surface. Hydrolysis occurs first with the formation of the corresponding silanol followed by condensation with hydroxo groups on the metal oxide surface. As an example:

$$R-(CH_2)_3Si(OMe)_3 + H_2O \rightarrow R-(CH_2)_3Si(OH)_2(OMe) + 2\ MeOH - (CH_2)_3Si(OH)_2(OMe) + (particle_{surf}Si)OH \rightarrow (particle_{surf}Si)-O-Si(OH)_2(CH_2)_3-R + H_2O$$

where 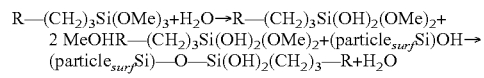

The dielectric precursor compositions according to the present invention can also include a particulate glass phase, as is discussed above with respect to resistor precursor compositions. Preferred glass compositions are low melting temperature glasses, such as borosilicate glasses doped with lead or bismuth. Preferred glass compositions are low melting glasses (e.g., sealing glasses) with a melting point of not greater than 500° C., more preferably not greater than 400° C., even more preferably not greater 300° C. Preferred low melting glass particles for high-k dielectric compositions have high dielectric constants, typically in the range from 10 to 40, more preferably higher than 40. Preferred low melting glass particles for high-k compositions also have low dielectric loss characteristics, preferably not greater than 2%, more preferably not greater than 1%, even more preferably not greater than 0.1%. The preferred average particle size of the low melting glass particles is on the order of the size of the dielectric particles, and more preferably is about one-half the size of the dielectric particles, and most preferably is about one quarter the size of the dielectric particles.

The resistor precursor compositions according to the present invention can include particles and/or precursors to conductive phases, resistive phases and insulative phases. The ratio of these phases will determine the resistive characteristics of the feature formed from the precursor composition.

For example, the resistor precursor composition can include a combination of conductive particles, such as nanoparticles, and molecular precursors, such as molecular precursors to a glass phase. The resistor composition can also include a combination of a ruthenate precursor and/or particles with a sol-gel precursor to a glass phase.

The resistor precursor composition can include one or more molecular precursors and a vehicle, with or without particles. The precursor composition can include precursor, vehicle, and polymer precursor. The precursor composition can include polymer, molecular precursor and a vehicle. The precursor composition can include glass and metal oxide particles, with or without a molecular precursor. The precursor composition can utilize a molecular precursor in a solvent as a vehicle for particles to increase ceramic yield.

The present invention also includes precursor compositions that include combinations of conductive metal and metal oxide particles in a matrix derived from a low melting glass. The present invention also includes combinations of insulating particles in a matrix of conductive metal derived from particles and a molecular precursor. The present invention also includes combinations of composite particles, or composite and single phase particles, or composite particles and a molecular precursor, or composite particles and single-phase particles and a molecular precursor in a matrix derived from a polymeric precursor or a resin.

The resistor precursor compositions can also include particles of a molecular precursor to a conductive phase and powders of an insulator. Preferred conductive and resistive phases include metals and metal ruthenates such as strontium, bismuth and lead ruthenate.

The precursor composition can include a precursor to a conductive phase and an insulative phase. The precursor composition can include a precursor to a conductive phase and insulating particles, or a precursor to an insulative phase with conductive particles, or a combination of several precursors and particles. The precursor composition can include small additions of TCR modifiers.

The resistor precursor compositions of the present invention can include a variety of material combinations. The resistor composition can be a composite. The composite can be metal-metal, metal-metal oxide, metal-polymer, metal oxide-polymer, metal-glass and other combinations. These precursor compositions have applications in the fabrication of surge resistors. The metal-oxide composition can include ruthenium-based mixed metal oxides and various glasses. The metal-polymer resistors can include metal derived from powder and/or precursors, and polymer. The metal can include silver, nickel, copper, and other metals.

The present invention can also utilize particles that result in an advantageous microstructure and promote uniformity of the structure with minimal processing time and temperature. Conductive particles for mid-ohm to high-ohm resistors are preferably sub-micron in size with a high surface area. Insulative matrix particles can be larger than the conductive phase, with a mean particle size from about 1 μm to 4 μm. This composition forms a microstructure where ruthenate particles are segregated at interfaces of glass particles and tend to form conductive chains of conductor particles separated by glass, which flows and wets the conductor particles. Nanoparticles may help dispersion of the conductive phase and lower processing temperature and time. The present invention includes the use of nanoparticles for a glass phase and ruthenate for a resistive phase to improve the overall uniformity of a precursor composition. Morphology of particles also plays an important role in the processing characteristics of the precursor composition. Spherical glass matrix particles with fairly low surface areas and mean particle size of about 1 μm allow higher loading and better rheological characteristics. In one embodiment of the present invention, glass particles of sub-micron size are used, resulting in better uniformity in the precursor composition. Spherical glass particles with a bimodal or trimodal size distribution are more desirable than a unimodal size distribution in terms of packing efficiency. It is important that the matrix particles have a low melting temperature, wet the conductor particles, have good TCR characteristics and good stability. An optimal resistor particle can include a composite particle having a microstructure that is already evolved after powder processing.

In one embodiment of the present invention, a resistor precursor composition includes a lead borosilicate glass or other low melting insulative glass, or a higher melting temperature glass in a composite particle with a segregated ruthenate phase, for example a particle incorporating separate phases of ruthenate and matrix glass. This composition allows tailoring of bulk properties such as resistivity, TCR, and tolerance in a single powder component. Such composite particles will have properties that are less dependent on processing temperature parameters. Composite particles will have an intrinsic microstructure similar to that of the developed microstructure of a thick film resistor, with phase-separated ruthenate regions in a dielectric matrix of glass with ruthenium and other ions diffused into dielectric regions. This can be accomplished by firing the resistor material in bulk and fritting the resultant material into a "resistor" powder. This allows resistivities indicative of volume loading of resistor and higher processing temperatures.

In another embodiment, selected precursors are combined in a spray pyrolysis process to produce a powder. In this embodiment of the present invention, the composite resistor particles are substantially spherical. This can solve problems related to shrinking feature size in screen printing, syringe dispensing and other methods. Ruthenate resistors can also be made with higher conductor loading but without the resultant roughness and porosity usually associated with use of non-spherical particles. The precursor compositions will also produce a much better heterogeneous mixture than current precursor compositions, resulting in better tolerance as deposited and improved trim characteristics.

Another advantage of using composite particles is that these particles have qualities that are more representative of the bulk properties. Processing will typically require less time at a lower temperature to realize the (diffusion induced) necessary properties while retaining a very robust, high performance resistor. Such a composition can be designed to be fired at 500° C. or less. In addition, a much more rapid thermal process could be employed such as an IR furnace or a laser.

In yet another embodiment of the present invention, composite particles are mixed with another resistor powder or with another glass powder to give desired properties at lower temperatures. In the case of using a higher temperature glass composition, a low melting glass or dopant material (e.g., PbO or BiO) can be used to bond the "resistor" particles at lower temperatures. Because the resistor particles should exhibit bulk properties by themselves, it is not necessary to achieve a totally dense structure to achieve certain resistance values. Therefore, resistor particles could be partially necked and infiltrated with a low melting glass, polymeric material, or a silanating agent to keep water and other environmental factors from changing the resistor. It is also possible to achieve improved characteristics with a high loading of composite resistor particles in a polymer matrix.

For low-ohm resistor compositions, preferred particle compositions include a conductive phase of silver, palladium, copper, gold, platinum, nickel, alloys thereof, composites thereof (2 or more separate phases) and core-shell structures thereof (coated particles). For low cost resistors, particle compositions can be selected from the group of copper, aluminum, tungsten, molybdenum, zinc, nickel, iron, tin, solder, and lead. Transparent particles can also be used as a resistive or conductive phase, for example particulates of ZnO, $TiO_2$, $In_2O_3$, indium-tin oxide (ITO) or antimony-tin oxide (ATO). Other particles such as titanium nitride, various forms of carbon such as graphite and amorphous carbon, and intrinsically conductive polymer particles can also be used as a resistive phase.

A mixture of a high melting point metal powder such as Cu and a low-melting point metal powder can be formulated into a precursor composition so that the low melting point powder melts and fills up the voids between the high melting point metal particles.

A preferred resistor precursor composition includes a molecular precursor to a metal ruthenate with a low melting glass powder in an organic carrier. The low melting glass powder is preferably spherical and is preferably bimodal in particle size distribution. Another preferred resistor precursor composition includes a molecular precursor to a ruthenate phase and a precursor to an insulative phase or a TCR modifier with low melting glass particles.

Another preferred resistor precursor composition includes metal or metal alloy particles of a resistive alloy (e.g., AgPd or NiCr) with a precursor or precursors to the metal or alloy in an aqueous or organic vehicle. The composition can also include an insulating powder component consisting of an insulating metal oxide or glass to limit the conductive area or modify the mechanical characteristics of the resistor.

Resistor precursor compositions can also include $RuO_2$ nanoparticles with a low-melting lead sealing glass along with an organic carrier of terpineol and fish oil dispersant. In one embodiment, compositions can be produced ranging from 10 to 30 vol. % $RuO_2$ powder, which can be processed at 500° C. for 30 minutes. Resistivity values up to 100 Ω-cm can be produced and TCR values of less than 300 ppm/° C. have been measured for this type of material system. Other systems for powder/powder include a variety of metal oxides with lead borosilicate powders (e.g., $SrRuO_3$/glass or $Pb_2Ru_2O_{6.5}$/glass) A preferred resistor precursor composition includes ruthenate nanoparticles with a low temperature glass of spherical morphology with a bimodal size distribution and mean particle size of 1 μm in an aqueous or organic vehicle.

A preferred resistor precursor composition includes a powder with a composite structure representative of a bulk resistor in an organic or aqueous vehicle.

Another preferred resistor precursor composition includes a powder with a composite structure representative of a bulk resistor without lead or bismuth in an organic or aqueous vehicle.

Another preferred composition includes a powder with composite structure representative of a bulk resistor with a low melting glass powder in an organic or aqueous vehicle.

Another preferred resistor precursor composition includes a powder with a composite structure representative of a bulk resistor, including a dopant to aid necking of the particles in an organic or aqueous vehicle.

Another preferred resistor precursor composition includes a powder with a composite structure representative of a bulk resistor with a molecular precursor to a low melting glass or dopant to aid necking of the particles in an organic or aqueous vehicle.

Another preferred resistor precursor composition includes a powder with a composite structure representative of a bulk resistor in a vehicle containing a precursor to a polymer matrix, such as polyimide or another resin.

In a preferred embodiment, the resistor precursor composition includes a conversion reaction inducing agent, as is discussed above, which can be either or both of a powder or molecular precursor or another inorganic or organic agent. In another embodiment, the combination of molecular precursor and solvent is chosen to provide a high solubility of the precursor in the solvent. The resistor precursor compositions of the present invention typically combine a precursor formulation and particles together with other additives. In one embodiment, the precursor composition includes metal particles, a molecular metal precursor and a vehicle. The molecular precursor is preferably a metal organic compound.

In another embodiment, the resistor precursor composition includes insulative low-melting-point micron-size particles, conductive nanoparticles and a vehicle.

In another embodiment, the resistor precursor composition includes insulative low-melting-point micron-size particles, nanoparticles and a vehicle. The nanoparticles can be an inorganic precursor to a conductive phase such as $Ag_2O$ nanoparticles. The molecular precursor is preferably a metal organic compound.

In another embodiment, the resistor precursor composition includes micron-size particles, a molecular precursor, nanoparticles and a vehicle. The molecular precursor is preferably a metal organic compound. The nanoparticles can be an inorganic molecular precursor to a conductive phase, such as $Ag_2O$ nanoparticles. The precursor composition can also include precursor, vehicle, and nanoparticles. The nanoparticles can be selected from silver, copper and other metals, or can be insulative nanoparticles such as silica, copper oxide and aluminum oxide.

The resistor precursor composition can also include a molecular precursor, a vehicle, and a polymer or polymer precursor, such as in cases where adhesion to a polymeric substrate is desired. The precursor to a polymer can be poly (amic) acid. The polymer can be an epoxy, polyimide, phenolic resin, thermo set polyester, polyacrylate and the like. The precursor compositions can include a low curing polymer, such as one that cures at not greater than 200° C., more preferably not greater than 150° C.

The resistor precursor compositions can also include carbon, a molecular metal precursor and a vehicle. The compositions can include particulate carbon, such as graphitic carbon. One preferred combination is graphitic carbon with molecular metal precursors to silver metal.

The resistor precursor compositions can also include a conductive polymer, a molecular precursor and a vehicle.

The resistor precursor composition can also include conductive nanoparticles and vehicle. The precursor composition can include conductive nanoparticles, a vehicle and polymer precursor.

The traditional route to high performance resistors is dominated by sintering of ceramic/glass composites at high temperatures, which eliminates porosity and allows for high degrees of crystallization, which yield high performance. When processing at low temperatures, sintering will not occur and other methods must be employed to achieve the best performance. The resistivity of a composite also follows a logarithmic mixing rule where the log of the resistivity of the composite is a sum of the resistivities of the phases ($r_i$)

multiplied by their volume fractions ($V_i$). Thus, air gaps or voids will dramatically reduce the conductivity of the composite. In addition, stress and moisture associated with these voids will reduce stability and reproducibility. This leads to two pursuable routes to obtain reproducible resistor values. One is to maximize the volume fraction of the resistive and insulative phases, and the other is to control the resistivity of the two phases and their morphology after firing. Both are determined by the material properties, the particle size distribution of the two phases, and the firing profile.

The resistor precursor compositions of the present invention enable the efficient packing of particles at low firing temperatures, as is discussed below for dielectric precursor compositions.

In resistor precursor compositions that include a molecular metal precursor and powders (nanoparticles and/or micron-size particles), the ratio of precursors to powders is ideally close to that corresponding to the amount needed to fill the spaces between particulates with material derived from the precursors. However, a significant improvement in tolerance can also be obtained for lower levels of molecular metal precursor. According to one embodiment, is preferred that at least about 5 vol. %, more preferably at least about 10 vol. % and even more preferably at least about 15 vol. % of the final resistor is derived from the molecular precursor.

Other resistor precursor compositions according to the present invention are preferred for different applications. Typically, the precursor composition will take into account the deposition mechanism, the desired performance of the features and the relative cost of the features. For example, simple circuitry on a polymer or other organic substrate designed for a disposable, high-volume application will require a low cost precursor composition but will not require electronic features having superior properties. On the other hand, higher end applications will require electronic features having very good electrical properties and relative cost of the precursor composition will typically not be a significant factor.

A precursor composition will typically include a solid phase made up of particulates, including particulates that are a precursor to a conductive phase such as silver oxide, silver nitrate particles, Ag trifluoroacetate crystalites, conductive micron-size particles and nanoparticles of the conductive phase, and a liquid phase made up of a vehicle and a molecular precursor solution. For precursor compositions, the particulate fraction typically lies between 0 and 55 vol. % of the total precursor composition volume. The molecular precursor fraction of the precursor composition, both present in the form of precursor particles and molecular precursor dissolved in solvents and/or dissolved in the vehicle, is typically expressed as a weight percent of the total precursor composition weight and can be up to 80 wt. % of the total precursor composition. In precursor compositions that have a significant loading of particles, the precursor fraction is typically between 0 and 40 wt. %.

In one embodiment, the resistor precursor composition includes up to about 40 vol. % carbon and from about 5 to about 15 weight percent of a molecular precursor, with the balance being vehicle and other additives. In another embodiment, the precursor composition includes up to about 30 vol. % carbon and up to about 10 vol. % metal nanoparticles, with the balance being vehicle and other additives.

According to another embodiment, the resistor precursor composition includes up to about 40 vol. % metal nanoparticles and from about 5 to about 15 wt. % of a molecular precursor, wherein the balance is vehicle and other additives.

According to another embodiment, the precursor composition includes up to about 50 vol. % micron-size metal particles and from about 5 to about 15 wt. % of a molecular precursor with the balance being vehicle and other additives.

In addition to the foregoing, the resistor precursor compositions according to the present invention can also include carbon particles, such as graphitic particles. Depending upon the other components in the precursor composition, carbon particle loading up to about 50 vol. % can be obtained in the compositions. The average particle size of the carbon particles is preferably not greater than about 1 μm and the carbon particles can advantageously have a bimodal or trimodal particle size distribution. Graphitic carbon has a bulk resistivity of about 1375μΩ-cm and is particularly useful in resistor precursor compositions that require a relatively low cost.

One embodiment of the present invention is directed to a low cost resistor precursor composition including between 20 and 50 vol. % micron-size particles selected from the group of amorphous carbon, carbon graphite, iron, nickel, tungsten, molybdenum, and between 0 and 15 vol. % nanoparticles selected from the group of Ag, carbon, intrinsically conductive polymer, Fe, Cu, Mo, W, and between 0 and 20 wt. % of a precursor to a metal such as Ag, with the balance being solvents, vehicle and other additives.

In another embodiment of a low cost resistor precursor composition, the precursor composition includes between 20 and 50 vol. % micron-size particles selected from the group of amorphous carbon, graphite, iron, nickel, tungsten, molybdenum, and between 20 and 50 wt. % precursor to an intrinsically conductive polymer, with the balance being solvents, vehicle and other additives.

There are at least two routes for the formation of dielectric features according to the present invention: a molecular precursor plus powders approach and a powders only approach. Dielectric compositions that are desirably formed using a molecular precursor plus powder method include: $BaTiO_3$—$PbZr_xTi_{1-x}O$; $BaTiO_3$—$TiO_2$; $BaTiO_3$—$TiZr_xSn_{1-x}O_4$; $BaNd_2Ti_5O_{14}$; and $TiZr_xSn_{1-x}O_4$. The compositions can be enhanced by the application of surface modification (silanation), or the addition of low melting temperature glass.

This approach for dielectric compositions requires the combination of a dielectric powder with a molecular precursor to a dielectric phase. The general approach is to first disperse the dielectric powder in a low boiling point solvent. The molecular precursor is then added to the dispersion and most of the solvent is removed, leaving a precursor composition consisting of particles and molecular precursor with a trace amount of solvent. This precursor composition can then be deposited on a substrate by a variety of methods and heated to yield a novel structure of dielectric particles connected by a dielectric formed from conversion of the molecular precursor.

An approach utilizing low melting glasses (LTG) is desirable for: $BaTiO_3$-LTG, $BaNd_2Ti_5O_{14}$-LTG and $PbMg_{1/3}Nb_{2/3}O_3$-LTG. The glass-based approach combines a low melting point glass with one or more dielectric powders. For this approach to be successful the particle size of the glass phase is important. If the glass particles are larger than the dielectric powder, they will either pool when melted, forming inhomogeneities, or they will wick into the porous arrangement of dielectric particles, leaving behind voids.

The general approach according to the present invention is to coat the powders with a dispersant while in a vehicle then remove the vehicle. The coated powders are then combined in the desired ratio and milled with a solvent and binder system. The desired ratio of glass to particles will vary by application and desired final properties, but will be governed by the following criteria. The dielectric phase is targeted to occupy the majority of the final composite depending on the particle size distribution of the powder. For example, a monomodal powder would be targeted to occupy 63% of the composite. The glass phase is then targeted to occupy the remaining volume, in the example here, 37%. This calculation provides the minimum glass loading and there may be some applications where more glass is used. This precursor composition is then deposited onto a substrate by any one of a variety of methods and processed to melt the glass phase and form a dense layer. The thermal processing can be from most any source, including oven, furnace, laser and microwave.

In one embodiment, the dielectric precursor composition includes spherical particles and a vehicle. In another embodiment, the dielectric precursor composition includes dielectric particles, a molecular precursor and a vehicle, wherein the molecular precursor is preferably a metal organic compound.

In another embodiment, the dielectric precursor composition includes dielectric particles, nanoparticles and a vehicle. In another embodiment, the dielectric precursor composition includes dielectric particles, a molecular precursor, nanoparticles and a vehicle wherein the precursor is preferably a metallo-organic compound.

The dielectric precursor compositions can include dielectric particles, vehicle, and polymer precursor. In cases where adhesion to a polymeric substrate is desired, the precursor composition can include a polymer or polymer precursor, such as poly (amic) acid. The polymer can be an epoxy, polyimide, phenolic resin, thermo set polyester, polyacrylate and the like. The polymer can be a low curing polymer that cures at not greater than 200° C., such as not greater than 150° C. The polymer can be a low loss polymer, such as poly tetra fluoro ethylene, or a precursor to such a polymer.

The dielectric precursor compositions can also include a particle surface modifier such as a liquid surface modification agent, for example, a silanating agent such as hexamethyldisilazane.

The present invention is also directed to dielectric precursor compositions that are capable of forming combinations of high-k particles discussed above and a matrix derived from a molecular precursor, a low melting glass, or both.

The dielectric precursor compositions of the present invention are based on optimizing the dielectric performance of a multiphase composite by combining the phases in the best possible way. The traditional route to high performance dielectrics is dominated by sintering of ceramics at high temperatures, which eliminates porosity and allows for a high degree of crystallization, which yields high performance. When processing at low temperatures, sintering will not occur and other methods must be employed to achieve the best performance. One route to accomplish this is to densely pack dielectric powders and fill the remaining voids with another component. This route has been used in polymer thick film by using a polymer to fill the voids. The dielectric constant of a composite follows a logarithmic mixing rule:

$$\log K = \sum_i V_i \log K_i,$$

where the log of the dielectric constant of the composite is a sum of the dielectric constants of the phases ($K_i$) multiplied by their volume fractions ($V_i$). Filling the voids with a low dielectric constant material, for example a polymer, will dramatically reduce the dielectric constant of the composite. For example, if a dielectric powder with a dielectric constant of 5000 is packed 60% dense and the remaining volume is filled with a polymer having a dielectric constant of 4, the resulting dielectric constant of the composite is 289. This leads to two pursuable routes to maximizing the dielectric constant. One is to maximize the volume fraction of the high dielectric constant particles, and the other is to increase the dielectric constant of the matrix phase.

The packing of spherical particles has been studied thoroughly and the best packing of monomodal spheres results in 74% efficient space filling, with a random packing resulting in a density of about 63%, or the practical limit for monomodal packing. Pauling's rules for packing of spheres shows that perfect packing results in two different sized interstitial voids throughout the structure. To fill the larger voids with smaller spheres, one would target a radius ratio of small particle to big particle of 0.414. To fill the smaller voids would require a radius ratio of small particle to big particle of 0.225. Using a trimodal distribution of spherical particles in accordance with the present invention and assuming perfect packing of the system, 81% of the space. Naturally, this process could be continued filling the voids between the spheres with smaller and smaller spheres, but there is a diminishing return and physical limits that prohibit packing to 100% density by this approach. With particles in the micron range and traditional processing techniques, a density of 70% would be achievable and anything higher would be a significant advance in the art.

It is an object of the present invention to maximize the dielectric constant of the matrix. Most polymers have dielectric constants ranging from 2 to 10. Most glasses are not much higher, but glasses with high lead or bismuth contents can have dielectric constants upwards of 40. The best way to achieve the high dielectric constant matrix is to use a metal oxide such as barium titanate. To achieve this at low processing temperatures requires a molecular precursor approach. Metal oxide precursors can form traditional high dielectric constant morphologies at low temperatures. The present invention is also directed to compositions and methods that lead to high ceramic yield and a high degree of crystallinity.

The present invention is also particularly useful for making low loss dielectric materials. Some of the major classes of dielectric materials that can be utilized or formed by the present invention include: Ba—Ln—Ti—O (Ln=Nd, Sm), $(Zn,Sn)_x(Ti,Sn)_yO_4$, $Ba_2Ti_9O_{20}$
$Ba_3Ta_2MeO_9$(Me=Zn or Mg). Specific examples include:
Ba—Pb—Nd—Ti—O, $Ba(Mg_{1/3}Ta_{2/3})O_3$—BaO—$Nd_2O_3$-5TiO$_2$
$Ba_{4.5}Nd_9Ti_{18}O_{54}$, with small additions of $Bi_2O$ or bismuth titanate,
ReBa3Ti$_2O_{8.5}$(Re=Y, Nd, and Sm),
$Ba_{3.75}Nd_{9.5}Ti_{18}O_{54}$ with 1.0-4.0 wt. % $Bi_2O_3$
BaO—$Ln_2O_3$-5TiO$_2$ (Ln=La, Pr, Nd, Sm),
BaO—$Nd_2O_3$—TiO$_2$
$Ba_{6-x}(Sm_{1-y}Nd_y)_8+_{2x/3}Ti_{18}O_{54}$, $(Ba,Pb)O$—$Nd_2O_3$—TiO$_2$ (CaO doped) and $Ti_{0.94}Zr_{0.4}Sn_{0.66}O_4$.

Another class of materials that can be utilized are the pyrochlores, having the general formula $A_2B_2O_7$, for example $Pb_2Ta_2O_7$. Another family of materials that can be used are those having a perovskite structure. Examples include metal titanates, metal zirconates, metal niobates, and other mixed metal oxides. The barium titanate system, which can reach a broad range of dielectric performance characteristics by adding small levels of dopant ions, is particularly preferred. Specific examples include: $BaTiO_3$, $PbTiO_3$, $PbZrO_3$, $PbZr_xTi_{1-x}O$ and $PbMg_{1/3}Nb_{2/3}O_3$.

Substrates

During conversion of the precursor compositions to electronic components such as resistors or capacitive layers, the surface that the precursor composition is deposited onto significantly influences how the overall conversion to a final structure occurs. The precursor compositions of the present invention have a low decomposition temperature enabling the precursor compositions to be deposited and heated on a low-temperature substrate.

The types of substrates that are particularly useful according to the present invention include polyfluorinated compounds, polyimides, epoxies (including glass-filled epoxy), polycarbonates and many other polymers. Particularly useful substrates include cellulose-based materials such as wood or paper, acetate, polyester, polyethylene, polypropylene, polyvinyl chloride, acrylonitrile, butadiene styrene (ABS), flexible fiber board, non-woven polymeric fabric, woven fabric, cloth, metallic foil and thin glass. Although the present invention can be used for such low-temperature substrates, it will be appreciated that traditional substrates such as ceramic substrates can also be used in accordance with the present invention.

According to a particularly preferred embodiment of the present invention, the substrate onto which the resistor precursor composition or dielectric precursor composition is deposited and converted to a resistive or dielectric feature has a softening point of not greater than about 350° C., such as not greater than about 250° C., even not greater than about 200° C. and even not greater than about 150° C.

The substrate can be pre-coated, for example a dielectric can be coated on a metallic foil. In the case of dielectric precursor compositions, the substrate is often pre-patterned with a bottom electrode layer, and the dielectric precursor composition is deposited on top of the electrode layer. For resistor precursor compositions, contact electrodes are often first deposited on the substrate. Further, the substrate surface can be modified by hydroxylating or otherwise functionalizing the surface, providing reaction sites for the precursor in the precursor composition. For example, the surface of a polyfluorinated material can be modified with a sodium naphthalenide solution that provides reactive sites for bonding during reaction with the precursor. In another embodiment, a thin layer of metal is sputtered onto the surface to provide for better adhesion to the substrate. In another embodiment, polyamic acid can be added to the precursor composition to bond with both the conductor and surface to provide adhesion. Preferred amounts of polyamic acid and similar compounds are 2 wt. % to 8 wt. % of the precursor composition.

Another method to improve adhesion is by infiltrating a precursor solution after deposition of the precursor composition and thermal treatment of the electronic feature. The precursor solution can include a precursor to a metal or a metal oxide that can be the same material than the electronic feature or a different metal. The liquid precursor solution infiltrates the porous matrix of the electronic feature deposited in the previous step and accumulates at the substrate interface. Heating will convert the liquid precursor to solid material and will improve adhesion of the feature to the surface.

Spreading can also be controlled by rapidly drying the compositions during printing by irradiating the deposited precursor composition during deposition.

Precursor composition spreading can also be controlled by the addition of a low decomposition temperature polymer in the form of a monomer. The monomer is rapidly cured during deposition by thermal or ultraviolet means, providing a network structure to help maintain line shape. This polymer is then either retained or removed during subsequent processing.

Another method that is useful to control bleeding of the precursor solution out of the deposited feature is to pattern the otherwise non-wetting substrate with wetting enhancement agents, which control spreading and increase adhesion. For example, this can be achieved by functionalizing the substrate with hydroxide or carboxylate groups.

Deposition of Precursor Compositions

The precursor compositions of the present invention can be deposited onto a substrate using a variety of tools and converted into electronic features for electronic applications.

The precursor compositions can be deposited by a direct-write process. For example, the precursor composition can be ejected through an orifice toward the surface without the tool being in direct contact with the surface. The tool can advantageously be controllable over an x-y grid or even an x-y-z grid such as when depositing the feature onto a non-planar surface. One preferred embodiment of the present invention is directed to the use of automated syringes, such as the MICROPEN tool, available from Ohmcraft, Inc., of Honeoye Falls, N.Y. An automated syringe is described in more detail in U.S. Pat. No. 4,485,387 by Drumheller, which is incorporated herein by reference in its entirety. The precursor compositions according to the present invention utilizing small, spherical particles enable the use of an automated syringe having a small orifice diameter, thereby enabling the formation of electronic features having a fine minimum feature size. In one embodiment, the syringe or other deposition tool includes a deposition orifice having a diameter of not greater than 200 µm, more preferably not greater than 100 µm, more preferably not greater than 50 µm and even more preferably not greater than about 25 µm.

Other modes of direct write deposition of the flowable compositions include techniques such as screen-printing, tape casting, or reel-to-reel processes including relief printing, intaglio printing, gravure and lithographic printing.

Another preferred method for depositing of the precursor composition is screen-printing. In the screen-printing process, a porous screen fabricated from stainless steel, polyester, nylon or similar inert material is stretched and attached to a rigid frame. A predetermined pattern is formed on the screen corresponding to the pattern to be printed. For example, a UV sensitive emulsion can be applied to the screen and exposed through a positive or negative image of the design pattern. The screen is then developed to remove portions of the emulsion in the pattern regions.

The screen is then affixed to a printing device and the precursor composition is deposited on top of the screen. The substrate to be printed is then positioned beneath the screen, the precursor composition is forced through the screen and onto the substrate by a squeegee that traverses the screen. Thus, a pattern of traces and/or pads of the precursor composition is transferred to the substrate. The substrate with the precursor composition applied in a predetermined pattern is then subjected to a drying and heating treatment to adhere the functional phase to the substrate. For increased line definition, the applied precursor composition can be further treated, such as through a photolithographic process, to develop and remove unwanted material from the substrate.

Some applications of such precursor compositions require higher tolerances than can be achieved using standard thick-film technology, as is described above. As a result, some precursor compositions have photo-imaging capability to enable the formation of lines and traces with decreased width and pitch. In this type of process, a photoactive precursor composition is applied to a substrate substantially as is described above. The precursor composition can include, for example, a liquid vehicle such as polyvinyl alcohol that is not cross-linked. The precursor composition is then dried and exposed to ultraviolet light through a photomask to polymerize the exposed portions of precursor composition and the precursor composition is developed to remove unwanted portions of the precursor composition. This technology permits higher density lines to be formed.

The electronic features of the present invention can be deposited using a syringe-dispense device at linear rates of at least 1 cm/sec, such as greater than 10 cm/sec, greater than 100 cm/sec, and even greater than 1000 cm/sec. This is enabled by the high flowability and low particle agglomeration of the precursor compositions, the lack of clogging of the precursor compositions in the syringes, and other attributes. The precursor compositions of the present invention can also be deposited using a wide variety of larger volume production tools such as screen-printing and reel-to-reel printing techniques.

In accordance with the foregoing direct-write processes such as syringe dispense, the present invention enables the formation of features for devices and components having small minimum feature size. As used herein, minimum feature size is the smallest dimension of a feature in the x-y axis, such as the width of a linear feature. For example, the method of the present invention can be used to fabricate features having a minimum feature size of not greater than about 100 µm, more preferably not greater than about 75 µm, even more preferably not greater than 50 µm and even more preferably not greater than 25 µm. The precursor compositions of the present invention also enable the deposition of thinner layers than what is state of the art for thick film precursor compositions. For example, dielectric layers with thickness of not greater than 20 µm can be readily deposited, more preferably not greater than 15 µm, or even more preferably not greater than 10 µm, while maintaining resistance to dielectric breakdown in the range of several kV/cm.

In general terms, the capacitance of a capacitor embedded in a multilayer package is related to the dielectric constant of a dielectric material and the thickness of the dielectric layer according to the following equation:

$$C=(eNAk)/t$$

where C is the capacitance of the multilayer capacitor; e is a constant; N is the number of active layers in the case of multilayered ceramic package; k is the dielectric constant of the dielectric material obtained after deposition and processing of the dielectric precursor composition. A is the area of the electrodes which is often small to save "real estate cost", and t is the thickness or distance between the capacitor plates.

This equation illustrates that if the value of A is constant, the capacitance can be improved by increasing either the number of active layers N or the ratio of K/t. This illustrates the importance of using high-k compositions, and applying this dielectric precursor composition in very thin layers, as enabled by the present invention.

Precursor Conversion

After deposition, the precursor composition(s) is heated to form the electronic feature, such as a resistor or capacitor. According to the present invention, the heat treatment step is performed at a sufficiently low temperature and/or for a sufficiently short period of time that the substrate is not damaged by the heat treatment.

Preferred processing temperatures for the resistor precursor compositions according to the present invention are not greater than about 500° C., more preferably not greater than about 400° C., even more preferably not greater than about 350° C. According to one embodiment, the processing temperature can be not greater than about 200° C., such as not greater than about 150° C. The preferred processing times are not greater than about 5 minutes, more preferably not greater than about one minute. The heat treatment can include the use of a furnace, a laser, a light source (e.g., an infrared light source) or combinations of these. The low conversion temperatures advantageously enable resistors to be formed on low temperature organic substrates, including polymer substrates such as polyimide.

The dielectric precursor compositions of the present invention can also be converted at a low temperature. The preferred conversion temperature is not greater than 900° C. for ceramic substrates. For glass substrates, the preferred conversion temperature is not greater than 600° C. Even more preferred for glass substrates is a conversion temperature of not greater than 500° C., such as not greater than 400° C. The preferred conversion temperature for organic substrates is not greater than 350° C., even more preferably not greater than 300° C., and even more preferably not greater than 200° C. As with the resistor compositions, the low conversion temperatures advantageously enable dielectric features to be formed on low temperature organic substrates, including polymer substrates such as polyimide.

Process Flow

In accordance with the foregoing, the precursor compositions of the present invention can be formulated, deposited and converted to useful electronic features having well-controlled properties. The present invention provides several novel process flows that enable the deposition and formation of such features at relatively low temperatures.

An optional first step, prior to deposition of the precursor composition, is surface modification of the substrate. The surface modification can be applied to the entire substrate or can be applied in the form of a pattern, such as by using photolithography. The surface modification can include increasing or decreasing the hydrophilicity of the substrate surface by chemical treatment. For example, a silanating agent can be used on the surface of a glass substrate to increase the adhesion and/or to control spreading of the precursor composition through modification of the surface tension and/or wetting angle. The surface modification can also include the use of a laser to clean the substrate. The surface can also be subjected to mechanical modification by contacting with another type of surface. The substrate can also be modified by corona treatment.

For the deposition of organic-based precursor compositions, the activation energy of the substrate surface can be modified. For example, a line of polyimide can be printed on the substrate prior to deposition of a precursor composition, such as a silver metal precursor composition, to prevent infiltration of the precursor composition into a porous substrate, such as paper. In another example, a primer material may be printed onto a substrate to locally etch or chemically modify the substrate, thereby inhibiting the spreading of the precursor composition being deposited in the following deposition step.

The second step is the deposition of the precursor composition. As is discussed above, the deposition can be carried out by methods such as syringe-dispense, screen printing, or roller printing. In one embodiment, a first deposition step provides the precursor composition including a molecular precursor while a second deposition step provides a reducing agent or other co-reactant that converts the metal precursor. Another method for depositing the precursor composition is using multi-pass deposition to build the thickness of the deposit.

An optional third step is the modification of the properties of the deposited precursor composition. This can include freezing, melting and otherwise modifying the precursor composition properties such as viscosity, with or without chemical reactions or removal of material from the precursor composition. For example, a precursor composition including a UV-curable polymer can be deposited and immediately exposed to an ultraviolet lamp to polymerize and thicken the precursor composition and reduce spreading of the precursor composition. Similarly, a thermoset polymer can be deposited and exposed to a heat lamp or other infrared light source.

The fourth step is drying or subliming the precursor composition by heating or irradiating. In this step, material is removed from the precursor composition or chemical reactions occur in the precursor composition. An example of a method for processing the deposited precursor composition is using a UV, IR, laser or a conventional light source. In one embodiment, the deposited precursor composition is dried before processing in the subsequent step. In another embodiment, a precursor is contacted with a conversion reaction inducing agent before the precursor composition is dried. In another embodiment, the precursor composition is contacted with a gaseous reducing agent such as hydrogen.

The fifth step is increasing the temperature of the deposited precursor composition. An example of one method is to process the deposited precursor composition with specific temperature/time profiles. Heating rates can preferably be greater than about 10° C./min, more preferably greater than 100° C./min and even more preferably greater than 1000° C./min. The temperature of the deposited precursor composition can be raised, for example, by using hot gas or by contact with a heated substrate. This temperature increase may result in further evaporation of solvents and other species. A laser, such as an IR laser, can also be used for heating. IR lamps or a belt furnace can also be utilized. It may also be desirable to control the cooling rate of the deposited feature. The heating step can also coincide with the activation of a reducing agent present in the precursor composition. The action of such reducing agent could include removal of a surface oxide from particles such as Cu particles or Ni particles.

The sixth step is reacting the molecular precursors, if such precursors are present in the precursor composition. In one embodiment, the precursors are reacted using various gases to assist in the chemical conversion of the precursor composition to the targeted electronic material or feature. For example, hydrogen, nitrogen, and reducing gases can be used to assist the reaction. Copper, nickel, and other metals that oxidize when exposed to oxygen may require the presence of reducing atmospheres. It has been found that the precursor compositions of the present invention can advantageously provide very short reaction times when processed with light (e.g., a laser) that heats the materials. This is a result of the high chemical reaction rates when sufficiently high temperatures are provided for a specific precursor and the ability of light to rapidly heat the materials over time scales of milliseconds or even less. In the case of precursor compositions including particles, phases having a low melting or softening point allow short processing times.

The precursor compositions of the present invention including only particles, particles and molecular metal precursors and precursors without particles can all be processed for very short times and still provide useful materials. Short heating times can advantageously prevent damage to the underlying substrate. Preferred thermal processing times for deposits having a thickness on the order of about 10 μm are less than about 100 milliseconds, more preferably less than about 10 milliseconds, and even more preferably less than about 1 millisecond. The short heating times can be provided using laser (pulsed or continuous wave), lamps, or other radiation. Particularly preferred are scanning lasers with controlled dwell times. When processing with belt and box furnaces or lamps, the hold time is preferably less than 60 seconds, more preferably less than 30 seconds, and even more preferably less than 10 seconds. The heating time can even be less than 1 second when processed with these heat sources, and even less than 0.1 second, while providing electronic materials that are useful in a variety of applications. According to the present invention, the deposited precursor compositions can be substantially fully converted at temperatures of not greater than 500° C., more preferably not greater than 400° C. and even more preferably not greater than 350° C. According to one embodiment, the precursor compositions can be converted at a temperature of not greater than 200° C., such as not greater than 150° C.

An optional seventh step is sintering of the particles or the material derived from the precursor. The sintering can be carried out using a furnace, light source such as a heat lamp and/or a laser. In one embodiment, the use of a laser advantageously provides very short sintering times and in one embodiment the sintering time is less than 1 second, more preferably less than 0.1 seconds and even more preferably less than 0.01 seconds. Laser types include pulsed and continuous wave. In one embodiment, the laser pulse length is tailored to provide a depth of heating that is equal to the thickness of the material to be sintered. The components in the precursor composition can be fully or partially reacted before contact with laser light. The components can be reacted by exposure to the laser light and then sintered. In addition, other components in the precursor composition (e.g., glasses) can melt and flow under these conditions.

Selective laser sintering can also be used to selectively melt a low melting phase in the precursor composition. Selective laser sintering was developed as a method for solid freeform fabrication of three-dimensional parts. One process involves spreading a layer of powder evenly over an area. A laser is then used to selectively melt the powder in a pattern that is representative of one layer of the desired part. The melted region becomes a solid layer while the untreated powder provides support for subsequent layers. A second layer of powder is then spread over the entire area and the laser used to melt the second layer. The process continues, building the part layer by layer until the final shape is complete. While the process really involves selective laser melting, it has been dubbed selective laser sintering as ceramic parts can be built by this method. Although the selective laser sintering process is traditionally used with only one material, the various combinations of ceramic powder and a low melting glass as described in the present invention allow for new applications for laser melting. Once a direct-write tool has deposited a mixture of ceramic oxide powder and glass, a laser may be employed to densify the structure by melting the glass phase. The proper balance of oxide powder to glass must be achieved along with the proper size distribution of both particulate phases. For high-k dielectric applications the glass content would ideally be minimized so that the high-k performance of the dielectric powder is maximized. For high-ohm resistors the glass phase may be the majority of the composition so that the conduction between the conductive oxide particles is limited by the insulating glass phase. As the glass phase is melted it wets the oxide powder and assists in densification. The laser energy can be coupled into the glass directly and other times it is desired to couple the laser energy with the oxide powder and achieve melting of the glass indirectly.

As an eighth step, the deposit can be post-treated. For example, the crystallinity of the phases can be increased by laser processing. The post-treatment can also include cleaning and/or encapsulation of the electronic features, or other modification such as silanation of a dielectric material.

As a ninth step, surface modification can be performed to remove hydroxyl groups, as is discussed above with respect to dielectric compositions. Surface modification of the porosity in dielectric layers can lead to dramatically reduced dielectric loss and decreased sensitivity to humidify. In one embodiment, a porous dielectric layer is formed according to the foregoing. The dielectric is then exposed to a liquid surface modification agent such as a silanating agent. The silanating agent can include hexamethyldisilazane. For example, a surface modifying agent can be poured onto the fired dielectric layer and allowed to contact the layer for about 10 to 15 minutes. The dielectric layer can then be dried, such as at 120° C. for 10 to 15 minutes, completing the surface modification. The exposure time for the surface modifying agent is preferably less than 20 minutes, more preferably less than 10 minutes, with the temperature preferably room temperature. The drying profile to remove excess surface modifying agent is preferably 120° C. for 15 minutes.

It will be appreciated from the foregoing discussion that two or more of the latter process steps (drying, heating, reacting and sintering) can be combined into a single process step.

The foregoing process steps can be combined in several preferred combinations. For example, one preferred process flow includes the steps of forming a structure by screen printing, photopatterning, thin film or wet subtractive methods; identifying locations requiring the addition of material; adding material by direct-write deposition of a precursor composition; and processing to form the final product. In a specific embodiment, a circuit is prepared by screen-printing and then repaired by syringe-dispense printing.

In another embodiment, features larger than about 100 μm are first deposited by screen-printing. Features having a size of less than 100 μm are then deposited by a direct deposition method using syringe dispense of a precursor composition according to the present invention.

In yet another embodiment, a precursor composition is deposited, dried, reacted at not greater than about 350° C., more preferably at not greater than about 200° C. and even more preferably at not greater than 150° C., and is then laser sintered.

In yet another embodiment, a precursor composition is deposited, dried, and reacted with a total reaction time of not greater than about 100 seconds, more preferably not greater than about 10 seconds and even more preferably not greater than about 1 second.

In yet another embodiment, a precursor composition is deposited, dried, and reacted, wherein the total time for the deposition, drying and reaction is preferably not greater than about 60 seconds, more preferably not greater than about 10 seconds and even more preferably not greater than about 1 second.

In yet another embodiment, a polyimide surface is first modified to promote adhesion of the precursor composition to the substrate. The precursor composition is deposited, and then the precursor composition is dried and converted at a temperature of not greater than 350° C., more preferably not greater than about 200° C. and even more preferably at not greater than 150° C.

Components

The precursor compositions according to the present invention are useful for the fabrication of passive electronic components on a variety of substrates, including organic substrates. Circuit boards, packages for integrated circuits, backplanes for displays, radio frequency identification tags, smart cards, and other electronic devices employ a variety of electrical components. These components include conductors, resistors, capacitors, inductors, sensors, dielectric layers and others. Various means exist for forming these components. For resistors, capacitors and inductors, the main division is components that are fabricated individually, with certain well-defined values of resistance and capacitance, and then separately attached to a substrate, often by soldering, and components that are fabricated in place by approaches such as screen printing or thin film approaches such as sputtering and evaporation along with subtractive patterning steps. The advantages of fabricating components in place include the ability to fabricate thin resistors and capacitors and the resulting ability to embed these components between layers to build up multiple layer structures. An important distinction for components fabricated in place is the type of substrate and types of processing approaches required to form the component. For example, the fabrication of a resistor on organic substrates that can only tolerate low processing temperatures, usually below 350° C., requires either the use of polymer thick film technology or thin film technology. Polymer thick film technology has the advantage of providing a low cost solution, screen printing, but has the disadvantage of poor performance and reliability because of the polymer. Thus, there is a need for higher performance screen printable components. Thin film technology has the advantage of being able to form high performance and high reliability components, but has the disadvantage of being expensive because of the complex combination, of additive vacuum techniques and subtractive etching techniques required to achieve the desired performance. Thus there is a need for materials and associated processing approaches that can provide high performance components and low cost.

The compositions and methods of the present invention provide means for achieving high performance components on organic substrates while also providing low cost. In particular, the combinations of molecular precursors and particles of the present invention allow the formation of well-defined inorganic resistor and dielectric materials. The novel precursor chemistries and particle characteristics provide means for filling in gaps between particles and providing high performance resistors, capacitors and inductors. Examples of passive components that can be fabricated in accordance with the present invention are disclosed in: U.S. Pat. No. 6,323,096 by Saia et al.; U.S. Pat. No. 6,284,982 by Kusner et al.; U.S. Pat. No. 6,399,230 by Tormey et al.; U.S. Pat. No. 6,154,176 by Fathy et al.; U.S. Pat. No. 6,317,023 by Felten; U.S. Pat. No. 6,329,899 by Hunt et al.; and U.S. Pat. No. 5,892,661 by Stafford et al. Each of these U.S. Patents is incorporated herein by reference in its entirety.

The dielectric precursor compositions of the present invention can provide dielectric components (e.g., capacitors) having novel combinations of high performance in terms of dielectric constant, while being formed at a low processing temperature.

In one embodiment for a high-k dielectric, a dielectric constant of 700 and a loss of 6% is achieved for a material processed at 600° C. for 12 minutes. In another embodiment for a high-k dielectric, a dielectric constant of 200 and a loss of 2% is achieved for a material processed at 550° C. for 15 minutes. In another embodiment for a high-k dielectric, a dielectric constant of 100 and a loss of 12% is achieved for a material processed at 350° C. for 30 minutes.

In one embodiment for a low loss dielectric, a dielectric constant of 300 is achieved with a low loss of 0.9% for a material processed at 400° C. for 30 minutes.

In another embodiment illustrating the importance of surface modification to reduce loss, a dielectric constant of 17 is obtained with a loss of 0.2% for a material processed at 450° C. for 30 minutes. In another embodiment illustrating the importance of surface modification to reduce loss, a dielectric constant of 13 is obtained with a loss of 0.7% for a material processed at 350° C. for 30 minutes. Both of these examples were treated after firing with a surface modification.

By way of example, a porous layer of dielectric composite consisting of $BaTiO_3$ particles and a ZST matrix has a loss of 5%. The layer was exposed to a silanating agent for 15 minutes, then oven dried at 120° C. for 15 minutes. The measured loss was reduced to 0.7%.

The present invention is particularly useful for fabrication of capacitors or dielectric layers that can be fired below 500° C., more preferably below 400° C., more preferably below 350° C., and even more preferably below 250° C. such as below 200° C. The present invention enables the production of highly pure dielectric features with low porosity, or fully dense composite layers with a dielectric constant of up to 500, more preferably up to 750, even more preferably up to 1000. The present invention further enables the deposition of very thin dielectric layers, such as less than 20 μm, more preferably thinner than 15 μm, and even more preferably thinner than 10 μm while having a typical surface roughness less than 10% of the full layer thickness and a typical breakdown voltage of at least 500 kV/cm for a 5 mm$^2$ device.

The present invention also enables the production of highly pure dielectric features with low porosity, or fully dense composite layers with a dielectric loss of less than 1%, more preferably less than 0.1%, even more preferably less than 0.05%. The dielectric constants are up to 700 at 1 MHz when processed at 600° C. The porosity is less than 20% when processed at 600° C. The surface roughness is less than 5% of the thickness of the layer.

The layer thickness is less than 1 μm for dielectrics made from only molecular precursors. Screen printed dielectric layers are typically about 12 μm thick. The loss can be as low as 0.2% for dielectrics processed at 450° C. that have been surface modified.

The layers of the present invention can combine the attributes of being flexible, being compatible with a wide variety of electrode materials, including polymer thick film materials.

The dielectric layer can be a composite layer. The composite can include metal oxide/glass, metal oxide/polymer, and metal oxide 1/metal oxide 2. For example, the low temperature processing allows the formulation of composite dielectric layer including $Al_2O_3$ and $TiO_2$ particles. This composition can be tailored to have a very low TCC value combined with very low loss for low fire microwave applications. In a preferred embodiment, the dielectric metal oxide is PMN and the preferred glass is a lead based borosilicate glass. In another preferred embodiment, the dielectric derived from particles is doped $BaTiO_3$, and the dielectric derived from precursors is ZST.

The compositions and methods of the present invention provide final microstructures including phases of dielectric and glass that are not interdiffused. They also provide compositions where the two dielectric phases are not interdiffused. For example, the composite could include $BaTiO_3$ particles that are connected through a network of $TiO_2$ derived from precursor. This structure would be impossible to achieve through traditional sintering routes where the phases would interdiffuse.

The porosity of the composite dielectric structures derived from the compositions and methods of the present invention is preferably not greater than 25%, more preferably not greater than 10%, even more preferably not greater than 5%, and most preferably not greater than 2%.

The present invention also provides high performance dielectric layers containing no polymer that are in contact with either a polymeric substrate, or a thin metal layer that is directly in contact with a polymeric substrate. This is a result of the low processing temperatures coupled with the high performance.

The compositions and methods of the present invention advantageously allow the fabrication of a variety of dielectric structures. The dielectric can form a portion of a loaded antenna. The dielectric can be placed under the conductor in an antenna. The dielectric can be used in a capacitor or sensor. The dielectric layer can also be used in organic and inorganic EL displays.

The compositions and methods of the present invention can be used to fabricate dielectric and capacitive layers for RF tags and smart cards. The compositions and methods provide the ability to print disposable electronics such games in magazines.

The precursor compositions and processes of the present invention can also be used to fabricate microelectronic components such as decoupling capacitors deposited directly onto the semiconductor chip.

Another technology where the direct-write deposition of electronic powders according to the present invention provides significant advantages is for flat panel displays, such as plasma display panels. High resolution dispensing of low fire dielectric layers is a particularly useful method for forming the capacitive layers for a plasma display panel. Typically, a dielectric precursor composition is printed onto a glass substrate and is fired in air at from about 450° C. to 600° C. The present invention enables the use of much lower firing temperatures.

Direct-write deposition offers many advantages over the precursor composition techniques including faster production time and the flexibility to produce prototypes and low-volume production applications. The deposited features will have high resolution and dimensional stability, and will have a high density.

The present invention can be used in circuitry for a disposable calculator, sensors including conductor features of pure metal on an organic, semiconductor, or glass substrates for solar cell technology, disposable cell phone, game in a magazine, electronic paper, where the paper is in a magazine The present invention can also be used to print dielectric materials onto substrates that are not flat. For example, these can include helmets, windshields, electronic components, electronic packaging, visors, etc.

The present invention allows printing of electronic materials on substrates that have multiple material surfaces exposed. These exposed materials can include Si, $SiO_2$, silicon nitride, polymers, polyimides, epoxies and the like.

According to another embodiment of the present invention, the circuit can contain various combinations of circuit elements, some or all of which can be formed by direct write deposition. The circuit can include only a conductor. The circuit can include conductor and resistor elements as in resistor networks. The circuit can include conductor, resistor and dielectric elements.

According to another embodiment of the present invention, the circuit can be printed on a substrate that is transparent or reflective.

The present invention can be used to direct write onto a dielectric substrate for the formation of antennae. The antenna can be a fractal antenna. The antenna can be a loaded antenna comprising resistive, inductive, or capacitive elements.

3-D deposition techniques such as syringe dispensing described herein allow direct deposition of a wide variety of materials. The composition of the particle/precursor can be continuously modified during deposition, and micrometer-scale composition and positioning accuracy can be achieved. The complete synthesis process can be performed below 500° C. and local laser heating can be employed for in-situ material processing. These deposition capabilities can be fully utilized to deposit radially graded structures.

In addition to circulators in microwave devices, the composite and functionally graded composites that are described herein have numerous other applications in the area of miniaturization of hybrid microwave circuits. For example, graded dielectric constants in the plane can be used for impedance transformers by relying on the graded dielectric constant rather than tapered geometry to change intrinsic impedance along the length of the line. This will reduce size and has the potential to reduce losses associated with the geometrical aspects and related resonance effects.

In another embodiment of the present invention, conducting or ceramic structures of one composition in a medium of a different composition can be provided. By building some type of resonance into the structure, novel properties can be obtained.

In one particular implementation of these resonant structures, miniature microwave filters with very specific performance can be constructed by imbedding a conductive resonant structure into a high-k medium. For example, imbedding a conductive resonator structure into a dielectric with a relative dielectric constant of 10,000 will enable a size reduction by a factor of 100.

This technique will enable the fabrication of devices with highly customized filter characteristics, while the reduction in device footprint, especially in the 1 GHz range where current component sizes are of the order of several centimeters, will allow for direct integration versatility onto monolithic microwave integrated chips.

The present invention, when combined with high resolution 3-D deposition techniques such as syringe dispensing described herein allow direct deposition of multiple types of materials in a multilayer fashion with micron-scale spatial resolution within the layers. One implementation of this capability results in a photonic bandgap material consisting of stacked layers of dielectric rods. Each layer in the stack is rotated 90 degrees relative to adjacent layers, forming what is commonly known as a Lincoln log structure. While such structures can be obtained using photolithographic techniques, the present invention allows the structures to be made from new materials, with fewer steps, and at significantly lower costs.

In one embodiment of the present invention for low ohm resistors, the feature includes silver derived from a precursor and an insulating phase. The insulating phase is preferably a glass or metal oxide. Preferred glasses are aluminum borosilicates, lead borosilicates and the like. Preferred metal oxides are silica, titania, alumina, and other simple and complex metal oxides. In one embodiment the insulating phase is derived from particles. In another embodiment, it is derived from precursors. In yet another embodiment, the insulative phase is derived from nanoparticles.

In one embodiment, the substrate is not planar and a non-contact printing approach is used. The non-contact printing approach can be syringe-dispense providing deposition of discrete units of precursor composition onto the surface. Examples of surfaces that are non-planar include windshields, electronic components, electronic packaging and visors.

The precursor compositions and methods provide the ability to print disposable electronics such as for games included in magazines. The precursor compositions can advantageously be deposited and reacted on cellulose-based materials such as paper or cardboard. The cellulose-based material can be coated if necessary to prevent bleeding of the precursor composition into the substrate. For example, the cellulose-based material can be coated with a UV curable polymer.

The low-ohm resistors formed in accordance with the present invention have combinations of various features that have not been attained using other high viscosity precursor compositions. After heating, precursor compositions of the present invention will yield solids that may or may not be porous with specific bulk resistivity values. As a background, bulk resisitivity values of a number of fully dense solids are provided in Table 9 below:

TABLE 9

Bulk Resistivity of Various Materials

| Material | Bulk Resistivity ($\mu\Omega$-cm) |
| --- | --- |
| silver (Ag-thick film material fired at 850° C.) | 1.59 |
| copper (Cu) | 1.68 |
| gold (Au) | 2.24 |
| aluminum (Al) | 2.65 |
| Ferro CN33-246 (Ag + low melting glass, fired at 450° C.) | 2.7-3.2 |
| SMP Ag flake + precursor formulation, 250° C. | 4.5 |
| molybdenum (Mo) | 5.2 |
| Tungsten (W) | 5.65 |
| zinc (Zn) | 5.92 |
| nickel (Ni) | 6.84 |
| iron (Fe) | 9.71 |
| palladim (Pd) | 10.54 |
| platinum (Pt) | 10.6 |
| tin (Sn) | 11 |
| solder (Pb—Sn; 50:50) | 15 |
| lead | 20.64 |
| titanium nitrate (TiN transparent conductor) | 20 |
| polymer thick film (state of the art Ag filled polymer, 150° C.) | 18-50 |
| polymer thick film (Cu filled polymer) | 75-300 |
| ITO indium tin oxide | 100 |
| zinc oxide (ZnO) (doped-undoped) | 120-450 |
| carbon (C-graphite) | 1375 |
| doped silver phosphate glass, 330° C. | 3000 |
| ruthenium oxide ($RuO_2$) type conductive oxides) | 5000-10,000 |
| intrinsically conductive polymer | 1,000,000 |

A low cost resistor precursor composition including between 20 and 40 vol. % micron-size particles selected from the group of amorphous carbon, carbon graphite, iron, nickel, tungsten, molybdenum, and between 0 and 15 vol. % nanoparticles selected from the group of Ag, carbon, intrinsically conductive polymer, Fe, Cu, Mo, W, and between 0 and 15 wt. % precursor to a metal such as Ag, with the balance being solvents, vehicle and other additives, will, after firing at between 250° C. and 400° C., yield a bulk conductivity in the range from 50 to 4000 micro-ohm-centimeter.

A low cost resistor precursor composition including between 20 and 40 vol. % micron-size particles selected from the group of amorphous carbon, graphite, iron, nickel, tungsten, molybdenum, and between 10 wt. % and 30 wt. % precursor to a intrinsically conductive polymer, with the balance being solvents, vehicle and other additives, will, after firing at between 100° C. and 200° C., yield a bulk conductivity is in the range from 1,000 to 10,000 μΩ-cm.

The compositions and methods of the present invention can also produce conductive patterns that can be used in flat panel displays. The conductive materials used for electrodes in display devices have traditionally been manufactured by commercial deposition processes such as etching, evaporation, and sputtering onto a substrate. In electronic displays it is often necessary to utilize a transparent electrode to ensure that the display images can be viewed. Indium tin oxide (ITO), deposited by means of vacuum-deposition or a sputtering process, has found widespread acceptance for this application. U.S. Pat. No. 5,421,926 by Yukinobu et al. discloses a process for printing ITO inks. For rear electrodes (i.e., the electrodes other than those through which the display is viewed) it is often not necessary to utilize transparent conductors. Rear electrodes can therefore be formed from conventional materials and by conventional processes. Again, the rear electrodes have traditionally been formed using costly sputtering or vacuum deposition methods. The compositions according to the present invention allow the deposition of metal electrodes onto low temperature substrates such as plastics. For example, a silver precursor composition can be deposited and heated at 150° C. to form 150 μm by 150 μm square electrodes with excellent adhesion and sheet resistivity values of less than 1 ohms per square.

Nonlinear elements, which facilitate matrix addressing, are an essential part of many display systems. For a display of M×N pixels, it is desirable to use a multiplexed addressing scheme whereby M column electrodes and N row electrodes are patterned orthogonally with respect to each other. Such a scheme requires only M+N address lines (as opposed to M×N lines for a direct-address system requiring a separate address line for each pixel). The use of matrix addressing results in significant savings in terms of power consumption and cost of manufacture. As a practical matter, the feasibility of using matrix addressing usually hinges upon the presence of a non-linearity in an associated device. The nonlinearity eliminates crosstalk between electrodes and provides a thresholding function. A traditional way of introducing nonlinearity into displays has been to use a backplane having devices that exhibit a nonlinear current/voltage relationship. Examples of such devices include thin-film transistors (TFT) and metal-insulator-metal (MIM) diodes. While these devices achieve the desired result, they involve thin-film processes, which suffer from high production costs as well as relatively poor manufacturing yields.

The present invention allows the deposition of the components of nonlinear devices including the source the drain and the gate. These nonlinear devices may include deposited organic materials such as organic field effect transistors (OFET) or organic thin film transistors (OTFT), inorganic materials and hybrid organic/inorganic devices such as a polymer based field effect transistor with an inorganic gate dielectric. Deposition of these materials will enable low cost manufacturing of large area flat displays.

The compositions and methods of the present invention produce features that can be used in flat panel displays. Features may be made from transparent conducting polymers, transparent conductors such as ITO, metals or other suitable conductors. The precursor compositions of the present invention allow deposition on large area flexible substrates such as plastic substrates and paper substrates, which are particularly useful for large area flexible displays. Address lines may additionally be insulated with an appropriate insulator such as a non-conducting polymer or other suitable insulator. Alternatively, an appropriate insulator may be formed so that there is electrical isolation between row conducting lines, between row and column address lines, between column address lines or for other purposes. A display including a display backplane is disclosed, for example, in U.S. Pat. No. 4,736,229 by Holmberg et al., which is incorporated herein by reference in its entirety.

Flat panel displays may incorporate emissive or reflective pixels. Some examples of emissive pixels include electroluminescent pixels, photoluminescent pixels such as plasma display pixels, field emission display (FED) pixels and organic light emitting device (OLED) pixels. Reflective pixels include contrast media that can be altered using an electric field. Contrast media may be electrochromic material, rotatable microencapsulated microspheres, polymer dispersed liquid crystals (PDLCs), polymer stabilized liquid crystals, surface stabilized liquid crystals, smectic liquid crystals, ferroelectric material, or other contrast media well known in art. Many of these contrast media utilize particle-based non-emissive systems. Examples of particle-based non-emissive systems include encapsulated electrophoretic displays (in which particles migrate within a dielectric fluid under the influence of an electric field); electrically or magnetically driven rotating-ball displays as disclosed in U.S. Pat. Nos. 5,604,027 and 4,419,383, which are incorporated herein by reference in their entirety; and encapsulated displays based on micromagnetic or electrostatic particles as disclosed in U.S. Pat. Nos. 4,211,668, 5,057,363 and 3,683,382, which are incorporated herein by reference in their entirety. A preferred particle non-emissive system is based on discrete, microencapsulated electrophoretic elements, examples of which are disclosed in U.S. Pat. No. 5,930,026 by Jacobson et al. which is incorporated herein by reference in its entirety.

In one embodiment, the present invention relates to depositing features, such as resistors and capacitors, for addressable, reusable, paper-like visual displays. Examples of paper-like visual displays include "gyricon" (or twisting particle) displays and forms of electronic paper such as particulate electrophoretic displays (available from E-ink Corporation, Cambridge, Mass.). A gyricon display is an addressable display made up of optically anisotropic particles, with each particle being selectively rotatable to present a desired face to an observer. For example, a gyricon display can incorporate "balls" where each ball has two distinct hemispheres, one black and the other white. Each hemisphere has a distinct electrical characteristic (e.g., zeta potential with respect to a dielectric fluid) so that the ball is electrically as well as optically anisotropic. The balls are electrically dipolar in the presence of a dielectric fluid and are subject to rotation. A ball can be selectively rotated within its respective fluid-filled cavity by application of an electric field, so as to present either its black or white hemisphere to an observer viewing the surface of the sheet.

In another embodiment, the present invention relates to electrical features for organic light emitting displays (OLEDs). Organic light emitting displays are emissive displays consisting of a transparent substrate coated with a transparent conducting material (e.g., ITO), one or more organic layers and a cathode made by evaporating or sputtering a metal of low work function characteristics (e.g., calcium or magnesium). The organic layer materials are chosen so as to provide charge injection and transport from both electrodes into the electroluminescent organic layer (EL), where the charges recombine to emit light. There may be one or more organic hole transport layers (HTL) between the transparent conducting material and the EL, as well as one or more electron injection and transporting layers between the cathode and the EL. The precursor compositions according to the present invention allow the deposition of resistors and capacitors onto low temperature substrates such as flexible large area plastic substrates that are particularly preferred for OLEDs.

In one embodiment, the present invention relates to electrical features for liquid crystal displays (LCDs), including passive-matrix and active-matrix. Particular examples of LCDs include twisted nematic (TN), supertwisted nematic (STN), double supertwisted nematic (DSTN), retardation film supertwisted nematic (RFSTN), ferroelectric (FLCD), guest-host (GHLCD), polymer-dispersed (PD) and polymer network (PN).

Thin film transistors (TFTs) are well known in the art, and are of considerable commercial importance. Amorphous silicon-based thin film transistors are used in active matrix liquid crystal displays. One advantage of thin film transistors is that they are inexpensive to make, both in terms of the materials and the techniques used to make them. In addition to making the individual TFTs as inexpensively as possible, it is also desirable to inexpensively make the integrated circuit devices that utilize TFTs. Accordingly, inexpensive methods for fabricating integrated circuits with TFTs, such as those of the present invention, are an enabling technology for printed logic.

Field-effect transistors (FETs), with organic semiconductors as active materials, are the key switching components in contemplated organic control, memory, or logic circuits, also referred to as plastic-based circuits. An expected advantage of such plastic electronics is the ability to fabricate them more easily than traditional silicon-based devices. Plastic electronics thus provide a cost advantage in cases where it is not necessary to attain the performance level and device density provided by silicon-based devices. For example, organic semiconductors are expected to be much less sensitive to air than recently proposed solution-deposited inorganic semiconductor materials. For these reasons, there have been significant efforts expended in the area of organic semiconductor materials and devices.

Organic thin film transistors (TFTs) are expected to become key components in the plastic circuitry used in display drivers of portable computers and pagers, and memory elements of transaction cards and identification tags. A typical organic TFT circuit contains a source electrode, a drain electrode, a gate electrode, a gate dielectric, an interlayer dielectric, electrical interconnects, a substrate, and semiconductor material. The precursor compositions of the present invention can be used to deposit all the components of this circuit, with the exception of the semiconductor material.

One of the most significant factors in bringing organic TFT circuits into commercial use is the ability to deposit all the components on a substrate quickly, easily and inexpensively as compared with silicon technology (i.e., by reel-to-reel printing). The precursor compositions of the present invention enable the use of low cost deposition techniques for depositing these components.

The precursor compositions of the present invention are particularly useful for the deposition of electrical features for smart tags, smart cards, smart labels, and a wide range of identification devices such as radio frequency identification (RFID) tags. In a broad sense, the conductive precursor compositions can be utilized for electrical connection of semiconductor radio frequency transceiver devices to antenna structures and particularly to radio frequency identification device assemblies. A radio frequency identification device ("RFID") by definition is an automatic identification and data capture system comprising readers and tags. Data is transferred using electric fields or modulated inductive or radiating electromagnetic carriers. RFID devices are becoming more prevalent in such configurations as, for example, smart cards, smart labels, security badges, and livestock tags. Smart cards are disclosed, for example, in U.S. Pat. No. 6,306,240 by Permingeat. RF tags are disclosed, for example, in U.S. Pat. No. 5,972,156 by Brady et al. and U.S. Pat. No. 5,995,006 by Walsh. Each of the foregoing U.S. Patents is incorporated herein by reference in its entirety.

The precursor compositions of the present invention also enable the low cost, high volume, highly customizable production of electronic labels. Such labels can be formed in various sizes and shapes for collecting, processing, displaying and/or transmitting information related to an item in human or machine readable form. The precursor compositions of the present invention can be used to form electronic features such as resistors and capacitors required to form the logic circuits, electronic interconnections, antennae, and display features in electronic labels. The electronic labels can be an integral part of a larger printed item such as a lottery ticket structure with circuit elements disclosed in a pattern as disclosed in U.S. Pat. No. 5,599,046.

In another embodiment of the present invention, the electronic features made in accordance with the present invention can be used as electronic circuits for making photovoltaic panels.

The low processing and deposition capabilities according to the present invention are particularly enabling for large area solar cell manufacturing on organic and flexible substrates. This is particularly useful in manufacturing novel solar cell technologies based on organic photovoltaic materials such as organic semiconductors and dye sensitized solar cell technology as disclosed in U.S. Pat. No. 5,463,057 by Graetzel et al.

Another embodiment of the present invention enables the production of an electronic circuit for making printed wiring board (PWBs) and printed circuit boards (PCBs). In conventional subtractive processes used to make printed-wiring boards, wiring patterns are formed by preparing pattern films. The pattern films are prepared by means of a laser plotter in accordance with wiring pattern data outputted from a CAD (computer-aided design system), and are etched on copper foil by using a resist ink or a dry film resist.

In such conventional processes, it is necessary to first form a pattern film, and to prepare a printing plate in the case when a photo-resist ink is used, or to take the steps of lamination, exposure and development in the case when a dry film resist is used.

EXAMPLES

Example 1

Lead Zirconate Titanate (PZT)

The following precursors are mixed in the following ratios in toluene to form a solution: 23.8 wt. % Ti dimethoxy dinedecanoate; 21.4 wt. % Zr butoxide; and 54.8 wt. % Pb ethylhexanoate. The PZT precursor mixture decomposes at 450° C. as evidenced by TGA. Formation of crystalline PZT does not occur until processing at 500° C. for at least 30 minutes and preferably 90 minutes or more.

Example 2

Zirconium Tin Titanate (ZST)

Precursors are mixed in the following ratios: 49.8 wt. % Ti isopropoxide triethylamine; 18.2 wt. % Zr ethylhexanoate; 5.9 wt. % Zr propoxide; and 26.1 wt. % Sn ethylhexanoate. The mixture was heated and found to decompose by 550° C. as evidenced by TGA. The crystallinity of the ZST is improved by post processing at greater than 500° C. for 60 minutes.

Example 3

Zirconium Tin Titanate (ZST)

Precursors are mixed in the following ratios: 50.9 wt. % Ti dimethoxy dineodecanoate; 19.3 wt. % Zr propoxide; 27.2 wt. % Sn ethylhexanoate; and 2.6 wt. % Zr ethylhexanoate. The composition was found to decompose by 550° C. as evidenced by TGA. The crystallinity of the ZST is improved by post processing at greater than 500° C. for 60 minutes.

Example 3

$Pb_2Ta_2O_7$

Precursors are mixed in the following ratios: 45.1 wt. % Ta ethoxide; 54.9 wt. % Pb ethylhexanoate; and dodecane as needed for solubility. The lead tantalate precursor decomposes by 450° C. as evidenced by TGA. Formation of crystalline $Pb_2Ta_2O_7$ occurs by processing at 550° C. for one hour.

Example 4

Composite Layer of Barium Titanate and Zirconium Tin Titanate

A barium titanate powder is dispersed in hexane with Menhaden fish oil as a dispersant. To this is added a ZST precursor and the hexane is volatalized. The precursor composition is then doctor bladed onto a silver coated alumina substrate and fired at 300° C. for 30 minutes. The resulting 34 μm film has a dielectric constant of 35 and a loss of 4% when electroded and measured at 1 MHz. This is equivalent to a capacitance of 970 pF/cm$^2$.

Example 5

Lead Magnesuim Niobate/Glass Composite

A lead magnesium niobate powder (PMN) is dispersed in hexane with Menhaden fish oil as a dispersant. The solvent is then removed leaving a coated PMN powder. This powder is then mixed with a lead-based glass powder, which can optionally be coated with a dispersant. The powder mixture is combined with terpineol as a solvent and ethyl cellulose as a binder and milled into a precursor composition. The precursor composition is then screen printed onto a gold-electroded alumina substrate and fired at 600° C. for 12 minutes. The resulting 13 μm film has a dielectric constant of 700 with a loss of 6% when electroded and measured at 1 kHz. This is equivalent to a capacitance of 48 nF/cm$^2$.

Example 6

A resistor precursor composition including aqueous precursors to $Pb_2Ru_2O_{6.5}$ and lead borosilicate glass along with lead borosilicate glass particles was formulated. The components were 25.7 wt. % lead glass precursor (contains water and butyl carbitol), 6.4 wt. % Ru precursor (aqueous) and 67.9 wt. % of a lead glass. This composition showed upwards of 50 ohm-cm resistivity.

Example 7

A resistor precursor composition including 34.8 wt. % of composite Ag-10%RuO$_2$ particles, 47.7 wt. % lead borosilicate glass particles and 17.4 wt. % alpha-terpineol was formulated. This represented about 30% conductor by volume. The resistor was processed at 500° C. for 30 minutes.

Example 8

A resistor precursor composition was prepared including 50.3 wt. % of composite Ag-10% RuO$_2$ particles, 19.7 wt. % calcium aluminum borosilicate glass, 14.3 wt. % tetraethoxysilane, 14.3 wt. % terpineol carrier, 0.5 wt. % ethyl cellulose and 1.4 wt. % fumed silica. The composition was processed at 300° C. and had a sheet resistance of 9.9 kΩ/square.

Example 9

A resistor precursor composition was prepared including 34.9 wt. % SrRuO$_3$, 25.7 wt. % calcium aluminum borosilicate glass, 18.8 wt. % tetraethoxysilane, 1.9 wt. % fumed silica, 18.0 wt. % terpineol and 0.7 wt. % ethyl cellulose. The composition was processed at 300° C. and had a sheet resistance of 22.4 kΩ/square.

Example 10

A very low-ohm resistor composition was prepared consisting of 70 vol. % spherical silver powder produced by spray pyrolysis with 30 vol. % conductive low melting silver glass. The composition was processed at 450° C. for 20 minutes and yielded a resistivity of 5.5×bulk silver.

Example 11

A resistor composition was prepared consisting of RuO$_2$ particles dispersed with lead borosilicate glass with 15 vol. % conductor. The composition shows resistivity values of 300 kΩ/square with a TCR on the order of 200 ppm/° C. The composition is processable by a laser.

Example 12

Ag—RuO$_2$ particles were produced and combined in a glass matrix to make a resistor. The line was shown to be conductive with a 30 volume percent loading of conductor material when processed at 550° C. for 15 minutes.

Example 13

Ag—RuO$_2$ particles were combined with a precursor to a silica matrix and processed at low temperatures (300° C.), and showed conductivity. In contrast, identical compositions containing pure silver particles showed no conductivity. This is believed to be due to RuO$_2$ phase on the surface of the particles, which allows either more intimate contact of particles or some tunneling, or both.

Example 14

Titania (TiO$_2$) nanoparticles (Nanophase Technologies Corp., Romeoville, Ill.) were combined with methanol and titanium dimethoxyneodecanoate and refluxed for several hours in order to coat the nanoparticles with the titanium compound linker/capping agent. The ratio of titanium dimethoxyneodecanoate to TiO$_2$ was about 13% by weight. The product was then dried overnight at 80° C. resulting in a dry powder. The powder was combined with a solution consisting of 32.1 wt. % silver trifluoroacetate, 32.5 wt. % dimethylacetamide, 32.1 wt. % diethylene glycol butyl ether and 3.3 wt. % lactic acid. This was mixed extensively in a sonic bath. The volume ratio of silver from precursor to titania was 45 vol. %.

The above composition was deposited onto a glass slide and processed on a hotplate at 350° C. for ten minutes at which point the slide was removed and the composition was deposited again in order to achieve a higher thickness. The film was then processed on the hotplate at 350° C. for an additional hour. The resulting feature thickness was about 3 µm. The feature was robust and passed the scotch tape test. The feature was sectioned into a square patch by scraping excess material off with a razor blade and the feature was electroded with silver paint to form a resistor. The resulting resistor had a sheet resistivity of 568 Ω/square and a bulk resistivity of 170,500 µΩ-cm.

Example 15

A silver-palladium precursor solution was combined with fumed silica nanoparticles to form a resistor with silica:metal volume ratio of 0.56 and a metal alloy of 15 wt. % palladium. The sample was processed on a glass slide at 250° C. to form a resistor with a bulk resistivity of 5.1×10$^{-4}$ Ω-cm and a sheet resistivity of 7.3 Ω/square at a thickness of 0.7 µm. The sample could also be processed on polyimide.

Example 16

A silver-palladium precursor solution was combined with fumed silica nanoparticles to give a resistor with silica:metal volume ratio of 0.16 and a metal alloy of 19 wt. % palladium. The sample was processed on a glass slide at 250° C. to give a resistor with a bulk resistivity of 2.4×10$^{-4}$ Ω-cm and a sheet resistivity of 3.4 ohms/square at a thickness of 0.7 µm. The sample could also be processed on polyimide.

The following examples (Examples 16-39) demonstrate the importance of having a correct stoichiometric ratio between a silver salt (e.g., a metal carboxylate) and an inducing agent (e.g., an alcohol) in the paste composition for the formation of a conductive phase at a low conversion temperature.

Example 17

Comparative Example

A mixture of 0.1 grams alpha terpineol and 0.9 grams Ag-trifluoroacetate was formed, which corresponds to 6.285 moles of the silver precursor to one mole of terpineol. The mixture was subjected to TGA analysis, which showed that the composition converted to substantially pure silver at about 290° C. This example illustrates that the decomposition temperature is not substantially reduced at a high molar ratio of precursor to inducing agent.

Example 18

Comparative Example

A mixture of 0.9 grams alpha terpineol and 0.1 grams Ag-trifluoroacetate was formed, which corresponds to 0.069 moles of precursor to one mole of terpineol. The mixture was subjected to TGA analysis, which showed that the composition converted to substantially pure silver at about 210° C. This example illustrates the use of excess conversion reaction inducing agent.

Example 19

A mixture of 1.7 grams terpineol and 1.7 grams silver trifluoroacetate was formed, corresponding to 0.69 moles of precursor to one mole of precursor. The mixture was subjected to TGA analysis, which showed that the mixture converted to substantially pure silver at 175° C. This mixture has a conversion temperature of 175° C. The molar ratio of salt to terpineol is 0.69 moles of salt to one mole of terpineol. This example illustrates a correct ratio of inducing agent to precursor.

Example 20 (Comparative Example)

A mixture containing 50 parts by weight (pbw) Ag-trifluoroacetate and 50 pbw H$_2$O was formulated. The calculated silver content was 24.4 wt. % and thermogravimetric analysis showed the mass loss reached 78 wt. % at 340° C. This data corresponds to the above-described decomposition temperature for pure Ag-trifluoroacetate, within a reasonable margin for error.

Example 21 (Preferred Additive)

A mixture was formulated containing 44 pbw Ag-trifluoroacetate, 22 pbw H$_2$O, 33 pbw DEGBE and 1 part by weight lactic acid. The calculated silver content was 21.5 wt. % and thermogravimetric analysis showed the mass loss reached 79 wt. % at 215° C. The addition of DEGBE advantageously reduced the decomposition temperature by 125° C. compared to the formulation as described in Example 20. The lactic acid functions as a crystallization inhibitor.

Example 22 (Comparative Example)

A mixture was formulated containing 58 pbw Ag-trifluoroacetate and 42 pbw dimethylformamide. The calculated silver content was 21.5 wt. % and thermogravimetric analysis showed a mass loss of 78.5 wt. % at 335° C., a decomposition temperature similar to the formulation in Example 20.

Example 23 (Preferred Solvent, Comparative Example)

A mixture was formulated containing 40 pbw Ag-trifluoroacetate, 21 pbw DMAc and 0.7 pbw of a styrene allyl alcohol (SM) copolymer binder. Thermogravimetric analysis showed that precursor decomposition to silver was complete at 275° C. The use of DMAc reduced the decomposition temperature by about 65° C. as compared to Example 20.

Example 24

A mixture was formulated containing 51 pbw Ag-trifluoroacetate, 16 pbw DMAc and 32 pbw alpha terpineol. The calculated silver content was 25 wt. %. Thermogravimetric analysis showed a mass loss of 77 wt. % at 205° C. This decomposition temperature is decreased by 70° C. compared to the formulation described in Example 23, which does not employ terpineol as an additive.

Example 25

A mixture was formulated containing 33.5 pbw Ag-trifluoroacetate, 11 pbw DMAc, 2 pbw lactic acid and 53.5 pbw DEGBE. The calculated silver content was 16.3 wt. %. Thermogravimetric analysis showed a mass loss of 83 wt. % at 205° C. to 215° C. The decomposition temperature is decreased by 60° C. to 70° C. compared to the formulation described in Example 23, which does not employ DEGBE as an additive.

Example 26

A mixture was formulated containing 49 pbw Ag-trifluoroacetate, 16 pbw DMAc, 32 pbw alpha-terpineol and 1.2 pbw Pd-acetate. Thermogravimetric analysis indicated complete decomposition of the metal organic precursors at 170° C. This decomposition temperature is decreased by 35° C. compared to the formulation described in Example 24, which does not employ Pd-acetate as an additive.

Example 27

A mixture was formulated containing 46 pbw Ag-trifluoroacetate, 49 pbw DMAc and 2.3 pbw Pd-acetate. Thermogravimetric analysis indicated complete decomposition of the metal organic precursors at 195° C. This decomposition temperature is 80° C. lower compared to the formulation described in Example 23, which does not employ Pd-acetate as an additive.

Example 28

A mixture was formulated containing 4 pbw Ag-acetate and 50 pbw ethanolamine. Thermogravimetric analysis showed that precursor decomposition to silver was complete at 190° C. This conversion temperature is 65° C. lower than the decomposition temperature of pure Ag-acetate.

Example 29

A silver/palladium mixture was formulated containing 3.8 pbw Ag-trifluoroacetate, 8.6 pbw Pd-trifluoroacetate, 32.3 parts DMAc and 1.3 parts lactic acid. The targeted ratio of Ag/Pd was 40/60 by mass. The calculated Ag/Pd content was 10 wt. %. Thermogravimetric analysis showed a mass loss of 87 wt. % at 190° C. The presence of Pd-trifluoroacetate reduced the decomposition temperature by 80° C. compared to the composition described in Example 23.

Example 30

A silver/palladium mixture was formulated containing 2.4 pbw Ag-trifluoroacetate, 10.8 pbw Pd-trifluoroacetate, 31.3 pbw DMAc and 1.6 pbw lactic acid. The targeted ratio of Ag/Pd was 25/75 by mass and the calculated Ag/Pd content was 10 wt. %. Thermogravimetric analysis showed a mass loss of 88 wt. % at 190° C. The presence of Pd-trifluoroacetate reduced the decomposition temperature by 80° C. compared to the composition described in Example 23.

Example 31 (Comparative Example)

A mixture was formulated containing 2.5 pbw Ag-trifluoroacetate, 2.5 pbw DMAc and 0.2 pbw DEGBE. The mixture was deposited on a glass substrate and heated on a hotplate at 200° C. The resulting film showed large crystal growth and was not conductive.

Example 32

A mixture was formulated containing 2.5 pbw Ag-trifluoroacetate, 2.5 pbw DMAc and 0.2 pbw lactic acid. The mixture was deposited on a glass substrate and fired on a hotplate at 200° C. The resulting film showed reduced crystal growth.

Examples of In-Situ Precursor Generation

Example 33 (Comparative Example)

Silver oxide (AgO) powder was tested using TGA at a constant heating rate of 10° C./min. The TGA showed the conversion to pure silver was complete by about 460° C.

Example 34

A mixture of 3.2 grams silver oxide and 3.0 grams neodecanoic acid was analyzed in a TGA. The analysis demonstrated that the conversion to pure silver was substantially complete by about 250° C.

Example 35

A mixture of 5.2 grams alpha terpineol, 4.9 grams silver oxide and 1.1 grams neodecanoic acid was analyzed in a TGA. The TGA demonstrated that the conversion to pure silver was substantially complete by about 220° C.

Example 36

The silver oxide/carboxylic acid chemistry was modified by the addition of metallic silver powder. The reaction products from the silver oxide and carboxylic acid weld the silver particles together providing highly conductive silver traces and features.

Specifically, a mixture of 24.4 grams of metallic silver flake, 0.6 grams neodecanoic acid, 3.7 grams alpha terpineol and 1.5 grams silver oxide was heated in a TGA. The conversion to pure silver was complete by 220° C. When fired on a surface, this produced a feature having a resistivity of about 5 times the resistivity of bulk silver.

Lowering the Conversion Temperature by Use of Palladium Precursors

Example 37 (Comparative Example)

A mixture of 80 grams metallic silver powder, 10 grams silver trifluoroacetate, 3.51 grams DMAc, 6.99 grams alpha terpineol, 0.1 gram ethyl cellulose and 0.1 gram SOLSPERSE 21000 was analyzed using TGA. The mixture converted to substantially pure silver at about 220° C. The same mixture was deposited and heated to 250° C. The resulting conductive trace had a resistivity of 6.7 times the bulk resistivity of pure silver.

Example 38

A mixture of 80 grams metallic silver powder, 9.0 grams silver trifluoroacetate, 1.0 gram palladium acetate, 3.17 grams DMAc, 6.35 grams alpha terpineol, 0.2 grams ethyl cellulose and 0.2 grams SOLSPERSE 21000 was analyzed in a TGA. The TGA analysis showed the conversion to substantially pure silver was complete by about 160° C. The mixture was deposited and heated to 250° C. for 10 minutes. The resulting conductive trace had a resistivity of 16.8 times the bulk resistivity of pure silver.

Example 39

A mixture of 3.17 grams DMAc, 6.35 grams alpha terpineol, 0.2 grams ethyl cellulose, 0.2 grams SOLSPERSE 21000, 9 grams silver trifluoroacetate, 80 grams metallic silver powder and 1.0 gram palladium trifluoroacetate was analyzed using TGA. This mixture showed a conversion to substantially pure silver at about 160° C. This mixture was then deposited and heated to 250° C. for 10 minutes. The resulting conductive trace had a resistivity of 4.2 times the bulk resistivity of pure silver.

While various embodiments of the present invention have been described in detail, it is apparent that modifications and adaptations of those embodiments will occur to those skilled in the art. However, it is to be expressly understood that such modifications and adaptations are within the spirit and scope of the present invention.

What is claimed is:

1. A method for fabricating an inorganic resistor on an organic substrate, comprising the steps of:
   a) applying a flowable precursor composition to an organic substrate wherein said precursor composition comprises a molecular precursor to a conductive phase and particles of an insulating material;
   b) heating said substrate to a temperature of not greater than about 350° C. to convert said molecular precursor to said conductive phase and form a resistor wherein said resistor has a resistivity of at least about 100 μΩ-cm.

2. A method as recited in claim 1, wherein said heating step comprises heating to a temperature of not greater than about 300° C.

3. A method as recited in claim 1, wherein said heating step comprises heating to a temperature of not greater than about 250° C.

4. A method as recited in claim 1, wherein said heating step comprises heating to a temperature of not greater than about 200° C.

5. A method as recited in claim 1, wherein said heating step comprises heating to a temperature of not greater than about 150° C.

6. A method as recited in claim 1, wherein said molecular precursor comprises silver metal.

7. A method as recited in claim 1, wherein said molecular precursor comprises a metal selected from the group consisting of silver, copper and nickel.

8. A method as recited in claim 1, wherein said insulating material is selected from the group consisting of silica, alumina, titania and a glass.

9. A method as recited in claim 1, wherein said insulating material particles have an average particle size of not greater than about 100 nanometers.

10. A method as he said in claim 1, wherein said step of applying a flowable precursor composition comprises depositing said a flowable precursor composition using a syringe.

11. In method as recited in claim 1, wherein said substrate is a polyimide substrate.

12. A method as recited in claim 1, wherein said precursor composition has a viscosity of at least about 10,000 centipoise.

13. A method as recited in claim 1, wherein said resistor has a resistivity of at least about 1000 μΩ-cm.

14. A method as recited in claim 1, wherein said resistor has a resistivity of at least about 10,000 μΩ-cm.

15. A method as recited in claim 1, wherein said resistor has a resistivity of at least about 100,000 μΩ-cm.

16. A method as recited in claim 1, wherein said resistor is a component of a circuit comprising organic transistors.

17. A method as recited in claim 1, wherein said resistor is a component of a display backplane.

18. A method as recited in claim 1, wherein said resistor is a component of a circuit board.

19. A method as recited in claim 1, wherein said resistor is a component of an RF tag.

20. A method as recited in claim 1, wherein said resistor is a component of a smart card.

* * * * *